(12) United States Patent
Lee et al.

(10) Patent No.: US 11,594,538 B2
(45) Date of Patent: Feb. 28, 2023

(54) SEMICONDUCTOR DEVICE AND METHOD OF FABRICATING THE SAME

(71) Applicant: Samsung Electronics Co., Ltd., Suwon-si (KR)

(72) Inventors: Sang Ho Lee, Seoul (KR); Eun A Kim, Seoul (KR); Ki Seok Lee, Hwaseong-si (KR); Jay-Bok Choi, Yongin-si (KR); Keun Nam Kim, Yongin-si (KR); Yong Seok Ahn, Seoul (KR); Jin-Hwan Chun, Seongnam-si (KR); Sang Yeon Han, Suwon-si (KR); Sung Hee Han, Hwaseong-si (KR); Seung Uk Han, Suwon-si (KR); Yoo Sang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/469,340

(22) Filed: Sep. 8, 2021

(65) Prior Publication Data

US 2021/0408004 A1 Dec. 30, 2021

Related U.S. Application Data

(63) Continuation of application No. 16/860,276, filed on Apr. 28, 2020, now Pat. No. 11,121,134.

(30) Foreign Application Priority Data

Sep. 27, 2019 (KR) ........................ 10-2019-0119542

(51) Int. Cl.
  *H01L 21/00* (2006.01)
  *H01L 27/108* (2006.01)
  *H01L 23/528* (2006.01)

(52) U.S. Cl.
  CPC ...... *H01L 27/10814* (2013.01); *H01L 23/528* (2013.01); *H01L 27/10823* (2013.01);
  (Continued)

(58) Field of Classification Search
  CPC ............. H01L 27/10814; H01L 23/528; H01L 27/10823
  See application file for complete search history.

(56) References Cited

U.S. PATENT DOCUMENTS 7,833,902 B2 * 11/2010 Lee ................... H01L 27/10888
  257/E23.141
7,846,827 B2 * 12/2010 Kim ................... H01L 21/76816
  438/597

(Continued)

FOREIGN PATENT DOCUMENTS

CN 108461494 A 8/2018
CN 112582417 A * 3/2021 ......... H01L 21/7682

(Continued)

OTHER PUBLICATIONS

First Office Action dated Sep. 23, 2021 from the Indian Patent Office for Corresponding Indian Patent No. IN 202044034783.

(Continued)

*Primary Examiner* — Laura M Menz
(74) *Attorney, Agent, or Firm* — Muir Patent Law, PLLC

(57) ABSTRACT

A semiconductor device includes a device isolation layer defining first and second active regions, a buried contact connected to the second active region, and first and second bit line structures disposed on the first and second active regions. Each of the first and second bit line structures comprises a bit line contact part and a bit line pass part. The bit line contact part is electrically connected to the first active region. The bit line pass part is disposed on the device isolation layer. A height of a lowest part of the buried contact (Continued)

is smaller than a height of a lowest part of the bit line pass part. The height of the lowest part of the buried contact is greater than a height of a lowest part of the bit line contact part. A lower end of the bit line pass part is buried in the second active region.

20 Claims, 71 Drawing Sheets

(52) U.S. Cl.
CPC .. H01L 27/10855 (2013.01); H01L 27/10876 (2013.01); H01L 27/10885 (2013.01); H01L 27/10888 (2013.01)

(56) References Cited

U.S. PATENT DOCUMENTS

| | | | | |
|---|---|---|---|---|
| 8,558,306 B2* | 10/2013 | Kim | ............... | H01L 27/10885 257/329 |
| 8,623,727 B2* | 1/2014 | Shin | ............... | H01L 27/10855 257/E21.585 |
| 9,209,241 B2* | 12/2015 | Kim | ............... | H01L 27/10888 |
| 9,230,612 B2* | 1/2016 | Park | ............... | H01L 27/10882 |
| 9,859,284 B2* | 1/2018 | Wang | ............... | H01L 27/10814 |
| 11,121,134 B2* | 9/2021 | Lee | ............... | H01L 27/10814 |
| 2004/0161923 A1* | 8/2004 | Bae | ............... | H01L 21/76897 257/E21.585 |
| 2004/0238868 A1* | 12/2004 | Arnold | ............... | H01L 27/10864 257/E21.655 |
| 2007/0097734 A1* | 5/2007 | Min | ............... | G11C 11/16 365/158 |
| 2008/0101113 A1* | 5/2008 | Park | ............... | G11C 11/50 365/166 |
| 2010/0258942 A1* | 10/2010 | Nam | ............... | H01L 21/76831 257/E21.59 |
| 2012/0241833 A1* | 9/2012 | Nagashima | ........ | H01L 27/11519 257/E21.546 |
| 2012/0267723 A1 | 10/2012 | Kim | | |
| 2013/0049209 A1 | 2/2013 | Yeom et al. | | |
| 2014/0198576 A1* | 7/2014 | Hung | ............... | G11C 11/5628 365/185.18 |
| 2015/0262625 A1 | 9/2015 | Han et al. | | |
| 2018/0040561 A1 | 2/2018 | Kim et al. | | |
| 2018/0175040 A1* | 6/2018 | Kim | ............... | H01L 21/76224 |
| 2018/0240705 A1* | 8/2018 | Chang | ............... | H01L 21/76224 |
| 2018/0286870 A1 | 10/2018 | Kim et al. | | |
| 2019/0206873 A1* | 7/2019 | Kim | ............... | H01L 27/10855 |
| 2021/0098460 A1* | 4/2021 | Lee | ............... | H01L 27/10823 |
| 2021/0335790 A1* | 10/2021 | Song | ............... | H01L 29/0649 |
| 2021/0408004 A1* | 12/2021 | Lee | ............... | H01L 27/10885 |
| 2022/0271044 A1* | 8/2022 | Kim | ............... | H01L 27/10885 |

FOREIGN PATENT DOCUMENTS

| | | | | |
|---|---|---|---|---|
| DE | 102020115179 A1 * | 4/2021 | ........ | H01L 21/7682 |
| KR | 101062838 B1 | 9/2011 | | |
| KR | 1020130023805 A | 3/2013 | | |
| KR | 101959388 B1 | 3/2019 | | |

OTHER PUBLICATIONS

First Office Action dated Oct. 24, 20221 for corresponding application DE 10 2020 115 179.9.

* cited by examiner

SEMICONDUCTOR DEVICE AND METHOD OF FABRICATING THE SAME

CROSS-REFERENCE TO RELATED APPLICATION

This application is a continuation of U.S. application Ser. No. 16/860,276 filed on Apr. 28, 2020 which claims priority under 35 U.S.C. § 119 to Korean Patent Application No. 10-2019-0119542, filed on Sep. 27, 2019, in the Korean Intellectual Property Office, the disclosure of each of which is incorporated by reference herein in its entirety.

BACKGROUND

1. Technical Field

The present disclosure relates to a semiconductor device and a method of fabricating the same, and more particularly, to a semiconductor device including a plurality of wiring lines and buried contacts intersecting each other and a method of fabricating the semiconductor device.

2. Description of the Related Art

As semiconductor devices become more highly integrated, individual circuit patterns are becoming more miniaturized in order to implement more semiconductor devices in the same area. For example, as the degree of integration of semiconductor devices increases, design rules for components of the semiconductor devices are reduced.

In a highly scaled-down semiconductor device, a process of forming a plurality of wiring lines and a plurality of buried contacts interposed between the wiring lines is becoming increasingly complicated and difficult.

SUMMARY

Aspects of the present disclosure provide a semiconductor device with improved reliability and performance.

Aspects of the present disclosure also provide a method of fabricating a semiconductor device with improved reliability and performance.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an exemplary embodiment of the present invention, a semiconductor device includes a device isolation layer which is formed in a substrate and defines a first active region and a second active region spaced apart from each other in a first direction, a buried contact which is connected to the second active region, a first bit line structure which is disposed on the first active region and extends in a second direction different from the first direction, and a second bit line structure which is spaced apart from the first bit line structure in the first direction and is disposed on the second active region. Each of the first and second bit line structures comprises a bit line stack extending in the second direction. Each of the first and second bit line structures comprises a bit line contact part and a bit line pass part which are alternately arranged in the second direction. The bit line contact part of the first bit line structure is disposed on the first active region and electrically connected to the first active region. The bit line pass part of the second bit line structure is disposed on the device isolation layer. A height of a lowest part of the buried contact from a bottom surface of the device isolation layer is smaller than a height of a lowest part of the bit line pass part of the second bit line structure from the bottom surface of the device isolation layer. The height of the lowest part of the buried contact from the bottom surface of the device isolation layer is greater than a height of a lowest part of the bit line contact part of the first bit line structure from the bottom surface of the device isolation layer. A lower end of the bit line pass part of the second bit line structure is buried in the second active region.

According to an exemplary embodiment of the present invention, a semiconductor device includes a device isolation layer which is formed in a substrate and defines a first active region and a second active region spaced apart from each other in a first direction, a buried contact which is connected to the second active region, a first bit line structure which is disposed on the first active region and extends in a second direction different from the first direction, and a second bit line structure which is disposed on the second active region and spaced apart from the first bit line structure in the first direction. Each of the first and second bit line structures comprises a bit line spacer, a bit line stack which fills a part of a bit line trench defined by the bit line spacer and a bit line mask pattern which is disposed on the bit line stack. Each of the first and second bit line structures comprises a bit line contact part and a bit line pass part which are alternately arranged in the second direction. The bit line contact part of the first bit line structure is electrically connected to the first active region. A lower end of the bit line pass part of the second bit line structure is buried in the second active region. The bit line spacer comprises a lower line spacer and an upper line spacer. The lower line spacer is disposed on a part of each sidewall of the bit line stack. The upper line spacer is disposed on the lower line spacer.

According to an exemplary embodiment of the present invention, a semiconductor device includes a device isolation layer which is formed in a substrate and defines a first active region and a second active region spaced apart from each other in a first direction, each of the first and second active regions including a pair of storage connection regions and a bit line connection region disposed therebetween, a pair of word lines which extend in the first direction and are disposed in the substrate and the device isolation layer, the pair of word lines being spaced apart from each other in a second direction different from the first direction, and the bit line connection region of the first active region and one of the pair of storage connection regions of the second active region being disposed between the pair of word lines and spaced apart from each other in the first direction, a buried contact which is connected to the one of the pair of storage connection regions, a first bit line structure which extends in the second direction and is disposed on the bit line connection region of the first active region, a second bit line structure which extends in the second direction and is disposed on the bit line connection region of the second active region, a landing pad which is disposed on the buried contact and connected thereto, and a memory capacitor which is disposed on the landing pad and connected thereto. Each of the first and second bit line structures comprises a bit line contact part and a bit line pass part. The bit line contact part of each of the first and second bit line structures is electrically connected to the bit line connection region of each of the first and second active regions, respectively. A height of a lowest part of the buried contact from a bottom surface of the device isolation layer is smaller than a height of a lowest part of the bit line pass part of the second bit line structure from the bottom surface of the device isolation layer. The height of the lowest part of the buried contact from the bottom surface of the device isolation layer is greater than a height of a lowest part of the bit line contact part of the first bit line structure from the bottom surface of the device isolation layer. A lower end of the bit line pass part of the second bit line structure is buried in the one of the pair of storage connection regions of the second active region.

According to an exemplary embodiment of the present invention, a semiconductor device includes a substrate which comprises a cell region, a peripheral region and a cell boundary region therebetween, a device isolation layer which is formed in the substrate of the cell region and defines an active region, a bit line stack which is disposed over the cell region and the cell boundary region and electrically connected to the active region, and a bit line peri-contact which is connected to the bit line stack in the cell boundary region. The bit line stack comprises a semiconductor material pattern connected to the active region and a metallic conductive layer pattern disposed on the semiconductor material pattern. A thickness of the metallic conductive layer pattern in the cell region is greater than a thickness of the metallic conductive layer pattern in the cell boundary region.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
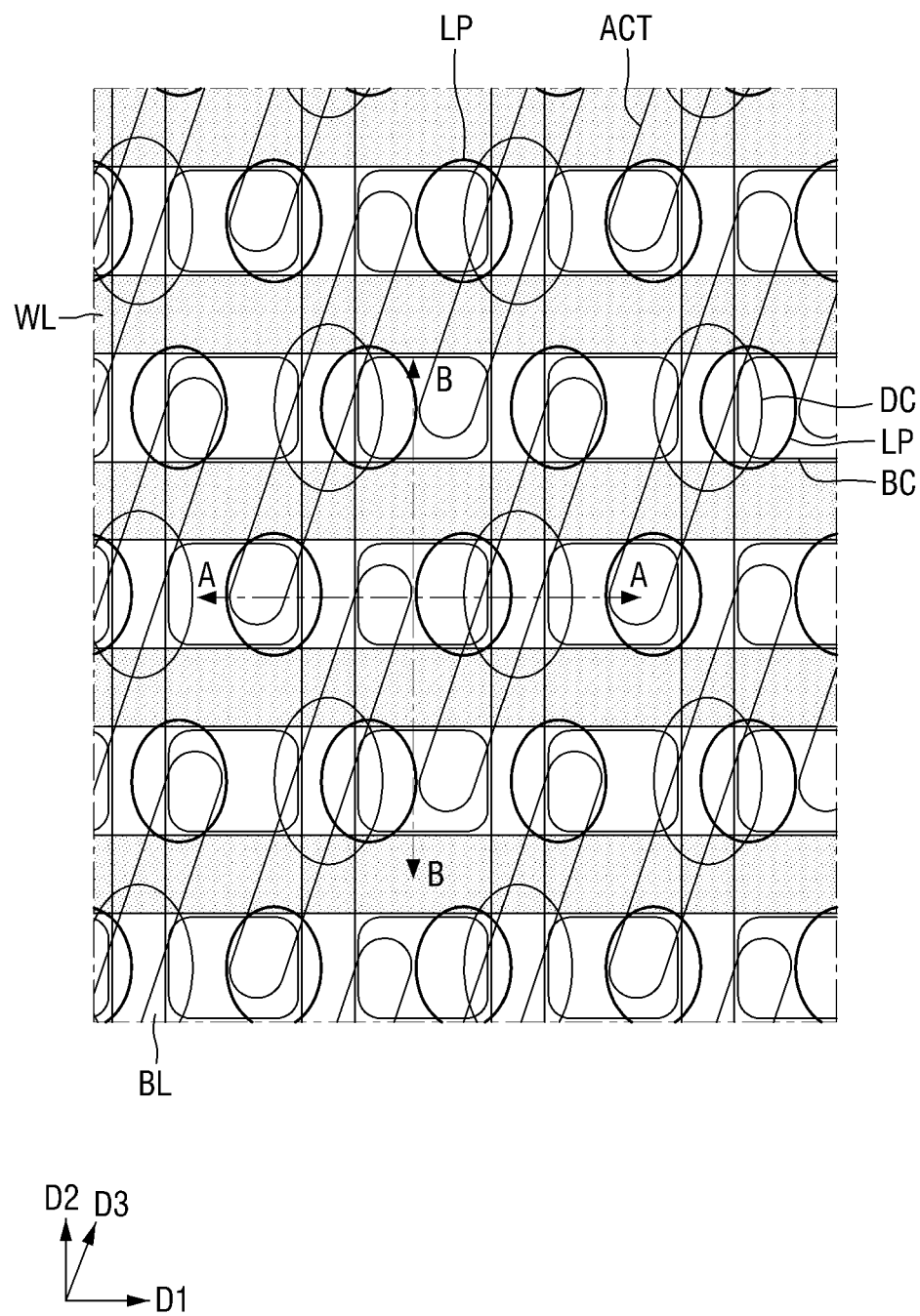
FIG. 1 is a schematic layout view of a cell region of a semiconductor device according to embodiments.
Figure 2:
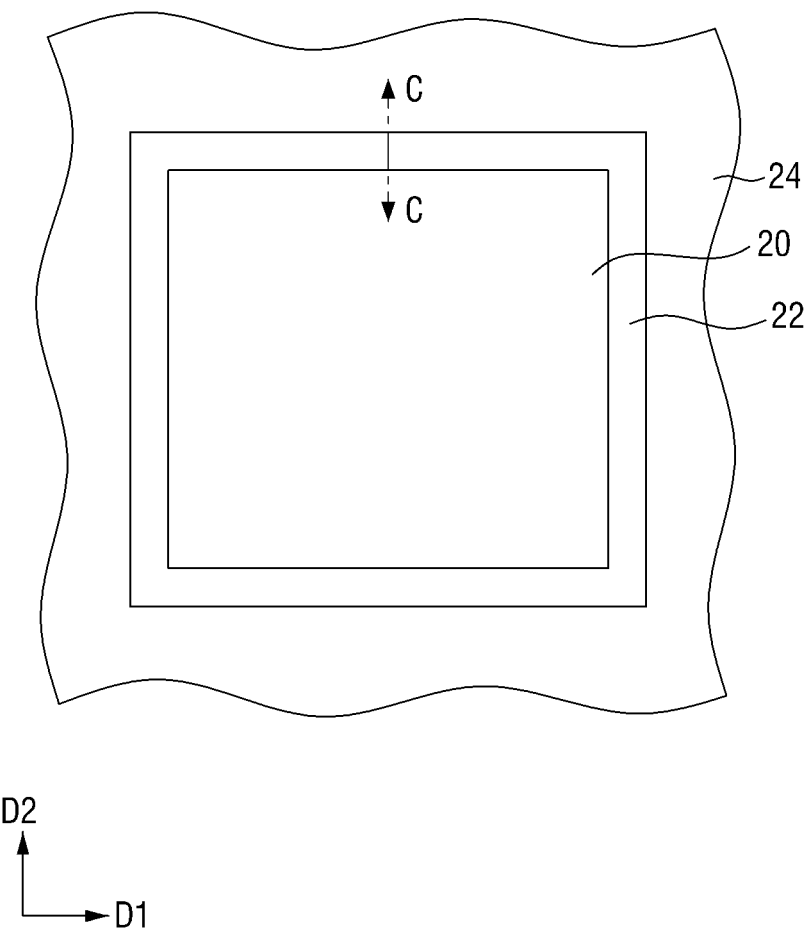
FIG. 2 is a schematic layout view of the semiconductor device including the cell region of FIG. 1.
Figure 3:
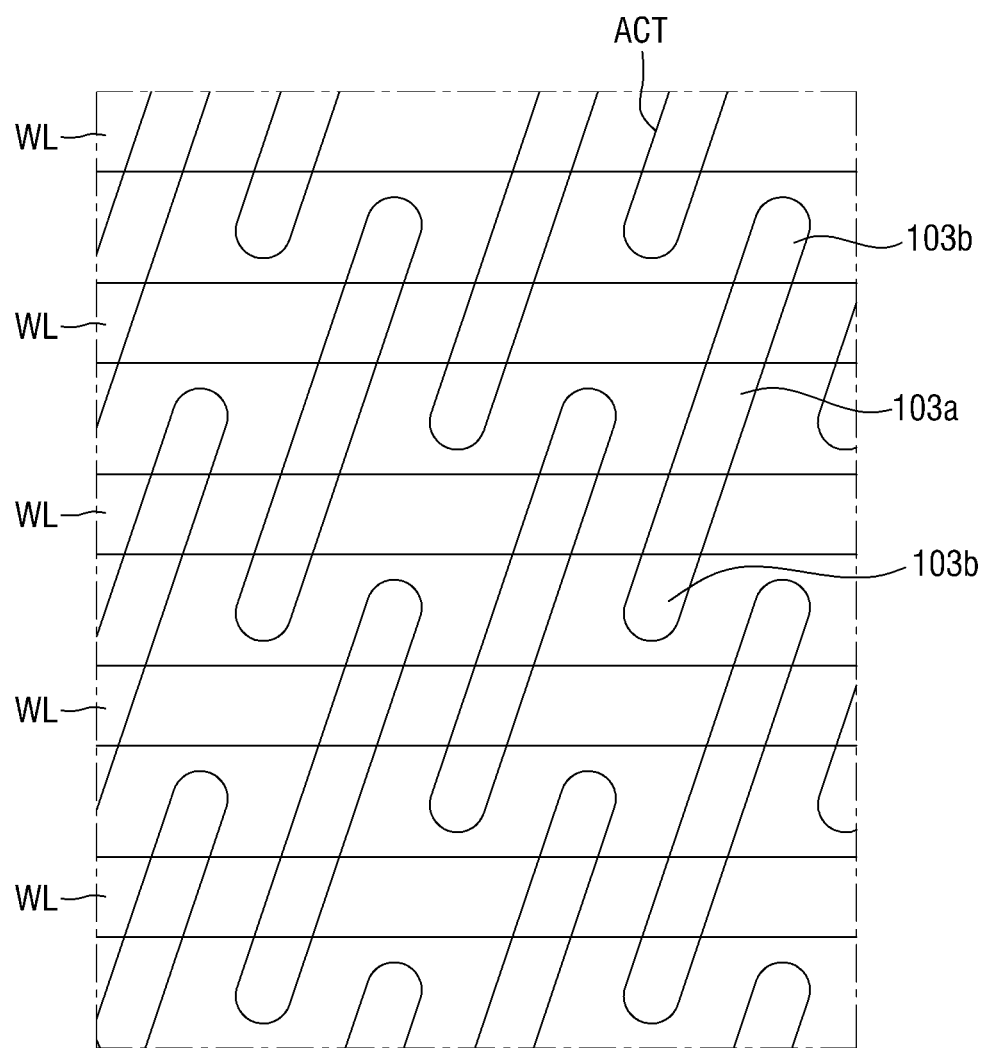
FIG. 3 is a layout view of only word lines and active regions of FIG. 1.
Figure 4A:
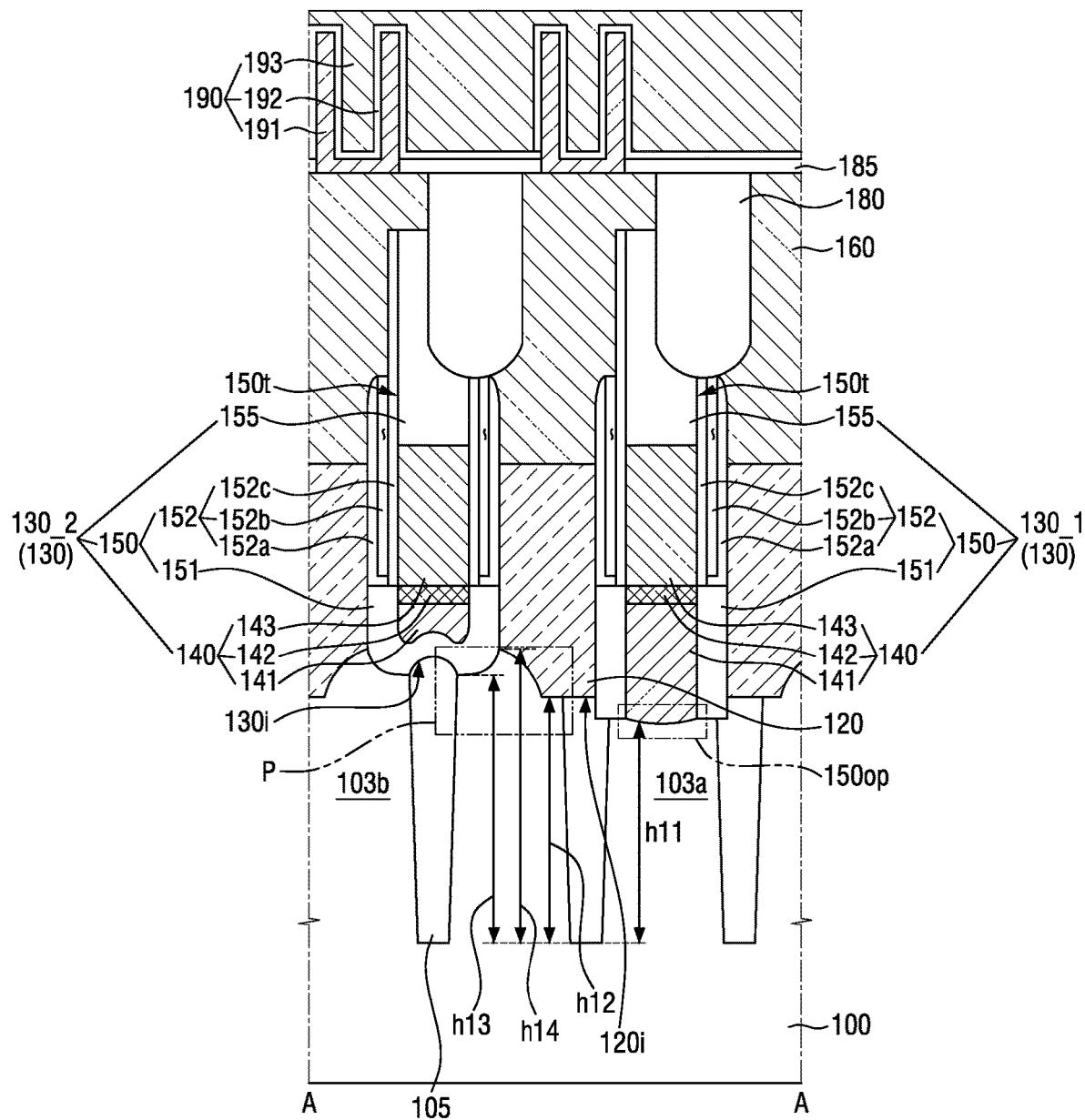
FIGS. 4A and 4C are cross-sectional views taken along line A-A of FIG. 1 according to various embodiments.
Figure 4B:
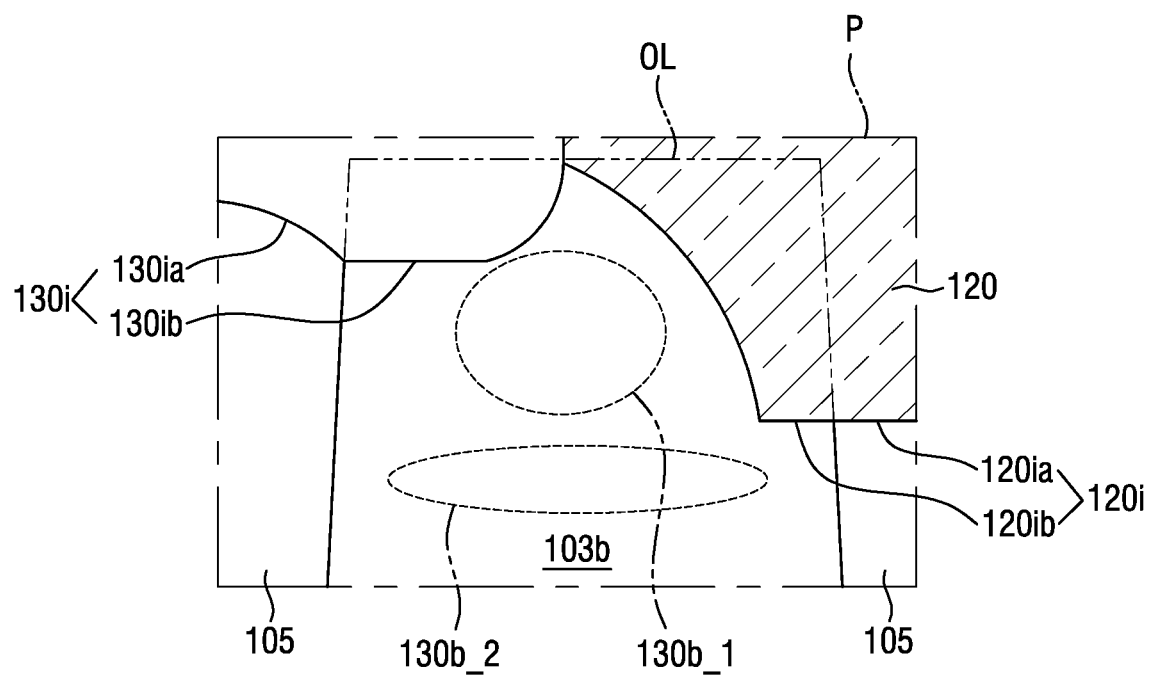
FIG. 4B is an enlarged view of a portion P of FIG. 4A.
Figure 4C:
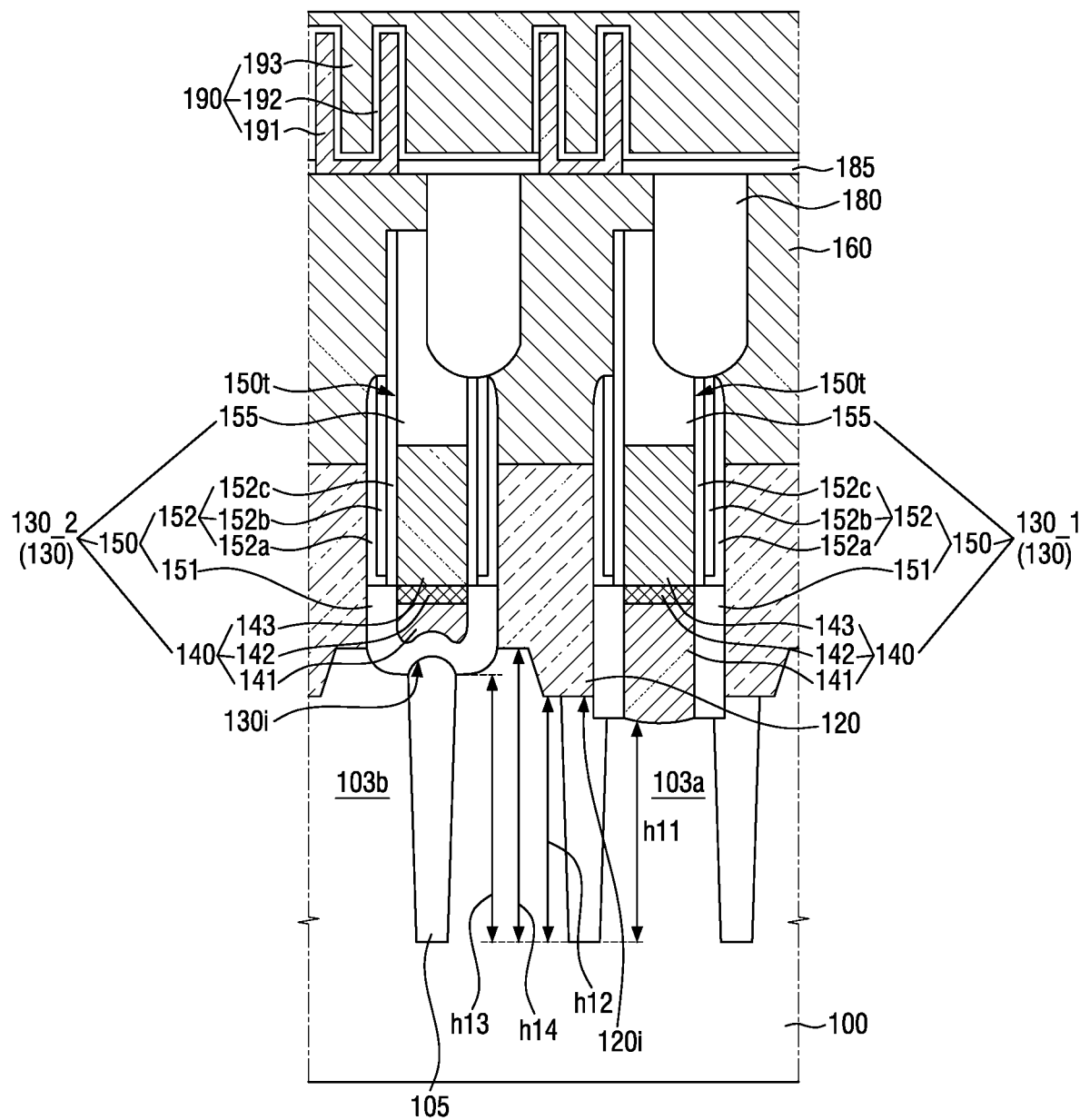
Figure 5:
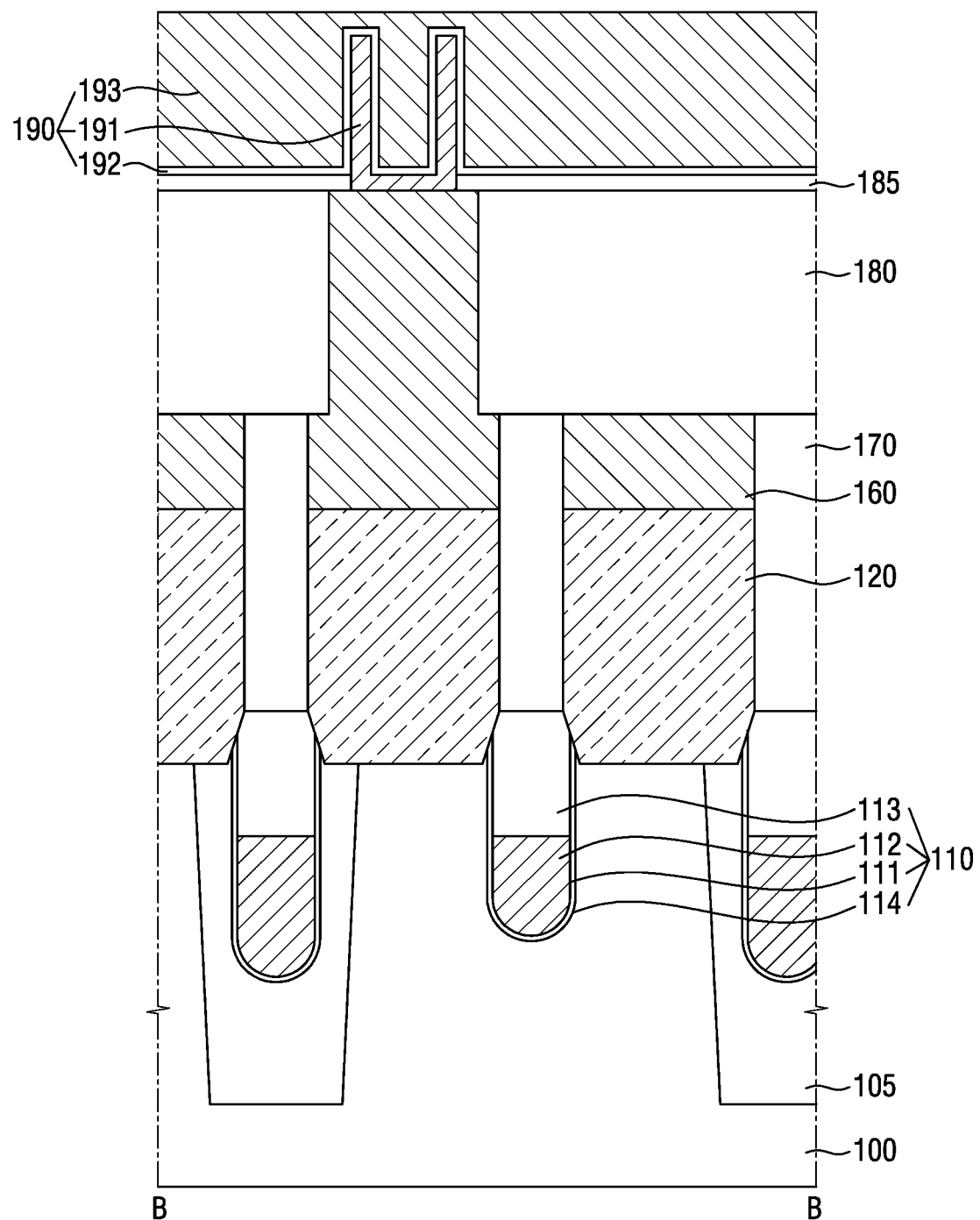
FIG. 5 is a cross-sectional view taken along line B-B of FIG. 1.
Figure 6A:
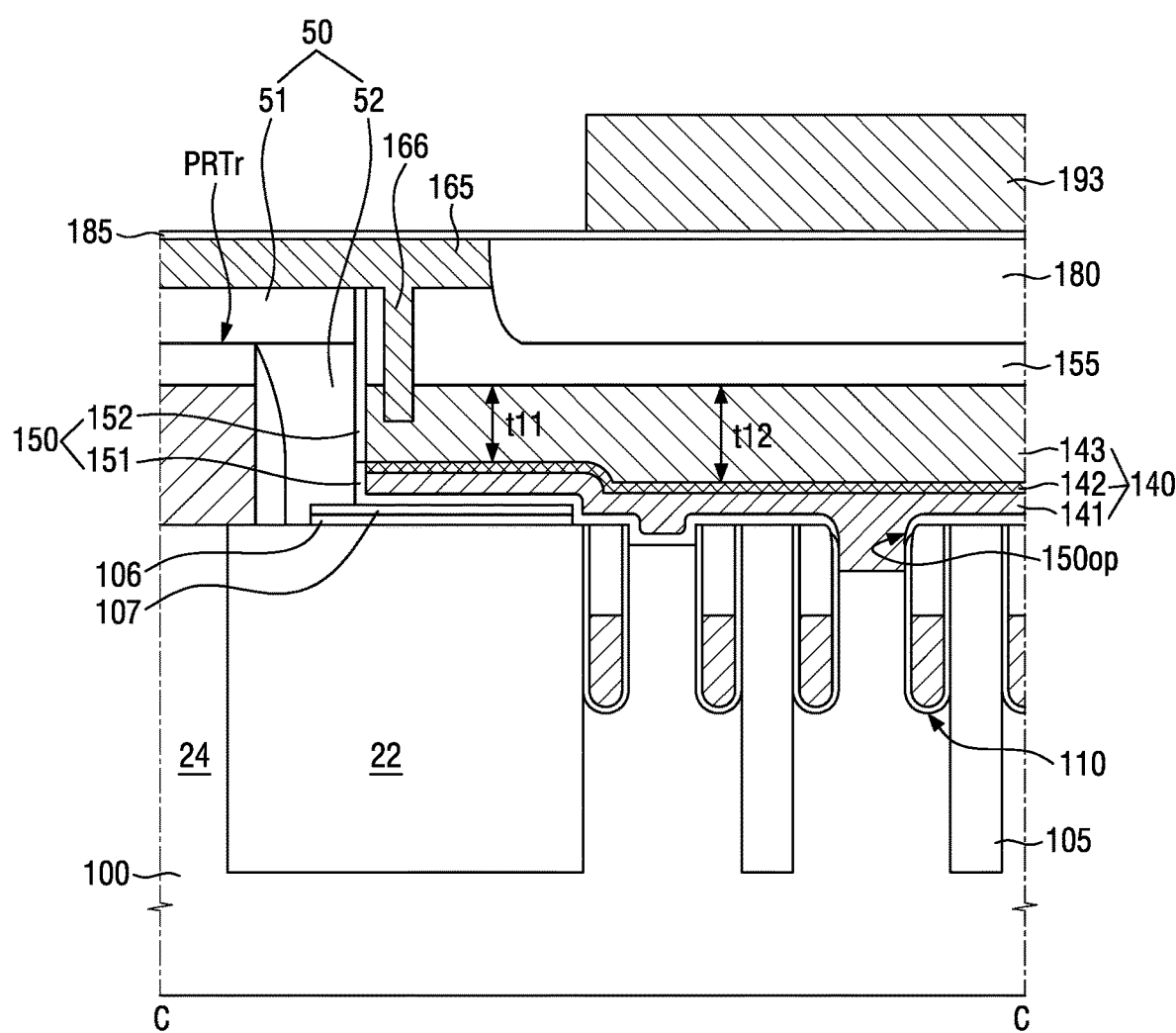
FIGS. 6A and 6B are cross-sectional views taken along line C-C of FIG. 2 according to various embodiments.
Figure 6B:
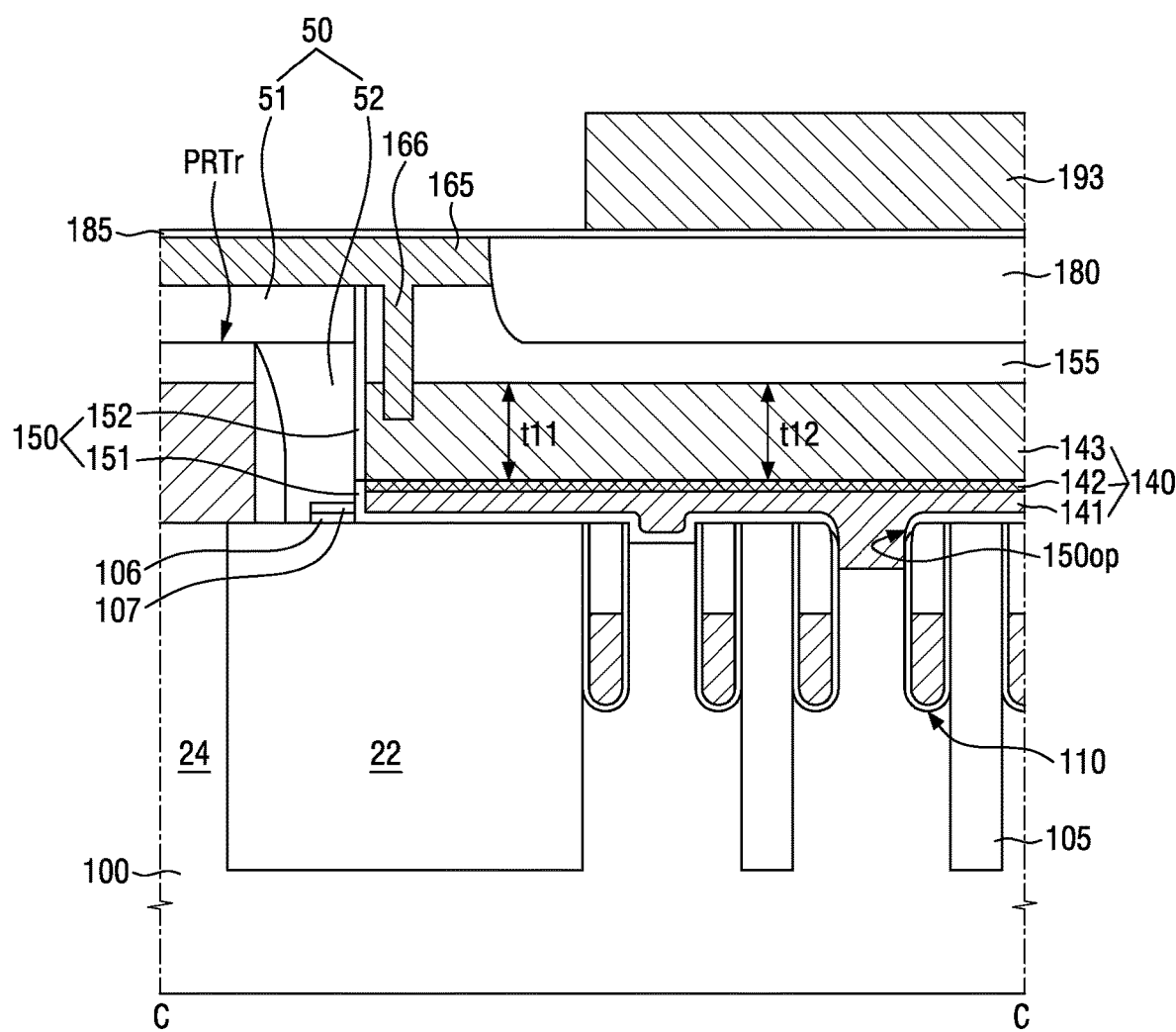

FIG. 1 is a schematic layout view of a cell region 20 of a semiconductor device according to embodiments. FIG. 2 is a schematic layout view of the semiconductor device including the cell region 20 of FIG. 1. FIG. 3 is a layout view having word lines WL and active regions ACT of FIG. 1. FIGS. 4A and 4C are cross-sectional views taken along line A-A of FIG. 1 according to various embodiments. FIG. 4B is an enlarged view of a portion P of FIG. 4A. FIG. 5 is a cross-sectional view taken along line B-B of FIG. 1. FIGS. 6A and 6B are cross-sectional views taken along line C-C of FIG. 2 according to various embodiments. For reference, FIGS. 6A and 6B may be cross-sectional views taken along bit lines BL of FIG. 1 according to various embodiments. In the drawings of the semiconductor device according to the embodiments, a dynamic random access memory (DRAM) is illustrated by way of example.

Referring to FIGS. 1 through 3, the semiconductor device according to the embodiments may include the cell region 20, a cell boundary region 22, and a peripheral region 24.

The cell boundary region 22 may be formed along edges of the cell region 20. The cell boundary region 22 may separate the cell region 20 and the peripheral region 24.

The cell region 20 may include a plurality of active regions ACT. The active regions ACT may be defined by a device isolation layer 105 (see FIG. 4A) formed in a substrate 100 (see FIG. 4A). As design rules of the semiconductor device are reduced, the active regions ACT may be disposed in the form of diagonal or oblique bars as illustrated in the drawings. For example, the active regions ACT may extend in a third direction D3.

A plurality of gate electrodes may extend in a first direction D1 across the active regions ACT. The gate electrodes may extend parallel to each other. The gate electrodes may be, for example, a plurality of word lines WL. The word lines WL may be disposed at equal intervals (i.e., spaced apart from each other) in a second direction D2 different from the first direction D1. A width of each word line WL or an interval between the word lines WL adjacent to each other may be determined according to the design rules. The first direction D1, the second direction D2 and the third direction D3 may correspond to horizontal directions with respect to an upper surface of the substrate 100, and different from each other. For example, the third direction D3 may correspond to a diagonal direction between the first direction D1 and the second direction D2.

Each of the active regions ACT may be divided into three parts by two word lines WL extending in the first direction D1. Each of the active regions ACT may include storage connection regions 103*b* and a bit line connection region 103*a*. The bit line connection region 103*a* may be located in a middle part of each of the active regions ACT, and the storage connection regions 103*b* may be located at opposite ends of each of the active regions ACT, respectively. For example, the bit line connection region 103*a* may be disposed between the two word lines WL intersecting each of the active regions ACT. One of the two word lines may be disposed between the bit line connection region 103*a* and one of the two storage connection regions 103*b*, and the other may be disposed between the bit line connection region 103*a* and the other of the two storage connection regions 103*b*.

A plurality of bit lines BL may be disposed on the word lines WL to extend in the second direction D2 orthogonal to the word lines WL. The bit lines BL may extend parallel to each other. The bit lines BL may be disposed at equal intervals (i.e., spaced apart from each other) in the first direction D1. A width of each bit line BL or an interval between the bit lines BL adjacent to each other may be determined according to the design rules.

The semiconductor device according to the embodiments may include various contact arrays formed on the active regions ACT. The various contact arrays may include, for example, direct contacts DC, buried contacts BC, and landing pads LP.

Here, the direct contacts DC may be contacts that electrically connect the active regions ACT to the bit lines BL. The buried contacts BC may be contacts that connect the active regions ACT to lower electrodes 191 (see FIG. 4A) of capacitors. Due to the arrangement structure, contact areas between the buried contacts BC and the active regions ACT may be small. Therefore, the conductive landing pads LP may be introduced to increase the contact areas of the buried contacts BC with the active regions ACT and also to increase the contact areas of the buried contacts BC with the lower electrodes 191 (see FIG. 4A) of the capacitors.

The landing pads LP may be disposed between the buried contacts BC and the lower electrodes 191 of the capacitors. Although not shown, the landing pads LP may be disposed between the active regions ACT and the buried contacts BC. In the semiconductor device according to the embodiments, the landing pads LP may be disposed between the buried contacts BC and the lower electrodes 191 of the capacitors. The increased contact areas by the introduction of the landing pads LP may reduce contact resistance between the active regions ACT and the lower electrodes 191 of the capacitors.

The direct contacts DC may be connected to the bit line connection regions 103a. The buried contacts BC may be connected to the storage connection regions 103b. Since the buried contacts BC are disposed at opposite ends of each active region ACT, the landing pads LP may be disposed adjacent to opposite ends of each active region ACT so as to partially overlap the buried contacts BC. For example, the buried contacts BC may be formed to overlap the active regions ACT and the device isolation layer 105 (see FIG. 4A) disposed between adjacent word lines WL and between adjacent bit lines BL.

The word lines WL may be buried in the substrate 100. The word lines WL may cross the active regions ACT located between the direct contacts DC or the buried contacts BC. As illustrated, two word lines WL may cross one active region ACT. Since the active regions ACT extend in the third direction D3, the word lines WL may be at an angle of less than 90 degrees to the active regions ACT.

The direct contacts DC and the buried contacts BC may be symmetrically or repetitively disposed on the active regions ACT. For example, the direct contacts DC and the buried contacts BC may be spaced apart from each other in the first direction D1 and the second direction D2. Unlike the direct contacts DC and the buried contacts BC, the landing pads LP may be disposed on the active regions ACT in a zigzag manner in the second direction D2 in which the bit lines BL extend. In addition, the landing pads LP may overlap the same side of each bit line BL in the first direction D1 in which the word lines WL extend. For example, each landing pad LP of a first line may overlap a left side of a corresponding bit line BL, and each landing pad LP of a second line may overlap a right side of the corresponding bit line BL.

Referring to FIGS. 1 through 6B, the semiconductor device according to the embodiments may include a plurality of gate structures 110, a plurality of bit line structures 130, a plurality of storage contacts 120, and an information storage part (i.e., a memory capacitor) 190.

The substrate 100 may be, for example, bulk silicon or silicon-on-insulator (SOI). Alternatively, the substrate 100 may be, but is not limited to, a silicon substrate or a substrate made of another material such as silicon germanium, silicon germanium on insulator (SGOI), indium antimonide, lead telluride, indium arsenide, indium phosphide, gallium arsenide, or gallium antimonide. In the following description, the substrate 100 will be described as a silicon substrate.

The device isolation layer 105 may be formed in the substrate 100. The device isolation layer 105 may have a shallow trench isolation (STI) structure having superior element isolation characteristics. The device isolation layer 105 may define the active regions ACT in the substrate 100. The active regions ACT defined by the device isolation layer 105 may be shaped like long islands, each including a short axis and a long axis as illustrated in FIG. 1. The active regions ACT may be shaped like diagonal lines at an angle of less than 90 degrees to the word lines WL formed in the device isolation layer 105. In addition, the active regions ACT may be shaped like diagonal lines at an angle of less than 90 degrees to the bit lines BL formed on the device isolation layer 105.

A cell boundary separation layer having the STI structure may be formed in the cell boundary region 22.

The device isolation layer 105 may include, for example, at least one of a silicon oxide layer, a silicon nitride layer, and a silicon oxynitride layer. Although the device isolation layer 105 is formed as a single insulating layer in FIGS. 4A through 5, this is merely for ease of description, and embodiments are not limited to this case. In addition, the cell boundary separation layer may include, for example, at least one of a silicon oxide layer, a silicon nitride layer, and a silicon oxynitride layer.

In FIGS. 6A and 6B, an upper surface of the device isolation layer 105, an upper surface of the substrate 100, and an upper surface of the cell boundary separation layer of the cell boundary region 22 lie in the same plane (i.e., are coplanar). However, this is merely for ease of description, and embodiments are not limited to this case.

The gate structures 110 may be formed in the substrate 100 and the device isolation layer 105. The gate structures 110 may be formed across the device isolation layer 105 and the active regions ACT defined by the device isolation layer 105. One gate structure 110 may be formed in the substrate 100 and the device isolation layer 105 located in the first direction D1 in which the gate structure 110 extends. Each of the gate structures 110 may include a gate trench 114 formed in the substrate 100 and the device isolation layer 105, a gate insulating layer 111, a gate electrode 112, and a gate capping pattern 113. Here, the gate electrode 112 may correspond to a word line WL.

The gate insulating layer 111 may extend along sidewalls and a bottom surface of the gate trench 114. The gate insulating layer 111 may extend along the profile of at least a part of the gate trench 114. The gate insulating layer 111 may include silicon oxide, silicon nitride, silicon ox nitride, or a high dielectric constant (high-k) material having a higher dielectric constant than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations of the same.

The gate electrode 112 may be formed on the gate insulating layer 111. The gate electrode 112 may fill a part of the gate trench 114.

The gate electrode 112 may include at least one of, for example, polysilicon, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiM), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver Ag), gold (Au), zinc (Zn), vanadium (V), and combinations of the same.

The gate capping pattern 113 may be formed on the gate electrode 112. The gate capping pattern 113 may fill the other part of the gate trench 114 excluding the part in which the gate electrode 112 is formed. Although the gate insulating layer 111 is illustrated as extending along sidewalls of the gate capping pattern 113, embodiments are not limited to this case.

The gate capping pattern 113 may include at least one of, for example, silicon nitride (SiN), silicon oxynitride (SiON), silicon oxide (SiO$_2$), silicon carbonitride (SiCN), silicon oxycarbonitride (SiOCN), and combinations of the same.

In FIG. 5, the position of a lowest part of a gate structure 110 formed in the substrate 100 may be different from the position of a lowest part of a gate structure 110 formed in the device isolation layer 105. Due to a difference between an etch rate of the substrate 100 and an etch rate of the device isolation layer 105 in the process of forming the gate trenches 114, the position of the lowest part of the gate structure 110 formed in the substrate 100 may be different from the position of the lowest part of the gate structure 110 formed in the device isolation layer 105. Although not illustrated, an impurity doing region may be formed on at least one side of each gate structure 110. The impurity doping region may be a source/drain region of a transistor.

Each bit line structure 130 may be formed on the substrate 100 and the device isolation layer 105 in which the gate structures 110 are formed or buried. Each bit line structure 130 may intersect the device isolation layer 105 and an active region ACT defined by the device isolation layer 105. Each bit line structure 130 may include a bit line contact part 130_1 and a bit line pass part 130_2. For example, in each bit line structure 130, the bit line contact part 130_1 and the bit line pass part 130_2 may be alternately repeated in the second direction D2. In this case, the bit line contact part 130_1 of one bit line structure 130 may be spaced apart in the first direction D1 from the bit line pass part 130_2 of another bit line structure 130 adjacent to the one bit line structure 130. (See, FIGS. 1 and 4A, for example).

The bit line contact part 130_1 may be electrically connected to the active region ACT. For example, the bit line contact part 130_1 of each bit line structure 130 may be connected to the active region ACT. The bit line contact part 130_1 may be located on the bit line connection region 103a. The bit line contact part 130_1 may be connected to the bit line connection region 103a. The bit line contact part 130_1 may be a part in which a direct contact DC is located. A part of the bit line contact part 130_1 may correspond to the direct contact DC.

The bit line pass part 130_2 of each bit line structure 130 is not electrically connected to the active region ACT. The bit line pass part 130_2 is electrically connected to the active region ACT, but is electrically connected to the active region ACT through the bit line contact part 130_1. The bit line pass part 130_2 may be disposed between bit line contact parts 130_1 adjacent to each other in the second direction D2. For example, in each bit line structure 130, the bit line contact part 130_1 and the bit line pass part 130_2 may be alternately repeated in the second direction D2.

The bit line pass part 130_2 may be located on the device isolation layer 105 between storage connection regions 103b adjacent to each other in the first direction D1. The bit line pass part 130_2 of one bit line structure 130 may be spaced apart in the first direction D1 from the bit line contact part 130_1 of another bit line structure 130 adjacent to the one bit line structure 130. (See, FIGS. 1 and 4A, for example).

In the views (FIGS. 4A and 4C) of a region between adjacent word lines WL taken along the first direction D1, the bit line contact part 130_1 may be located on the bit line connection region 103a and the device isolation layer 105, and the bit line pass part 130_2 may be located on the storage connection region 103b and the device isolation layer 105. For example, the bit line connection region 103a and the storage connection region 103b spaced apart from each other in the first direction D1 may be disposed on two different active regions, respectively, which are spaced apart from each other in the first direction D1.

A bit line structure 130 may include a bit line stack 140, a bit line spacer 150, and a bit line mask pattern 155.

In the bit line contact part 130_1, the bit line spacer 150 may include a bit line contact opening 150op which exposes an active region ACT, for example, the bit line connection region 103a. In the bit line contact part 130_1, the bit line spacer 150 defining the bit line contact opening 150op exposes the active region ACT. The bit line structure 130 may be connected to the active region ACT through the bit line contact opening 150op. For example, in the bit line contact part 130_1, the bit line spacer 150 may be disposed on opposite sidewalls of the bit line stack 140, for example, a lower portion thereof.

In the bit line pass part 130_2, the bit line spacer 150 may extend along sidewalls of the bit line stack 140 and a bottom surface of the bit line stack 140. The bit line spacer 150 may define a bit line trench 150t.

The bit line spacer 150 may include a lower line spacer 151 and an upper line spacer 152. The upper line spacer 152 may be disposed on the lower line spacer 151. For example, the upper line spacer 152 may vertically overlap the lower line spacer 151. In the semiconductor device according to the embodiments, a stacked structure of the lower line spacer 151 may be different from that of the upper line spacer 152.

In the bit line contact part 130_1, the lower line spacer 151 may define the bit line contact opening 150op which exposes the bit line connection region 103a. In the bit line contact part 130_1, the lower line spacer 151 exposes the active region ACT. The lower line spacer 151 may be disposed on a part of each sidewall of the bit line stack 140. In the bit line pass part 130_2, the lower line spacer 151 may include one or more insulating layers continuously extending along a part of each sidewall of the bit line stack 140 and the bottom surface of the bit line stack 140. In the semiconductor device according to the embodiments, the lower line spacer 151 may include one insulating layer continuously extending along a part of opposite sidewalls of the bit line stack 140 and the bottom surface of the bit line stack 140.

The upper line spacer 152 may include first through third sub-upper spacers 152a through 152c. The first sub-upper spacer 152a may have an L shape. The first sub-upper spacer 152a may include a bottom part extending along an upper surface of the lower line spacer 151 and a protruding part protruding from the bottom part and vertically extending in a thickness direction of the substrate 100. Here, the "L shape" encompasses not only a case where the bottom part and the protruding part form 90 degrees but also a case where the bottom part and the protruding part meet at an angle greater than 90 degrees and smaller than 180 degrees or at an angle greater than 0 degrees and smaller than 90 degrees. In addition, the "L shape" here encompasses not only an L shape having an angled bent part but also an L shape having a rounded bent part. The first sub-upper spacer 152a may be bent toward the bit line stack 140.

The second sub-upper spacer 152b may be disposed on the bottom part of the first sub-upper spacer 152a. The third sub-upper spacer 152c may be disposed on the first and second sub-upper spacers 152a and 152b.

Each of the lower line spacer 151, the first sub-upper spacer 152a and the third sub-upper spacer 152c may include at least one of, for example, silicon oxide, silicon oxycarbide (SiOC), silicon nitride (SiN), silicon oxynitride (SiON), and silicon oxycarbonitride (SiOCN). The second sub-upper spacer 152b may be an air spacer (i.e., an air gap). When at least one of the first sub-upper spacer 152a and the third sub-upper spacer 152c includes the same material as the lower line spacer 151, the first sub-upper spacer 152a and/or the third sub-upper spacer 152c may be viewed as being integrated with the lower line spacer 151, Since the second sub-upper spacer 1520 is an air spacer, the upper line spacer 152 may include an air spacer. The lower line spacer 151 does not include an air spacer. The term "air" as discussed herein, may refer to atmospheric air, or other gases that may be present during the manufacturing process.

In FIGS. 4A and 4C, the second sub-upper spacer 152b may be interposed between the first sub-upper spacer 152a and the third sub-upper spacer 152c. In an example embodiment, the first sub-upper spacer 152a, a sacrificial layer and the third sub-upper spacer 152c may be sequentially disposed on the sidewalls of the bit line stack 140, and then the sacrificial layer is removed to form the air spacer of the second sub-upper spacer 152b. However, this is merely for ease of description, and embodiments are not limited to this case.

The bit line stack 140 may be disposed on the substrate 100 and the device isolation layer 105 located in the second direction D2 in which the bit line stack 140 extends. The bit line stack 140 may fill a part (e.g., a lower part) of the bit line trench 150t. The bit line stack 140 may be formed to intersect the gate structures 110. Here, the bit line stack 140 may correspond to a bit line BL. In addition, in the bit line contact part 130_1, a part of the bit line stack 140 may correspond to the direct contact DC.

The bit line stack 140 may include, for example, a first conductive layer 141, a second conductive layer 142, and a third conductive layer 143. The first through third conductive layers 141 through 143 may be sequentially stacked on the substrate 100 and the device isolation layer 105. Each of the first through third conductive layers 141 through 143 may include at least one of a semiconductor material doped with impurities, a conductive silicide compound, a conductive metal nitride, and metal. For example, the first conductive layer 141 may include a doped semiconductor material pattern, the second conductive layer 142 may include a conductive silicide pattern, and the third conductive layer 143 may include a metallic conductive layer pattern. The metallic conductive layer pattern may include, but is not limited to, at least one of a conductive metal nitride and a metal.

Although the third conductive layer 143 is illustrated as a single layer in FIGS. 4A, 4C, 6A and 6B, this is merely for ease of description, and embodiments are not limited to this case. The third conductive layer 143 may include a barrier conductive layer and a filling conductive layer which fills a barrier recess defined by the barrier conductive layer. The barrier conductive layer may extend along an upper surface of the second conductive layer 142 and a part of each sidewall of the bit line trench 150t.

In the bit line contact part 130_1, a part of the first conductive layer 141 may correspond to the direct contact DC. The first conductive layer 141 may electrically connect the bit line stack 140 to the active region ACT, For example, the bit line connection region 103a.

The bit line mask pattern 155 may be disposed on the bit line stack 140. The bit line mask pattern 155 may fill the other part (e.g., an upper part) of the bit line trench 150t. The bit line mask pattern 155 may include at least one of, for example, silicon oxide, silicon oxycarbide (SiOC), silicon nitride (SiN), silicon oxynitride (SiON), and silicon oxycarbonitride (SiOCN), The bit line stack 140 may be disposed over the cell region 20 and the cell boundary region 22. A part of the bit line stack 140 may also be disposed on the cell boundary region 22.

In FIGS. 2 and 6A, a thickness t12 of the third conductive layer 143 in the cell region 20 may be greater than a thickness t11 of the third conductive layer 143 in the cell boundary region 22. Although the thickness t11 of the third conductive layer 143 in the cell boundary region 22 is illustrated as being smaller than the thickness t12 of the third conductive layer 143 in the cell region 20, embodiments are not limited to this case. In the cell boundary region 22, the third conductive layer 143 may also include a part having the thickness t12 of the third conductive layer 143 in the cell region 20 and a part having the thickness t11 smaller than the thickness t12 of the third conductive layer 143 in the cell region 20.

Since a part of a peripheral buffer insulating layer 106 and a part of a cell buffer insulating layer 107 are interposed between the bit line stack 140 and the cell boundary region 22, the thickness t11 of the third conductive layer 143 in the cell boundary region 22 may be smaller than the thickness t12 of the third conductive layer 143 in the cell region 20. The peripheral buffer insulating layer 106 and the cell buffer insulating layer 107 do not extend into the cell region 20.

In FIGS. 2 and 6B, the thickness t12 of the third conductive layer 143 in the cell region 20 may be substantially the same as the thickness t11 of the third conductive layer 143 in the cell boundary region 22. The peripheral buffer insulating layer 106 and the cell buffer insulating layer 107 may not be interposed between the bit line stack 140 and the cell boundary region 22.

In FIGS. 4A and 4B, the bit line structure 130 may include a boundary surface 130i that meets the device isolation layer 105 and the storage connection regions 103b. The bit line pass part 130_2 may include the boundary surface 130i that meets the device isolation layer 105 and the storage connection regions 103b. The boundary surface 130i of the bit line pass part 130_2 includes a first sub-boundary surface 130ia that meets the device isolation layer 105 and a second sub-boundary surface 130ib that meets the storage connection regions 103b.

For example, the first sub-boundary surface 130*ia* of the bit line pass part 130_2 may be concave. The second sub-boundary surface 130*ib* of the bit line pass part 130_2 may be curved toward the bit line stack 140.

The bit line pass part 130_2 extends into the storage connection regions 103*b*. For example, if etching does not occur during a fabrication process, each of the storage connection regions 103*b* may have an outline OL. However, a part of each of the storage connection regions 103*b* may be etched during the process of forming the bit line structure 130. Thus, a part (e.g., a lower end) of the bit line pass part 130_2 may extend into the storage connection regions 103*b*. For example, the lower end of the bit line pass part 130_2 may be buried in the storage connection regions 103*b*. The second sub-boundary surface 103*ib* of the bit line pass part 130_2 is more recessed toward the substrate 100 than the outline OL of each of the storage connection regions 103*b*. Unlike in the drawings, in the outline OL of each of the storage connection regions 103*b*, a part where an upper surface of the outline OL is connected to each sidewall of the outline OL may be rounded.

In FIGS. 4A and 4C, the bit line pass part 130_2 extending into the storage connection regions 103*b* is symmetrical with respect to the device isolation layer 105. However, this is merely for ease of description, and embodiments are not limited to this case. In an example embodiment, the bit line pass part 130_2 extending into the storage connection regions 103*b* is not symmetrical with respect to the device isolation layer 105. For example, a depth of the bit line pass part 130_2 extending into the storage connection region 103*b* on a side of the device isolation layer 105 may be different from a depth of the bit line pass part 130_2 extending into the storage connection region 103*b* on the other side of the device isolation layer 105.

Fence patterns 170 may be formed on the substrate 100 and the device isolation layer 105. The fence patterns 170 may be formed to overlap the gate structures 110 formed or buried in the substrate 100 and the device isolation layer 105. The fence patterns 170 may be formed on the gate structures 110 and may extend in the first direction D1. The fence patterns 170 may be disposed between the bit line structures 130 extending in the second direction D2. The fence patterns 170 may include, for example, at least one of silicon oxide, silicon nitride, silicon oxynitride, and combinations of the same. Although each of the fence patterns 170 is illustrated as a single layer, this is merely for ease of description, and embodiments are not limited to this case.

Each of the storage contacts 120 may be formed between adjacent gate structures 110 and between adjacent bit line structures 130. Each of the storage contacts 120 may overlap the substrate 100 and the device isolation layer 105 between adjacent gate structures 110 and adjacent bit line structures 130. Here, the storage contacts 120 may correspond to the buried contacts BC. Each of the storage contacts 120 may include a part extending along sidewalls of the bit line structures 130 and sidewalls of the fence patterns 170.

Each of the storage contacts 120 may include, for example, at least one of a semiconductor material doped with impurities, a conductive silicide compound, a conductive metal nitride, and metal.

In the semiconductor device according to the embodiments, a height h12 of a lowest part of each storage contact 120 from a bottom surface of the device isolation layer 105 may be smaller than a height h13 of a lowest part of the bit line pass part 130_2 from the bottom surface of the device isolation layer 105. In addition, the height h12 of the lowest part of each storage contact 120 from the bottom surface of the device isolation layer 105 may be greater than a height h11 of a lowest part of the bit line contact part 130_1. Here, the height comparison may be made based on a cross-sectional view taken along the first direction D1 of FIG. 1.

In FIGS. 4A through 4C, each storage contact 120 does not vertically overlap a bottom surface of the bit line pass part 130_2. However, embodiments are not limited to this case. Depending on a margin in the fabrication process, a part of each storage contact 120 may extend along the bottom surface of the bit line pass part 130_2 to overlap the bottom surface of the bit line pass part 130_2. In this case, each storage contact 120 may have a shape similar to the letter L.

In FIGS. 4A and 4B, each storage contact 120 may include a boundary surface 120*i* that meets the device isolation layer 105 and a storage connection region 103*b*. The boundary surface 120*i* of each storage contact 120 includes a third sub-boundary surface 120*ia* that meets the device isolation layer 105 and a fourth sub-boundary surface 120*ib* that meets the storage connection region 103*b*. For example, the fourth sub-boundary surface 120*ib* of each storage contact 120 may be at a greater height from the bottom surface of the device isolation layer 105 than the third sub-boundary surface 120*ia* of each storage contact 120. In FIG. 4B, a part of the fourth sub-boundary surface 120*ib* of the storage contact 120 is located at the same level as the third sub-boundary surface 120*ia* of the storage contact 120. However, embodiments are not limited to this case. Depending on a margin in the fabrication process, the fourth sub-boundary surface 120*ib* of each storage contact 120 may be, on the whole, higher than the third sub-boundary surface 120*ia* of each storage contact 120.

In the semiconductor device according to the embodiments, the height h13 of the lowest part of the bit line pass part 130_2 from the bottom surface of the device isolation layer 105 may be smaller than a height h14 of a highest part of the fourth sub-boundary surface 120*ib* of each storage contact 120 and greater than the height h12 of a lowest part of the fourth sub-boundary surface 120*ib* of each storage contact 120.

Each of the storage connection regions 103*b* may include an upper part 130*b*_1 that meets a storage contact 120 and a lower part 130*b*_2 that does not meet the storage contact 120. Each of the storage contacts 120 extends into a storage connection region 103*b*. The fourth sub-boundary surface 120*ib* of each storage contact 120 is more recessed toward the substrate 100 than the outline OL of a storage connection region 103*b*. In the semiconductor device according to the embodiments, the upper part 130*b*_1 of each storage connection region 103*b* is more recessed toward the substrate 100 than the outline OL of each storage connection region 103*b*.

In FIGS. 4A and 4B, the upper part 130*b*_1 of each storage connection region 103*b* may be rounded. Alternatively, referring to FIG. 4C by considering FIG. 4B, in the upper part 130*b*_1 of each storage connection region 103*b*, an upper surface of the storage connection region 103*b* and each sidewall of the storage connection region 103*b* may meet at an angle.

Storage pads 160 may be formed on the storage contacts 120. The storage pads 160 may be electrically connected to the storage contacts 120. Here, the storage pads 160 may correspond to the landing pads LP. The storage pads 160 may partially overlap upper surfaces of the bit line structures 130 or may not overlap the upper surfaces of the bit line structures 130. The storage pads 160 may include, for example, at least one of a semiconductor material doped with impurities, a conductive silicide compound, a conductive metal nitride, and a metal.

A pad separation layer 180 may be formed on the storage pads 160, the bit line structures 130, and the fence patterns 170. The pad separation layer 180 may define each of the storage pads 160 which are spaced apart from each other. In addition, the pad separation layer 180 may be patterned to expose a part of an upper surface of each storage pad 160. The pad separation layer 180 may include an insulating material to electrically isolate the storage pads 160 from each other. For example, the pad separation layer 180 may include at least one of a silicon oxide layer, a silicon nitride layer, a silicon oxynitride layer, and combinations of the same.

An etch stop layer 185 may be formed on the pad separation layer 180 and the storage pads 160. The etch stop layer 185 may include at least one of a silicon nitride layer, a silicon carbonitride layer, a silicon oxynitride layer, and a silicon oxycarbide layer.

The information storage part 190 may be formed on the pad separation layer 180. The information storage part 190 may be electrically connected to the storage pads 160. For example, the information storage part 190 may be electrically connected to the storage contacts 120. A part of the information storage part 190 may be disposed in the etch stop layer 185. The information storage part 190 may include, for example, capacitors. The information storage part 190 includes the lower electrodes 191, a capacitor insulating layer 192, and an upper electrode 193.

Each of the lower electrodes 191 is illustrated as having a cylindrical shape. However, the shape of each of the lower electrodes 191 is not limited to the cylindrical shape, and each of the lower electrodes 191 may also have a pillar shape or an L shape. The capacitor insulating layer 192 is formed on the lower electrodes 191. The capacitor insulating layer 192 may be formed along profiles of the lower electrodes 191. The capacitor insulating layer 192 may be formed along outer sidewalls and inner sidewalls of the lower electrodes 191. The upper electrode 193 is formed on the capacitor insulating layer 192. The upper electrode 193 may cover the outer sidewalls of the lower electrodes 191.

The lower electrodes 191 may include, but are not limited to, a doped semiconductor material, a conductive metal nitride (such as titanium nitride, tantalum nitride or tungsten nitride), metal (such as ruthenium, iridium, titanium or tantalum), or a conductive metal oxide (such as iridium oxide). The capacitor insulating layer 192 may include, but is not limited to, one of silicon oxide, silicon nitride, silicon oxynitride, a high-k material, and combinations of the same. The upper electrode 193 may include, for example, at least one of a doped semiconductor material, metal, a conductive metal nitride, and metal silicide.

A peri-transistor PRTr may be formed in the peripheral region 24. A peri-insulating layer 50 may be formed around the peri-transistor PRTr. The peri-insulating layer 50 may include a lower peri-insulating layer 52 and an upper peri-insulating layer 51.

A connection wiring 165 may be disposed on the peri-insulating layer 50. The connection wiring 165 may be connected to the bit line stack 140 by a bit line peri-contact 166. The bit line peri-contact 166 may be formed in the cell boundary region 22. The connection wiring 165 may connect the peri-transistor PRTr and the bit line stack 140. The connection wiring 165 and the bit line peri-contact 166 may include at least one of a conductive metal nitride and metal.

FIGS. 7 through 10 illustrate semiconductor devices according to various embodiments. For ease of description, differences from the embodiments of FIGS. 1 through 6B will be mainly described.

Figure 7:
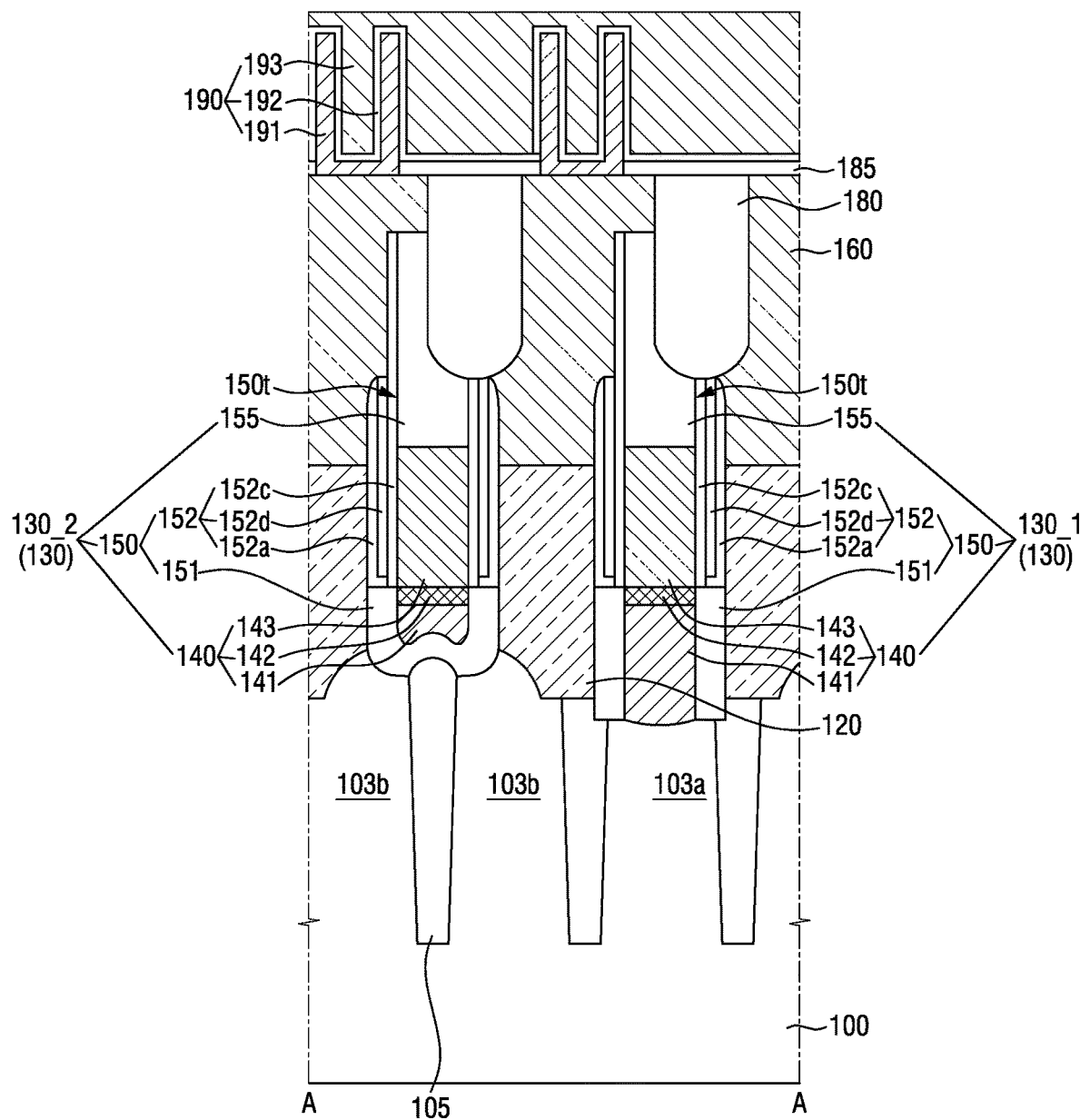
FIGS. 7 through 10 illustrate semiconductor devices according to embodiments according to various embodiments.

Referring to FIG. 7, in a semiconductor device according to embodiments, an upper line spacer 152 may include a fourth sub-upper spacer 152d instead of the second sub-upper spacer 152b (see FIG. 4).

The fourth sub-upper spacer 152d may include at least one of, for example, silicon oxide, silicon oxycarbide (SiOC), silicon nitride (SiN), silicon oxynitride (SiON), and silicon oxycarbonitride (SiOCN). In the semiconductor device according to the embodiments, the upper line spacer 152 may not include an air spacer.

Figure 8:
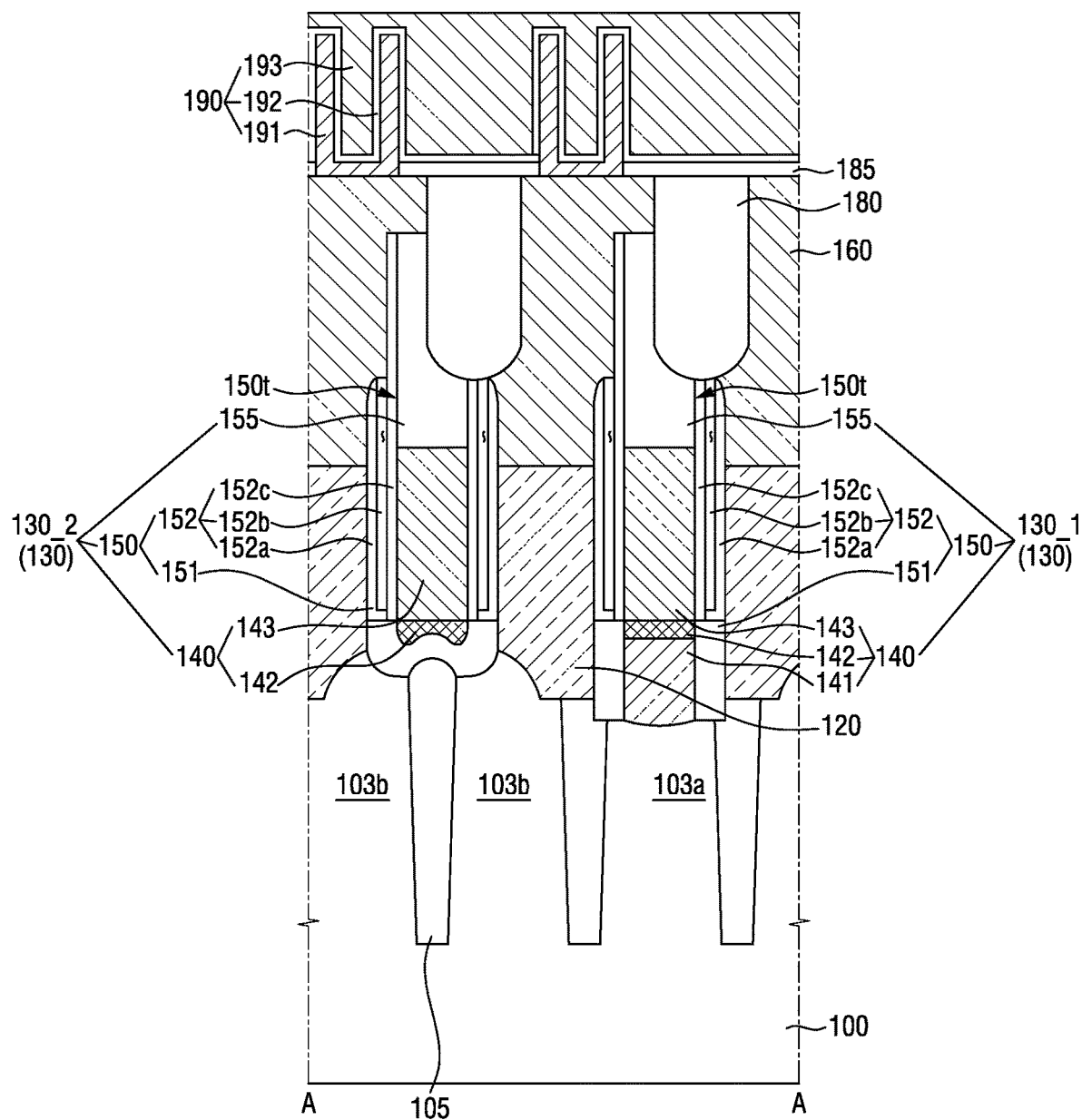

Referring to FIG. 8, in a semiconductor device according to embodiments, a bit line pass part 130_2 may not include a first conductive layer 141.

For example, a bit line stack 140 of the bit line pass part 130_2 may have a structure in which a second conductive layer 142 and a third conductive layer 143 are stacked.

Figure 9:
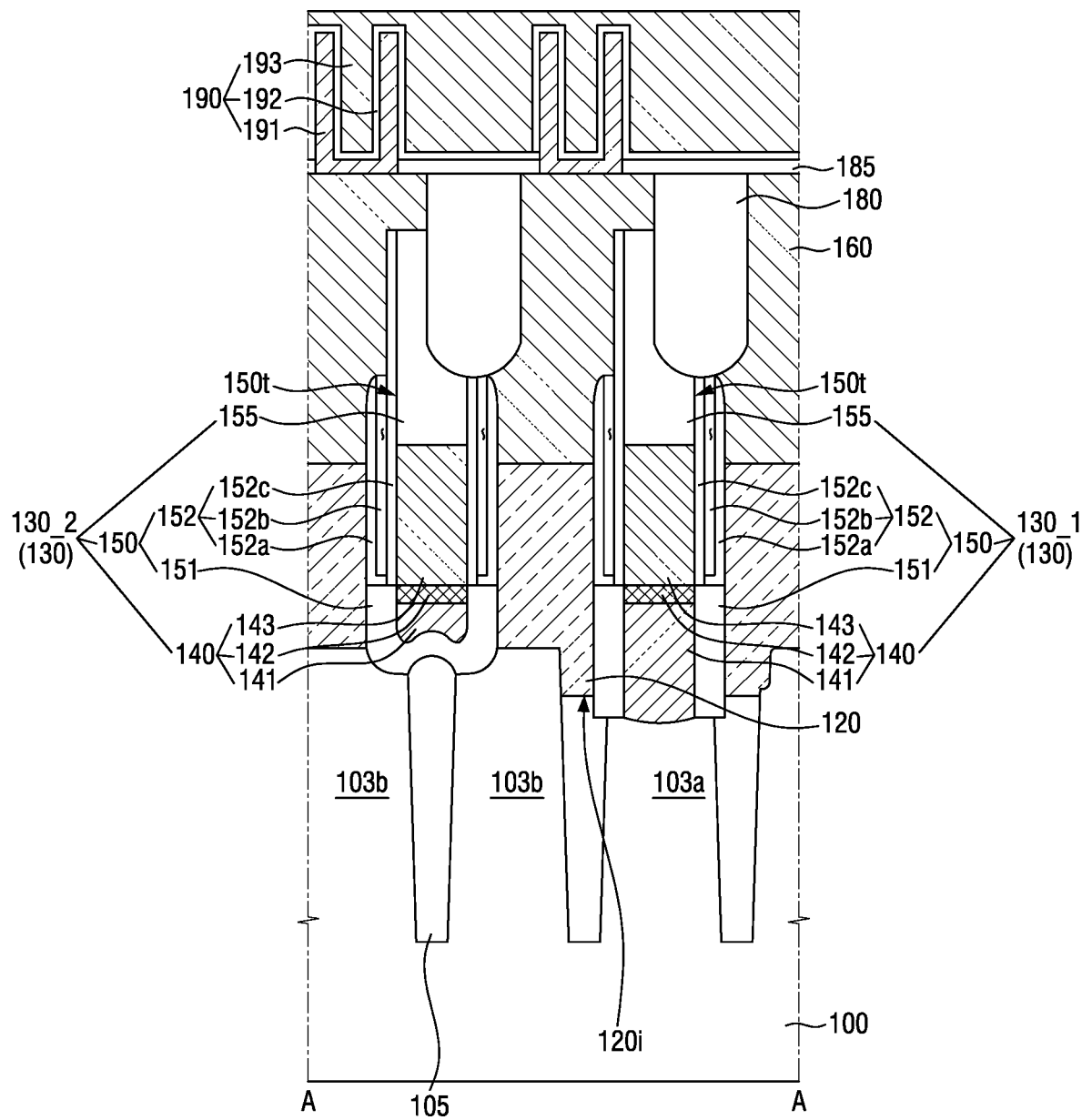

Referring to FIG. 9, according to embodiments, a storage contact 120 disposed on a first side of a bit line contact part 130_1 may not extend into a storage connection region 103b in a semiconductor device. A storage contact 120 disposed on a second side, opposite the first side, of the bit line contact part 130_1 may extend into a storage connection region 103b.

On the first side of the bit line contact part 130_1, a boundary surface 120i between the storage connection region 103b and the storage contact 120 may have the outline OL of the storage connection region 103b of FIG. 4B. On the second side of the bit line contact part 130_1, a sidewall of the storage connection region 103b may include a step.

Figure 10:
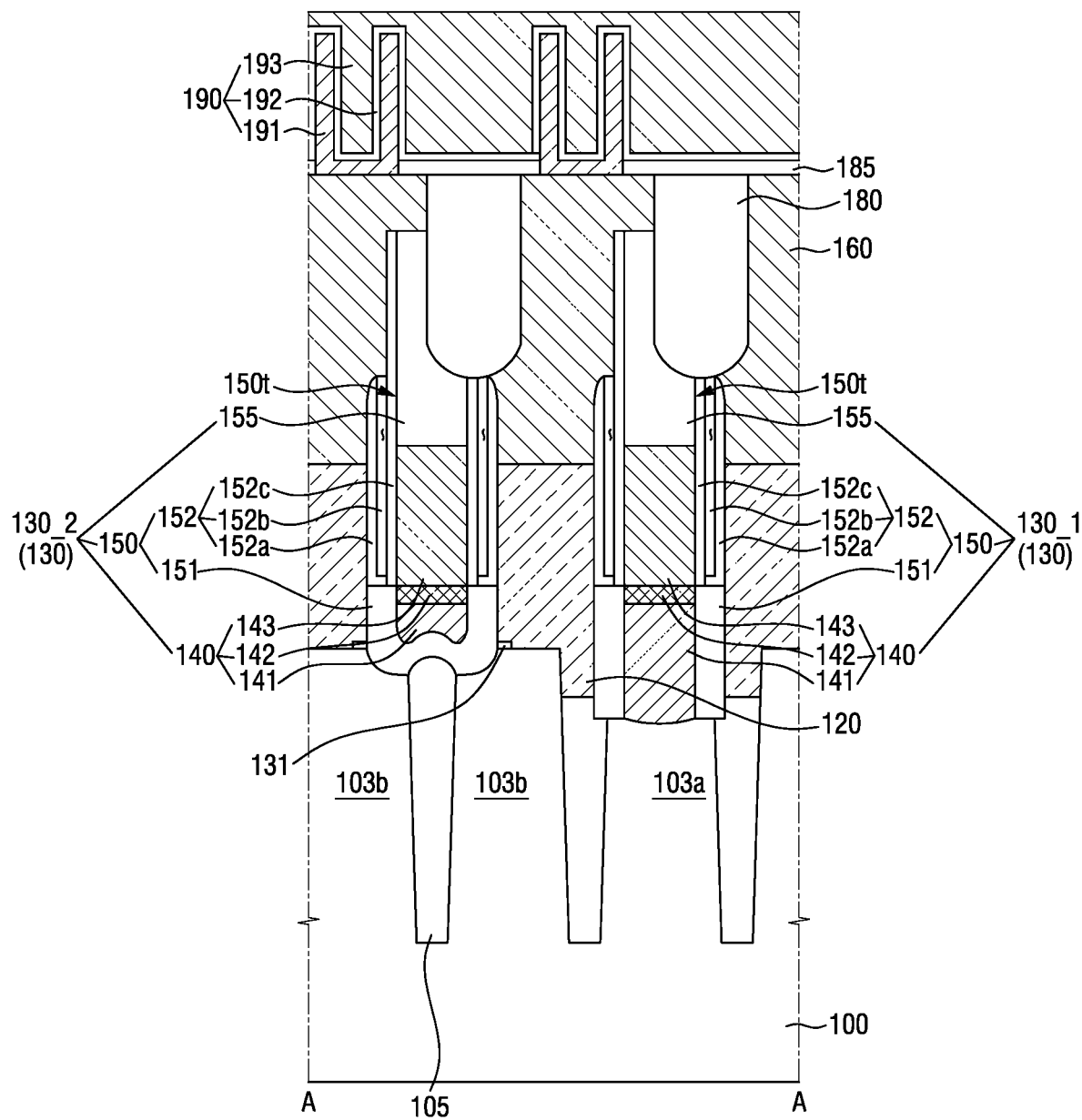

Referring to FIG. 10, a semiconductor device according to embodiments may further include protruding buffer patterns 131 protruding from sidewalls of a bit line pass part 130_2.

Each of the protruding buffer patterns 131 may be disposed on a part of an upper surface of a storage connection region 103b. For example, a width of each protruding buffer pattern 131 in the first direction D1 (see FIG. 1) is smaller than a width of each storage contact 120 in the first direction D1. For example, each of the protruding buffer patterns 131 extends into a storage contact 120 but does not extend to a bit line contact part 130_1. At least a part of each protruding buffer pattern 131 may be formed in the same fabrication process as the cell buffer insulating layer 107 of FIGS. 6A and 6B. The protruding buffer patterns 131 may include at least one of, for example, silicon oxide, silicon oxycarbide (SiOC), silicon nitride (SiN), silicon oxynitride (SiON), and silicon oxycarbonitride (SiOCN). Although each of the protruding buffer patterns 131 is illustrated as a single layer, this is merely for ease of description, and embodiments are not limited to this case.

Figure 11:
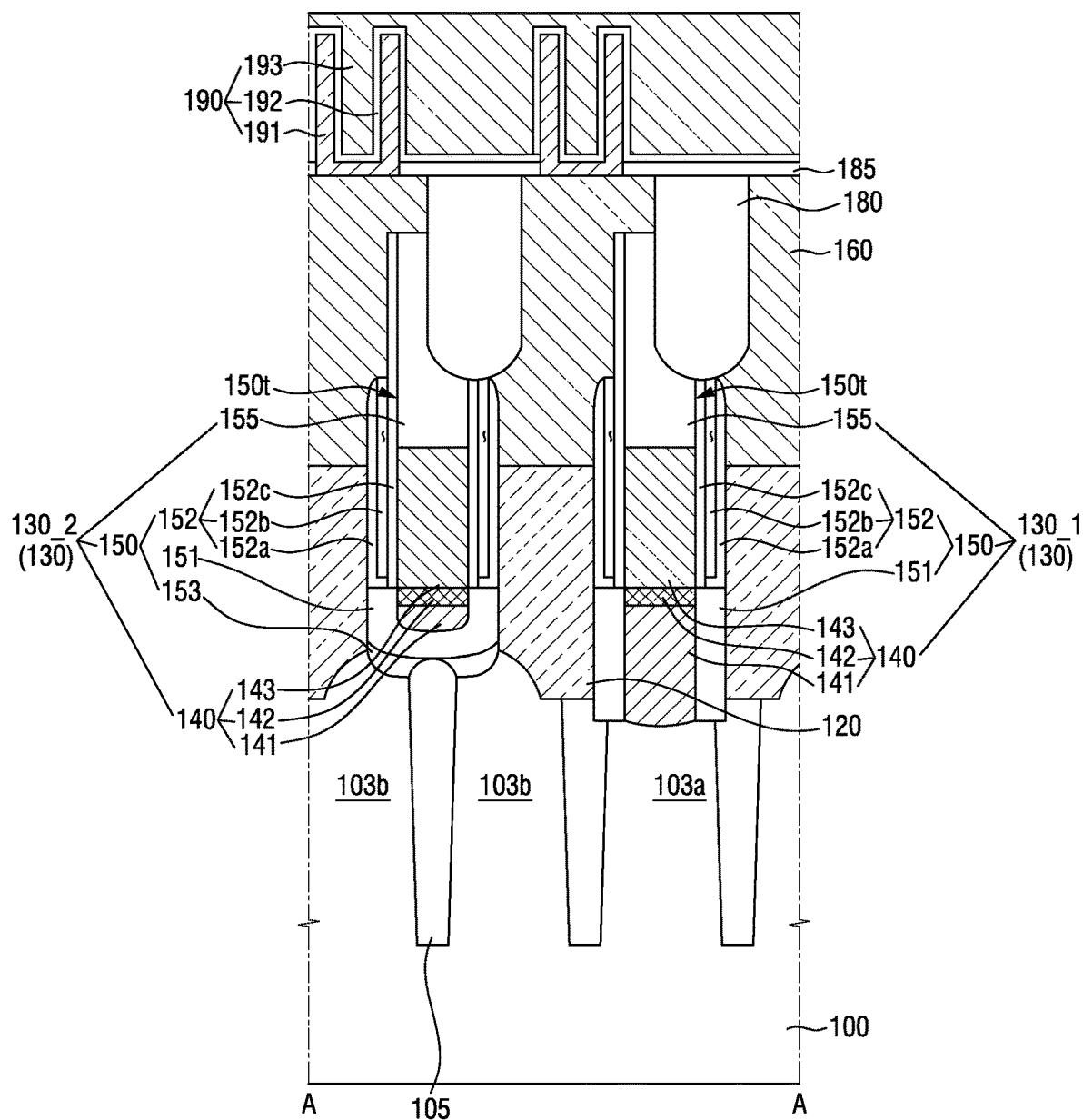
FIGS. 11 through 13 illustrate semiconductor devices according to embodiments according to various embodiments.
Figure 12:
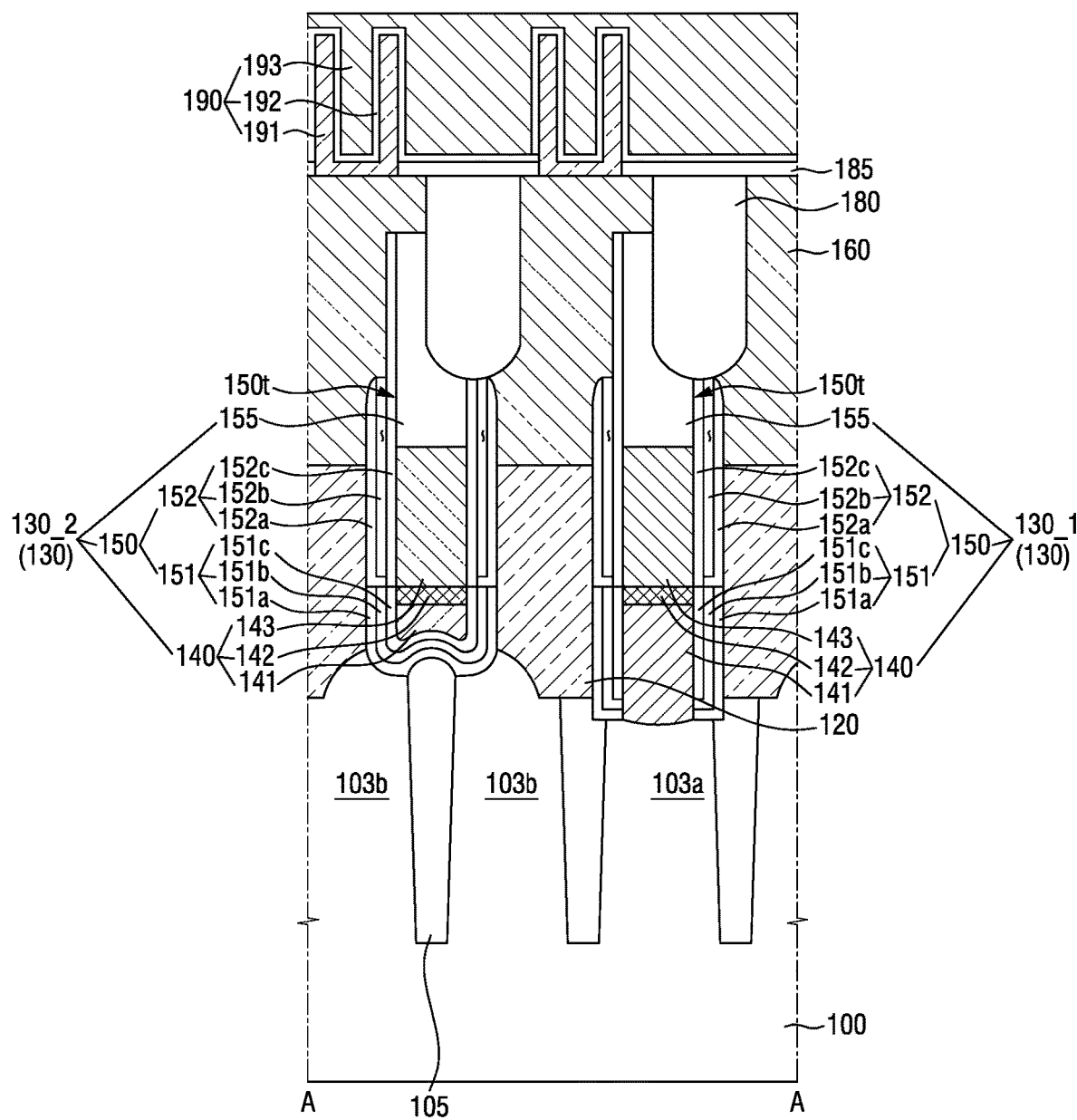
Figure 13:
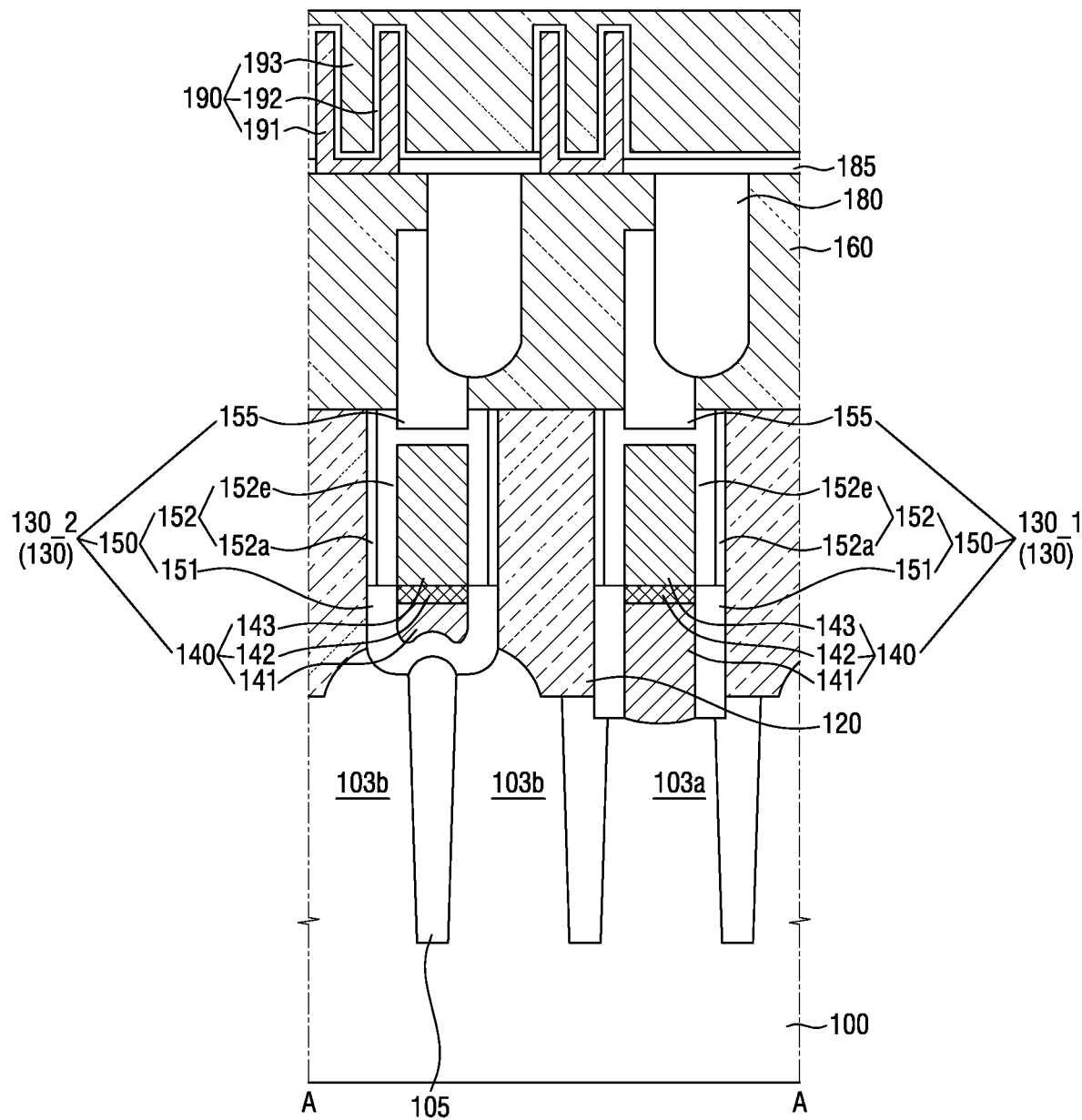

FIGS. 11 through 13 illustrate semiconductor devices according to various embodiments. For ease of description, differences from the embodiments of FIGS. 1 through 6B will be mainly described.

Referring to FIG. 11, in a semiconductor device according to embodiments, a bit line spacer 150 may further include a bottom line spacer 153. A lower line spacer 151 may be disposed on the bottom line spacer 153. For example, the lower line spacer 151 may be interposed between the bottom line spacer 153 and the upper line spacer 152.

A bottom surface of a bit line structure 130 may have a curved shape because a part of the bit line structure 130 extends into storage connection regions 103b. The bottom line spacer 153 may fill a curved part of the bottom surface of the bit line structure 130. The bottom line spacer 153 may be located in a bit line pass part 130_2.

The bottom line spacer 153 may include at least one of, for example, silicon oxide, silicon oxycarbide (SiOC), silicon nitride (SiN oxynitride (SiON), and silicon oxycarbonitride (SiOCN). Although the bottom line spacer 153 is illustrated as a single layer, this is merely for ease of description, and embodiments are not limited to this case.

Referring to FIG. 12, in a semiconductor device according to embodiments, a lower line spacer 151 may include first through third sub-lower spacers 151a through 151c. Each of the first through third sub-lower spacers 151a through 151c may continuously extend along a part of each sidewall of a bit line stack 140 and a bottom surface of the bit line stack 140.

The first through third sub-lower spacers 151a through 151c may be sequentially stacked on a substrate 100. In a bit line contact part 130_1, the first and second sub-lower spacers 151a and 151b may be L-shaped.

Each of the first through third sub-lower spacers 151a through 151c may include at least one of, for example, silicon oxide, silicon oxycarbide (SiOC), silicon nitride (SiN silicon oxynitride (SiON), and silicon oxycarbonitride (SiOCN).

Although the lower line spacer 151 is illustrated as including three sub-lower spacers, embodiments are not limited to this case. The lower line spacer 151 may also include two sub-lower spacers or four or more sub-lower spacers.

Referring to FIG. 13, in a semiconductor device according to embodiments, an upper line spacer 152 may include a first sub-upper spacer 152a and a fifth sub-upper spacer 152e.

The first sub-upper spacer 152a may be, for example, I-shaped. A part of the fifth sub-upper spacer 152e may be disposed between a bit line stack 140 and a bit line mask pattern 155. The fifth sub-upper spacer 152e may extend along sidewalls and an upper surface of a third conductive layer 143.

The fifth sub-upper spacer 152e may extend along a part of each of opposite sidewalls of the bit line mask pattern 155. A part of the bit line mask pattern 155 may protrude above an upper surface of a bit line spacer 150. The fifth sub-upper spacer 152e may include at least one of, for example, silicon oxide, silicon oxycarbide (SiOC), silicon nitride (SiN) silicon oxynitride (SiON), and silicon oxycarbonitride (SiOCN).

Unlike in the drawing, the fifth sub-upper spacer 152e between the third conductive layer 143 and the first sub-upper spacer 152a may include an air gap or a seam pattern.

Figure 14:
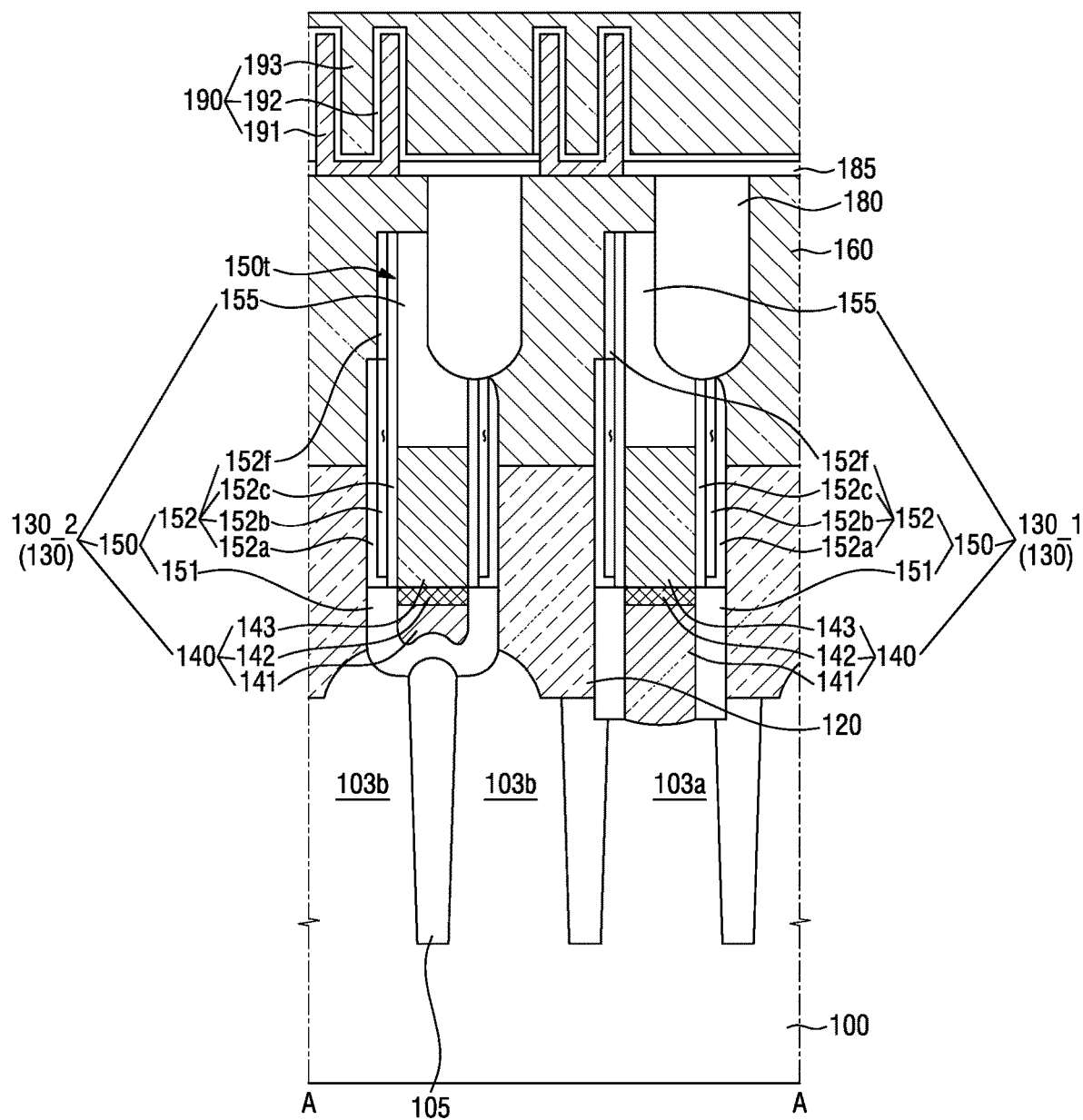
FIGS. 14 through 16 illustrate semiconductor devices according to embodiments according to various embodiments.
Figure 15:
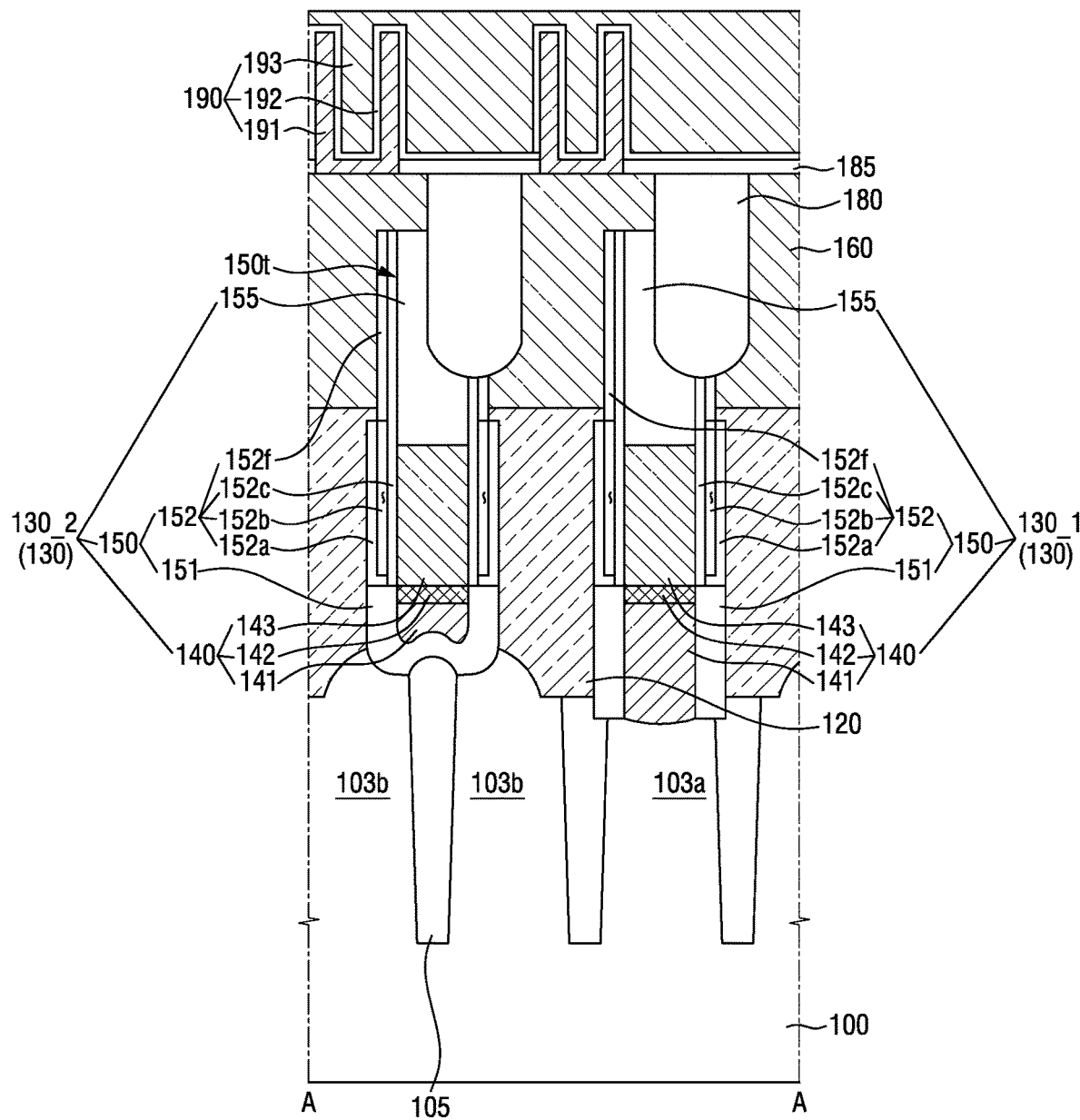
Figure 16:
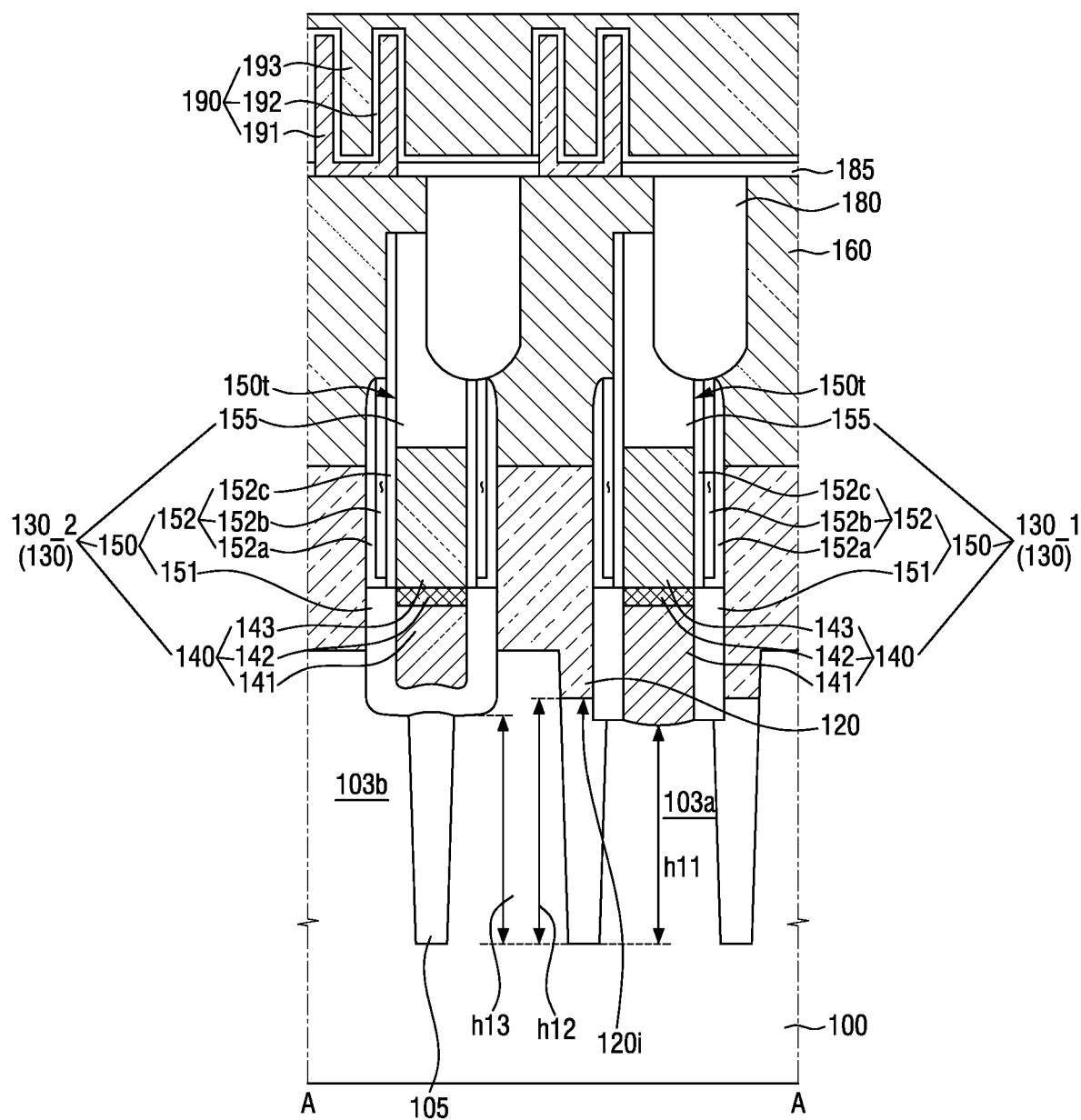
Figure 17A:
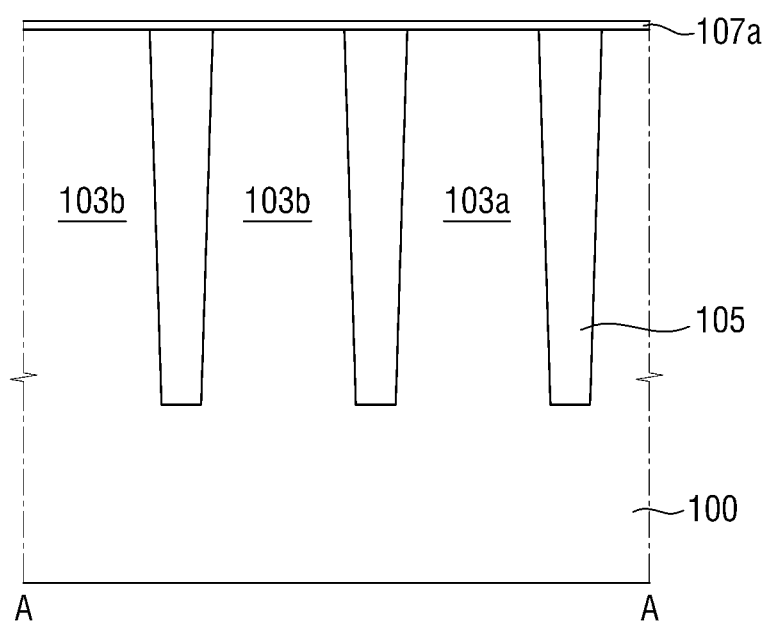
FIGS. 17A through 34C are views illustrating steps of a method of fabricating a semiconductor device according to embodiments.
Figure 17B:
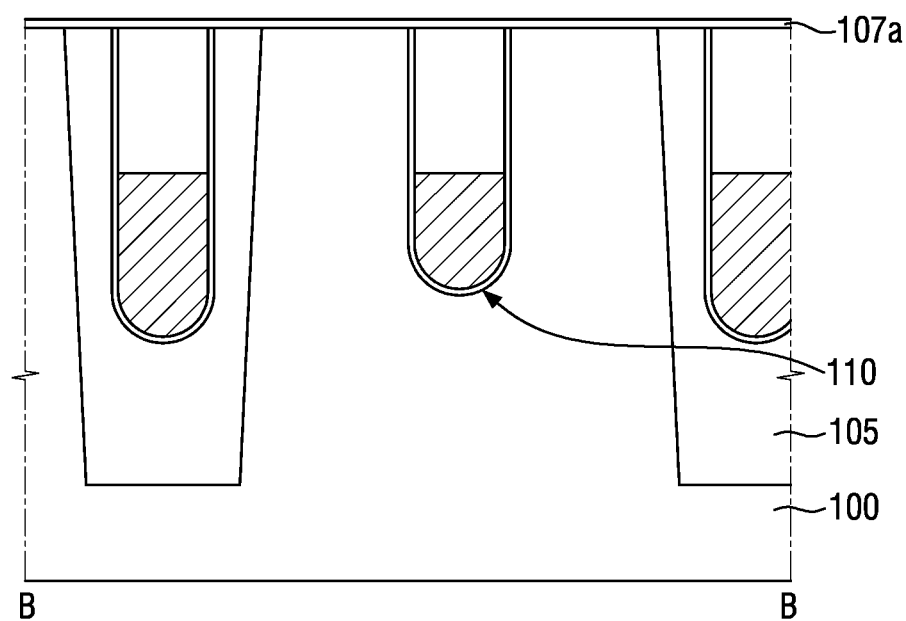
Figure 17C:
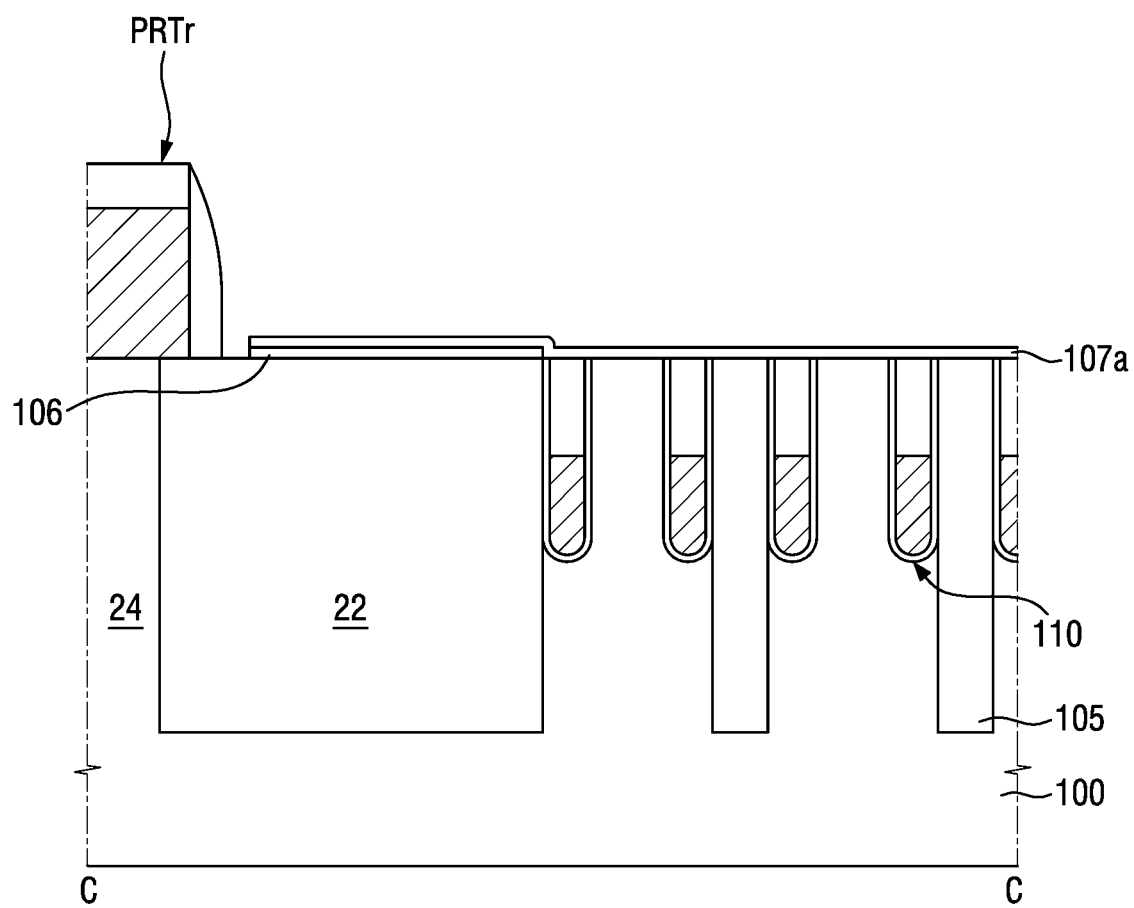

FIGS. 14 through 16 illustrate semiconductor devices according to various embodiments. For ease of description, differences from the embodiments of FIGS. 1 through 6B will be mainly described.

Referring to FIGS. 14 and 15, in semiconductor devices according to embodiments, an upper line spacer 152 may further include a sixth sub-upper spacer 152f.

The sixth sub-upper spacer 152f may be disposed on a second sub-upper spacer 152b. The sixth sub-upper spacer 152f may extend along a part of a third sub-upper spacer 152c. The first sub-upper spacer 152a, the third sub-upper spacer 152c, and the sixth sub-upper spacer 152f may be located around the second sub-upper spacer 152b which is an air spacer.

The sixth sub-upper spacer 152f may include at least one of, for example, silicon oxide, silicon oxycarbide (SiOC), silicon nitride (SiN), silicon oxynitride (SiON), and silicon oxycarbonitride (SiOCN).

In FIG. 14, in a cross-sectional view taken along the first direction D1, since each storage contact 120 extends along a part of the first sub-upper spacer 152a, it does not include a part extending along the sixth sub-upper spacer 152f. For example, each storage contact 120 does not laterally overlap the sixth sub-upper spacer 152f.

In FIG. 15, each storage contact 120 may include a part extending along the sixth sub-upper spacer 152f. For example, each storage contact 120 may laterally overlap the sixth sub-upper spacer 152f. A part of each storage contact 120 may be disposed on an upper surface of the first sub-upper spacer 152a. A part of each storage contact 120 disposed higher than a lower surface of the third conductive layer 143 may be, for example, T-shaped.

Referring to FIG. 16, in a semiconductor device according to embodiments, a height h12 of a lowest part of each storage contact 120 from a bottom surface of a device isolation layer 105 may be greater than a height h13 of a lowest part of a bit line pass part 130_2. In addition, the height h12 of the lowest part of each storage contact 120 from the bottom surface of the device isolation layer 105 may be greater than a height h11 of a lowest part of a bit line contact part 130_1.

Each storage contact 120 may not extend into a storage connection region 103b. A boundary surface 120i between the storage connection region 103b and each storage contact 120 may have the outline OL of the storage connection region 103b of FIG. 4B.

FIGS. 17A through 34C are views illustrating steps of a method of fabricating a semiconductor device according to embodiments.

Referring to FIGS. 1, 2, and 17A through 17C, a device isolation layer 105 may be formed in a cell region 20 to define active regions ACT extending in the third direction D3. A plurality of gate structures 110 extending in the first direction D1 may be formed in a substrate 100 and the device isolation layer 105.

Next, a pre-cell buffer insulating layer 107a may be formed on a peripheral buffer insulating layer 106 which exposes the cell region 20. The pre-cell buffer insulating layer 107a may be formed on the entire surface of the substrate 100. The peripheral buffer insulating layer 106 and the pre-cell buffer insulating layer 107a are patterned to expose a peripheral region 24. A peri-transistor PRTr may be formed on the exposed peripheral region 24. Although the pre-cell buffer insulating layer 107a is illustrated as a single layer, embodiments are not limited to this case.

Figure 18A:
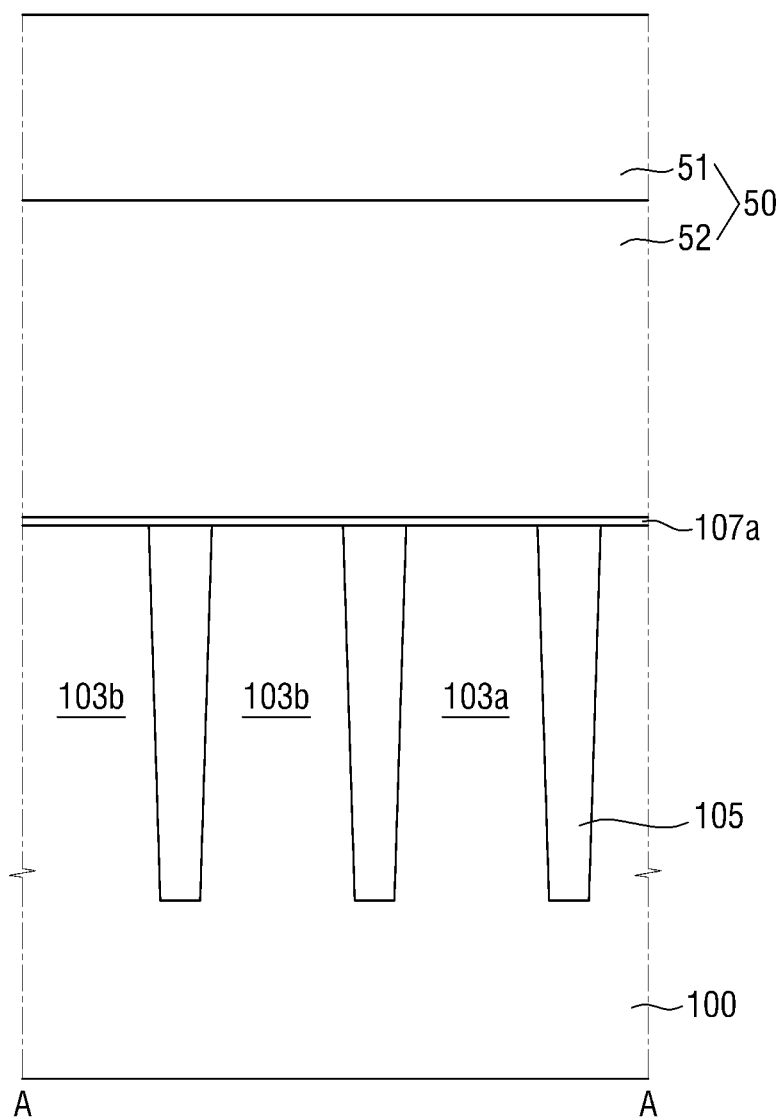
Figure 18B:
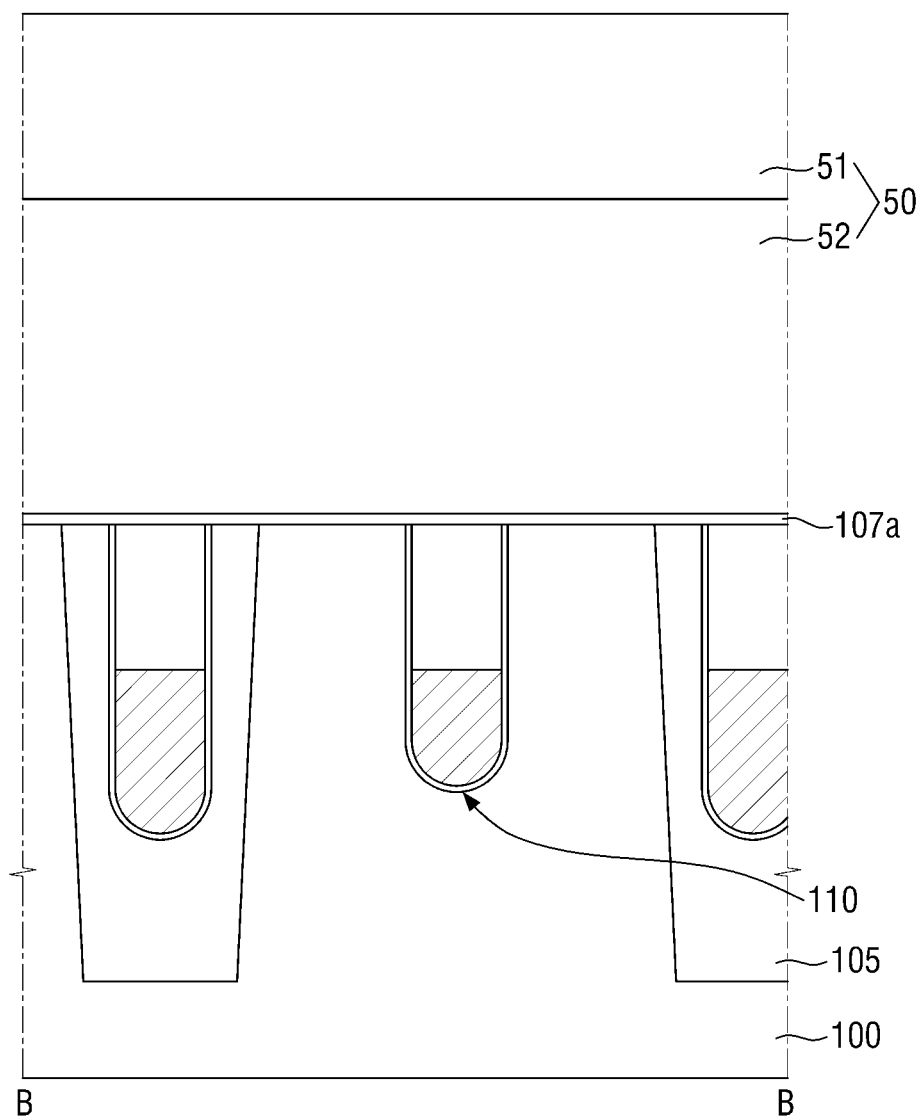
Figure 18C:
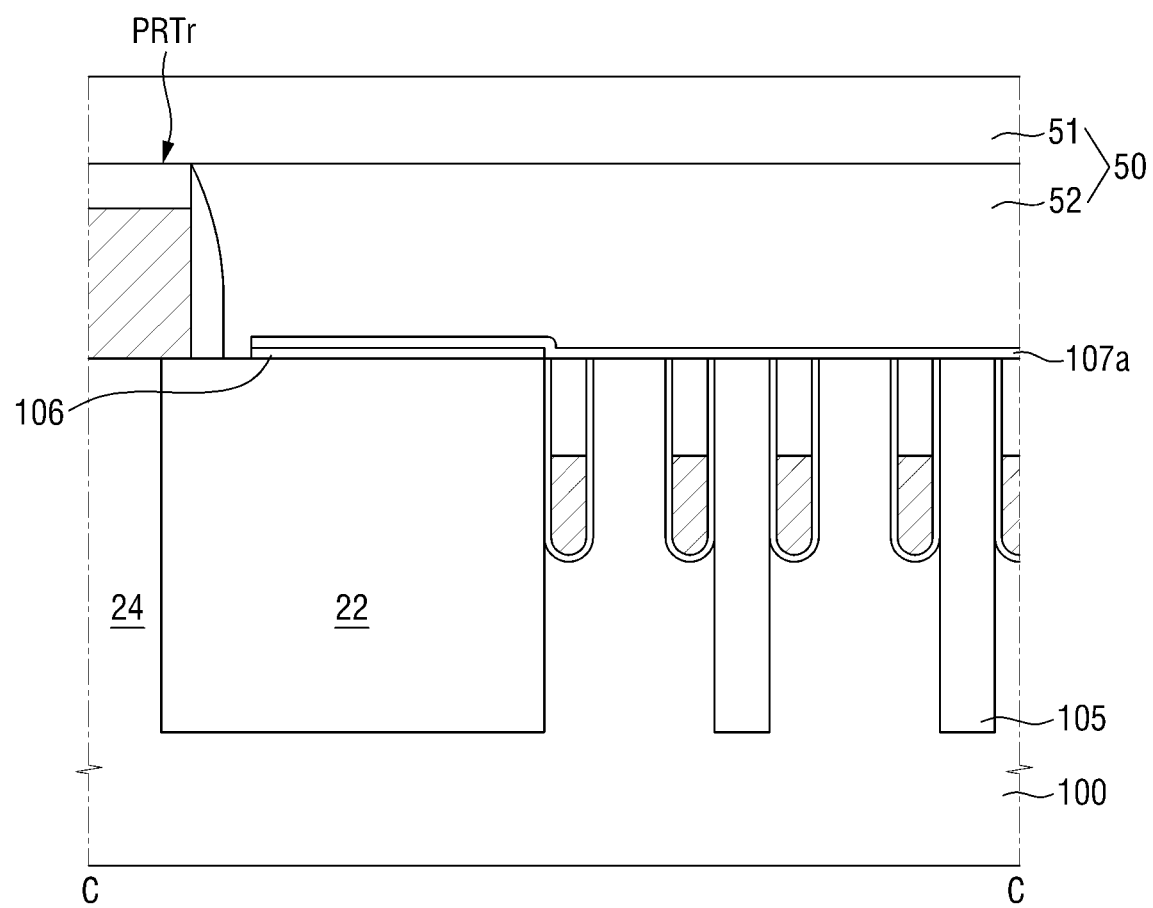

Referring to FIGS. 18A through 18C, a peri-insulating layer 50 may be formed on the substrate 100. The peri-insulating layer 50 may be formed on the entire surface of the substrate 100. The peri-insulating layer 50 may cover the peri-transistor PRTr.

The peri-insulating layer 50 may include a lower peri-insulating layer 52 and an upper peri-insulating layer 51. After the lower peri-insulating layer 52 is formed on the substrate 100, an upper surface of the lower peri-insulating layer 52 may be planarized through a planarization process. Then, the upper peri-insulating layer 51 may be formed. Each of the lower peri-insulating layer 52 and the upper peri-insulating layer 51 may include at least one of, for example, silicon oxide, silicon oxycarbide, silicon nitride, silicon oxynitride, and silicon oxycarbonitride. Although the peri-insulating layer 50 is illustrated as including a plurality of layers, embodiments are not limited to this case. The peri-insulating layer 50 may also be a single layer.

Figure 19A:
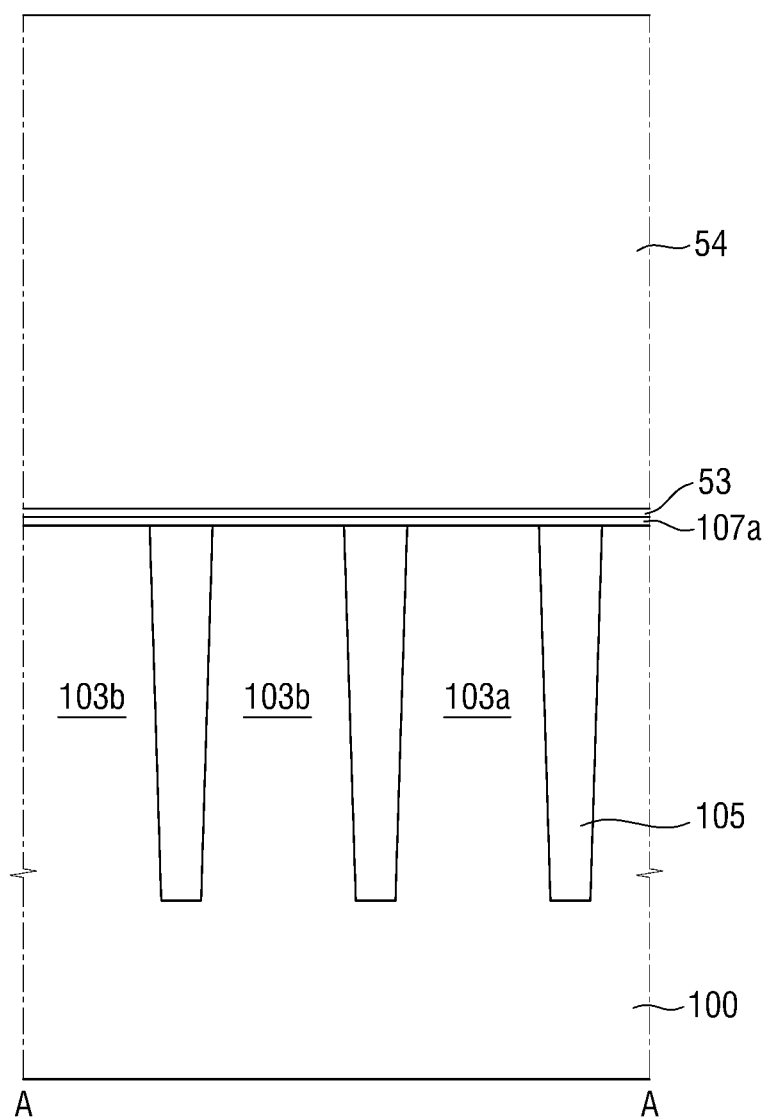
Figure 19B:
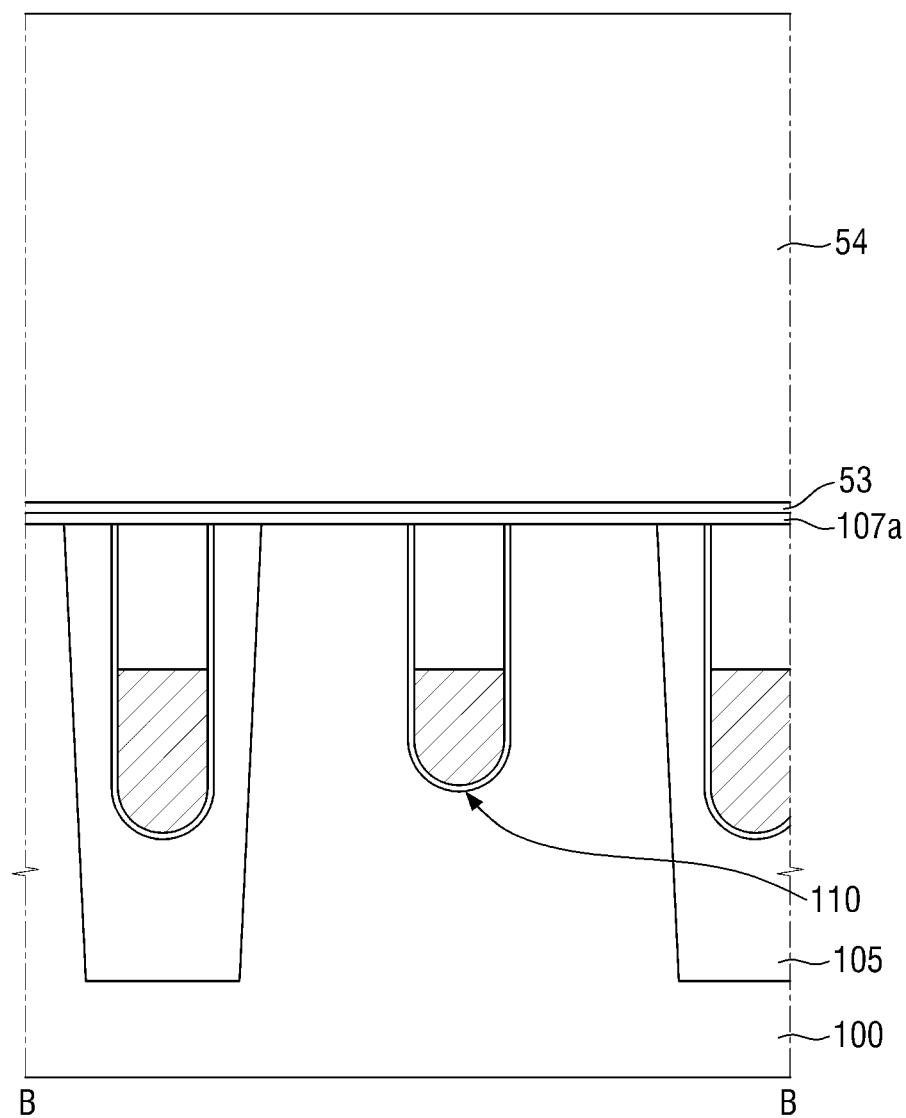
Figure 19C:
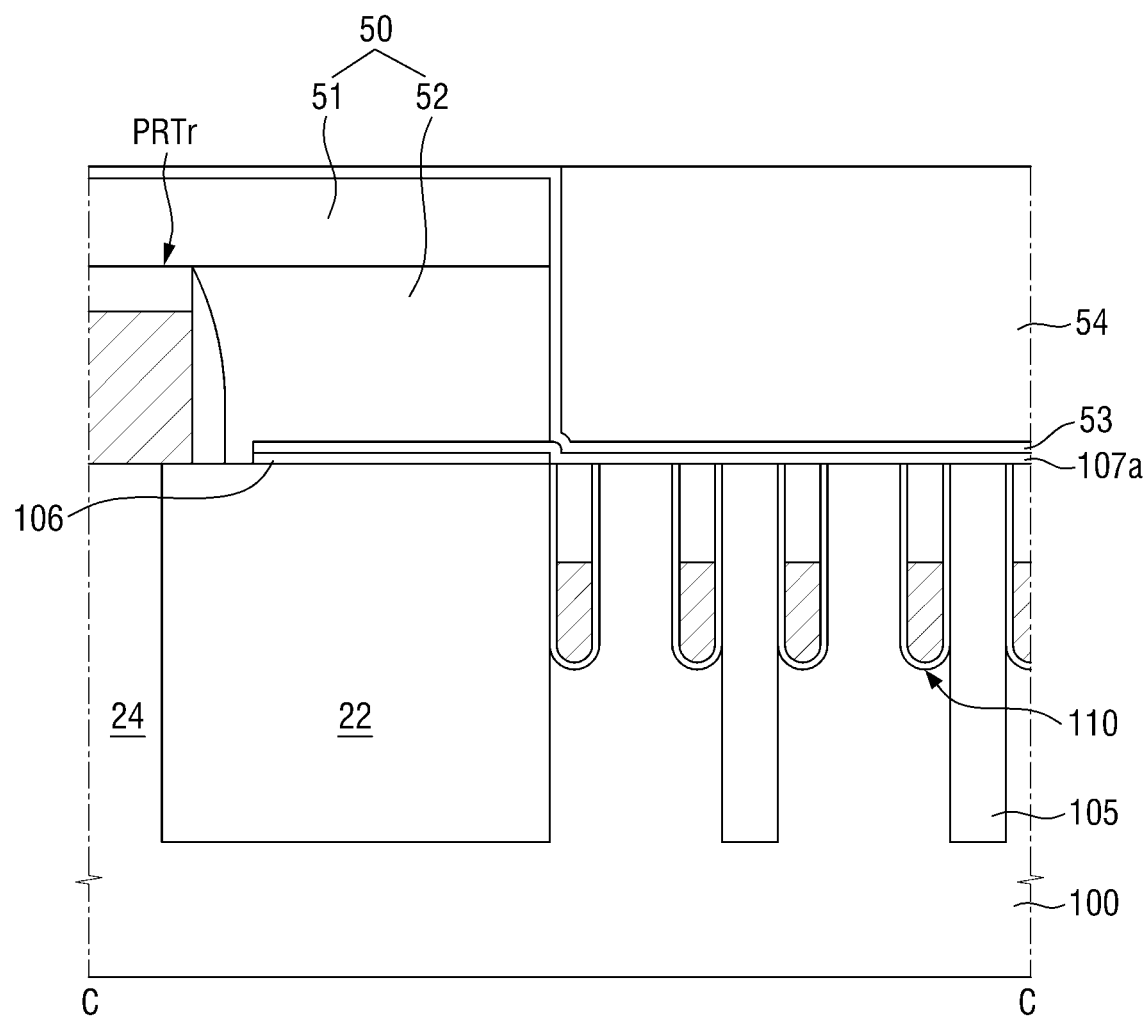

Referring to FIGS. 19A through 19C, the peri-insulating layer 50 on the cell region 20 may be patterned to expose the pre-cell buffer insulating layer 107a on the cell region 20.

Next, a cell etch stop layer 53 may be formed on the substrate 100. The cell etch stop layer 53 may extend along the pre-cell buffer insulating layer 107a on the cell region 20 and sidewalls and an upper surface of the peri-insulating layer 50.

A fence mold layer 54 may be formed on the cell etch stop layer 53. After the fence mold layer 54 is formed on the substrate 100, the cell etch stop layer 53 on an upper surface of the peri-insulating layer 50 may be exposed through a planarization process. Each of the cell etch stop layer 53 and the fence mold layer 54 may include, but is not limited to, at least one of a silicon nitride layer, a silicon oxynitride layer, and a silicon carbonitride layer.

Figure 20A:
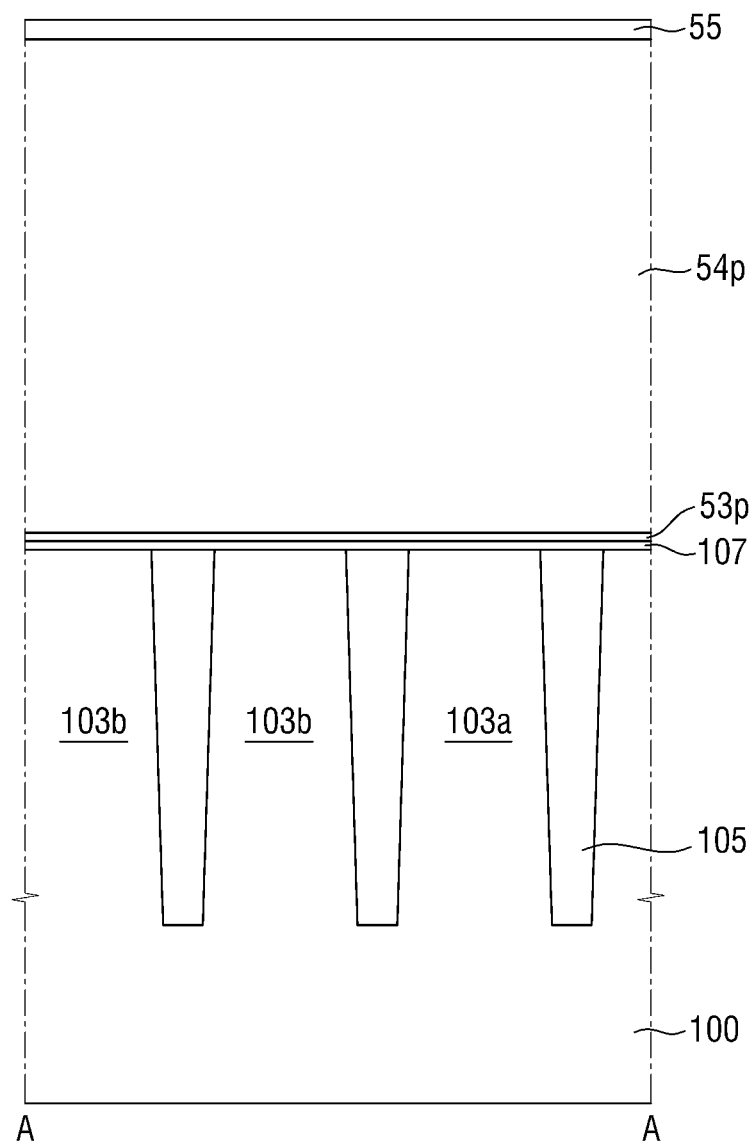
Figure 20B:
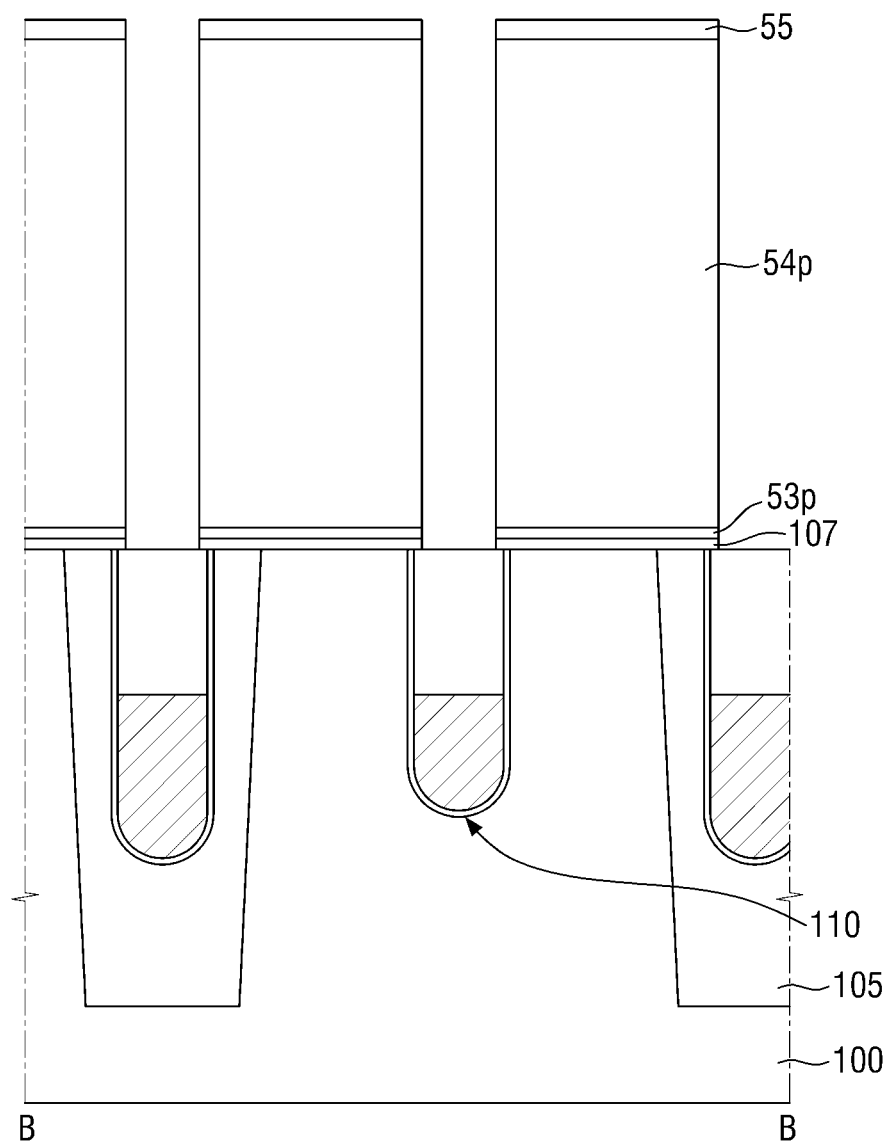
Figure 20C:
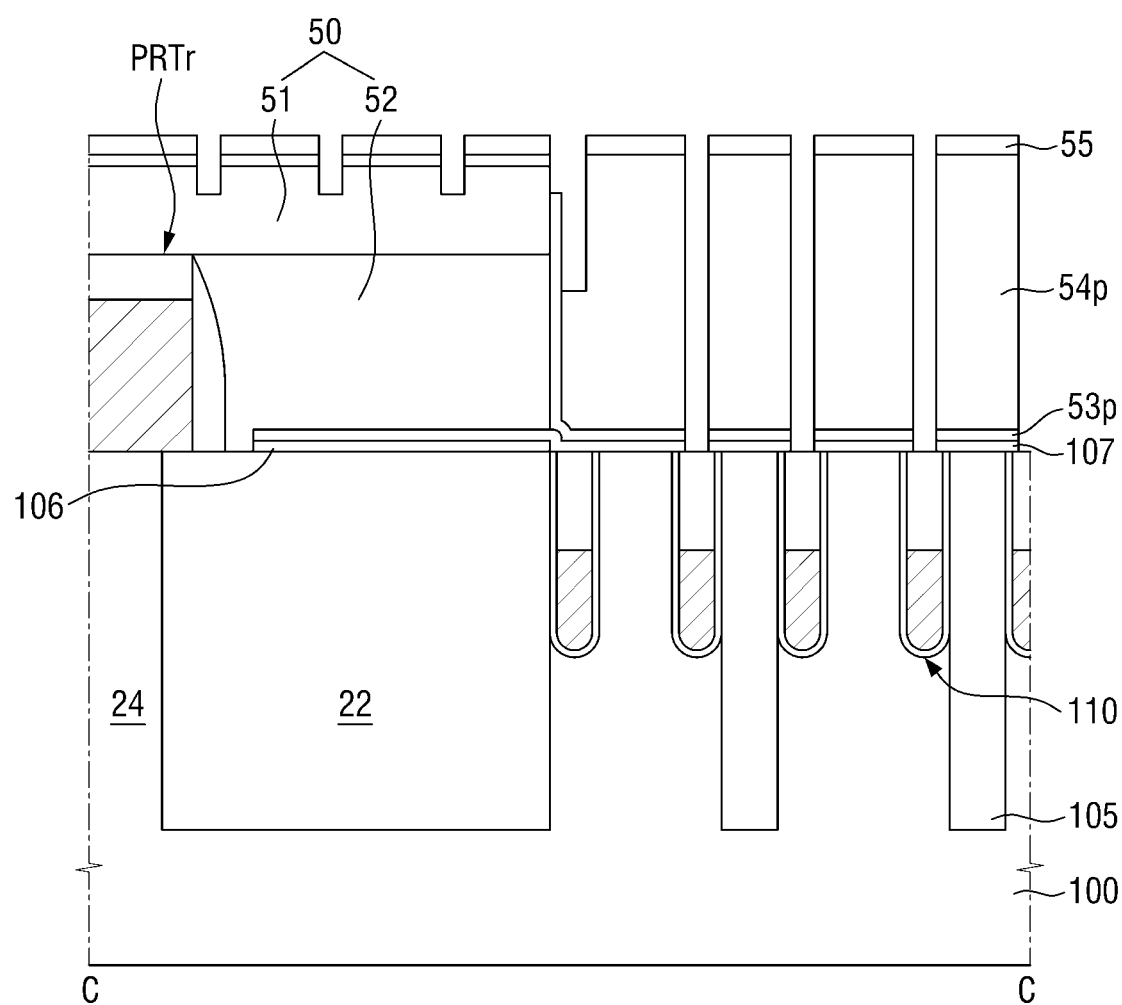

Referring to FIGS. 20A through 20C, first mask patterns 55 may be formed on the fence mold layer 54 and the peri-insulating layer 50. The fence mold layer 54 may be patterned using the first mask patterns 55. Accordingly, fence mold patterns 54p may be formed on the cell region 20. The fence mold patterns 54p may expose upper surfaces of the gate structures 110. While the fence mold layer 54 is patterned, a part of the peri-insulating layer 50 may also be etched. In addition, while the fence mold layer 54 is patterned, the pre-cell buffer insulating layer 107a and the cell etch stop layer 53 may be patterned to form a cell buffer insulating layer 107 and cell etch stop patterns 53p.

Figure 21A:
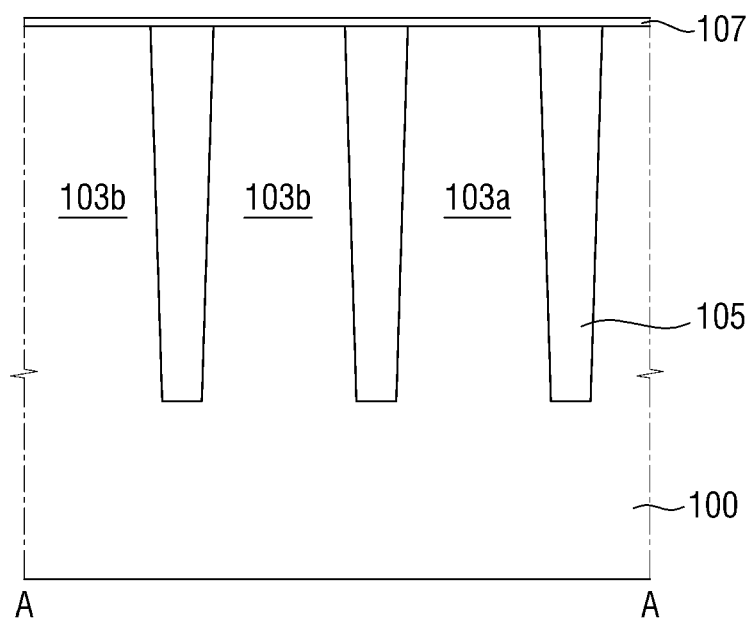
Figure 21B:
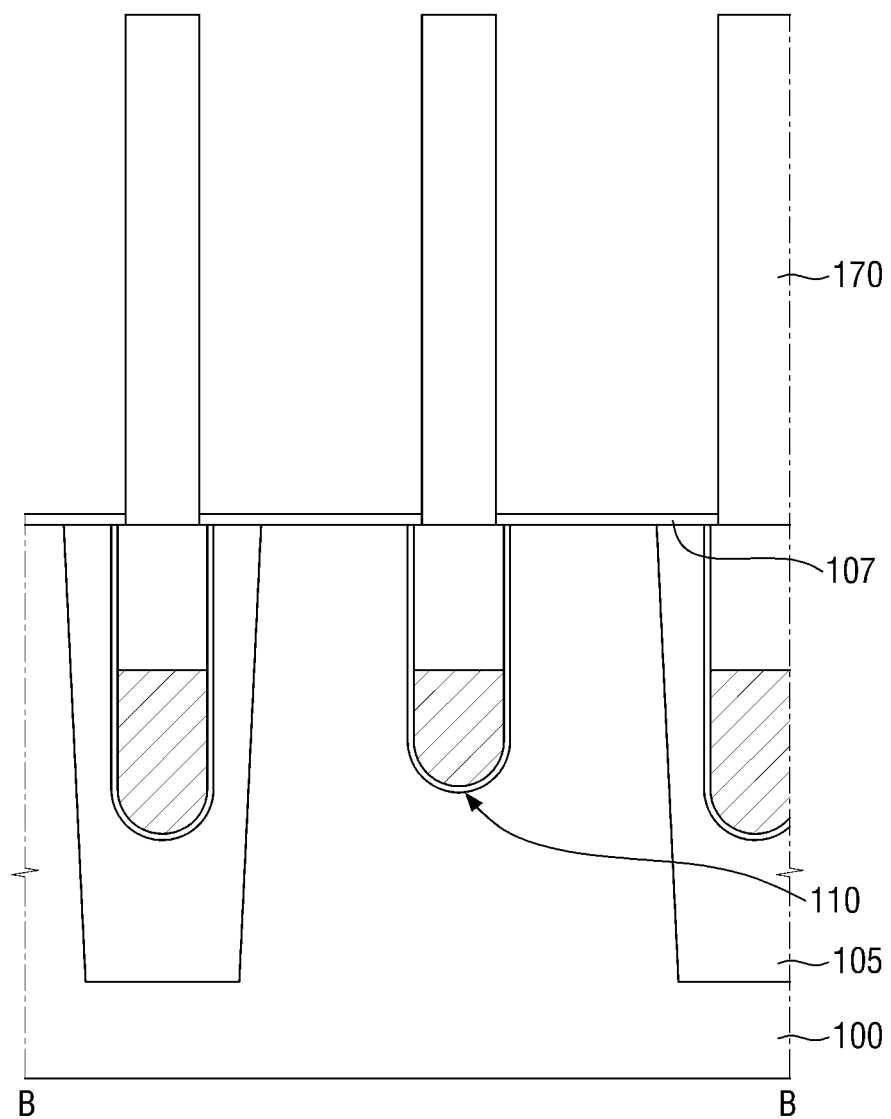
Figure 21C:
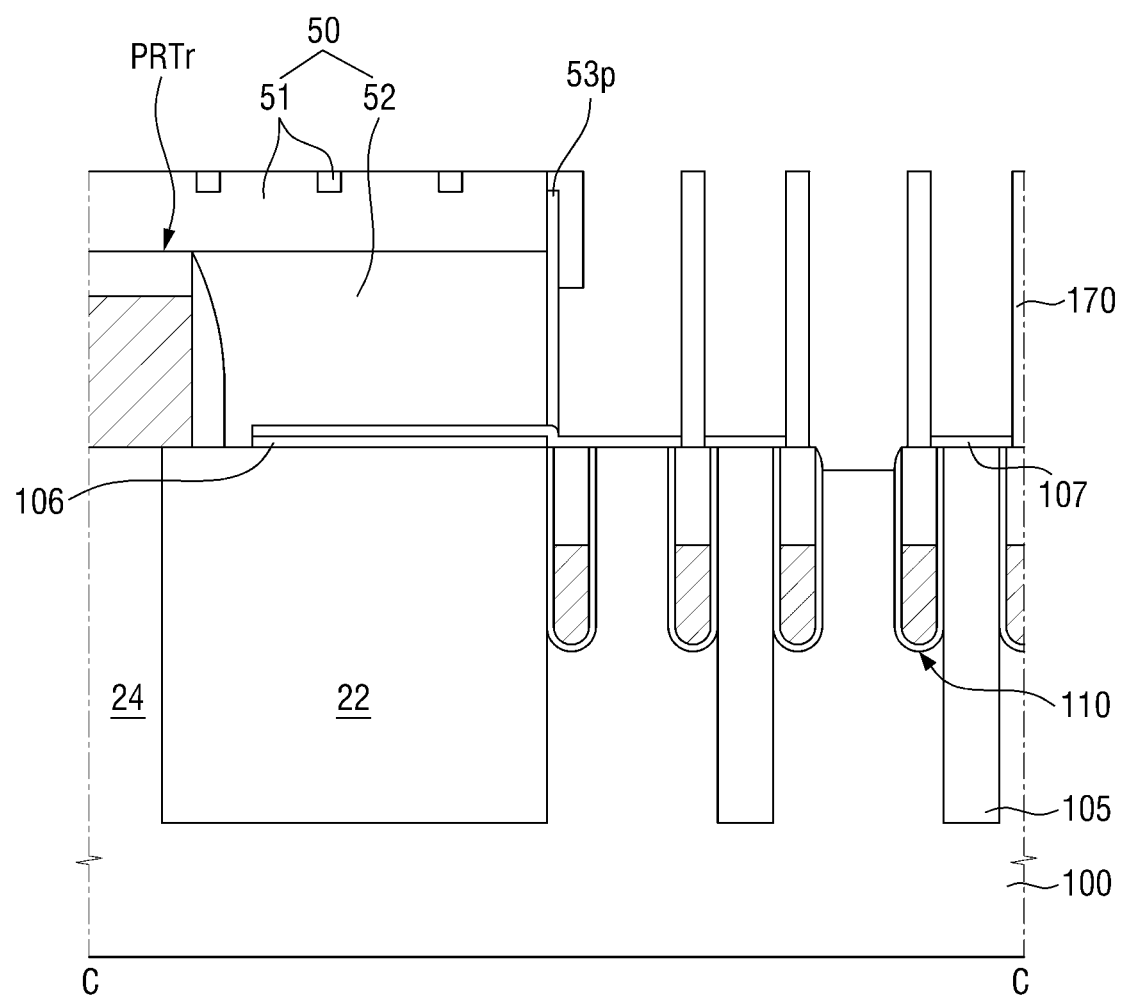

Referring to FIGS. 21A through 21C, fence patterns 170 extending along the gate structures 110 may be formed on the gate structures 110 using the fence mold patterns 54p. Then, the fence mold patterns 54p and the first mask patterns 55 may be removed. In addition, the cell etch stop patterns 53p formed on the cell region 20 may be removed. While the cell etch stop patterns 53p extending along an upper surface of the substrate 100 of the cell region 20 are removed, the cell etch stop patterns 53p formed on the sidewalls of the peri-insulating layer 50 may remain without being removed.

Unlike the case described using FIGS. 19A through 21C, the peri-insulating layer 50 may also be patterned to form the fence patterns 170 on the gate structures 110 such that the fence patterns 170 extend along the gate structures 110.

Referring to FIGS. 22A through 22D, second mask patterns 56 may be formed on the substrate 100. The second mask patterns 56 may cover a cell boundary region 22 and the peripheral region 24. In addition, the second mask patterns 56 may be disposed on the cell region 20 in the form of pillars.

Figure 22A:
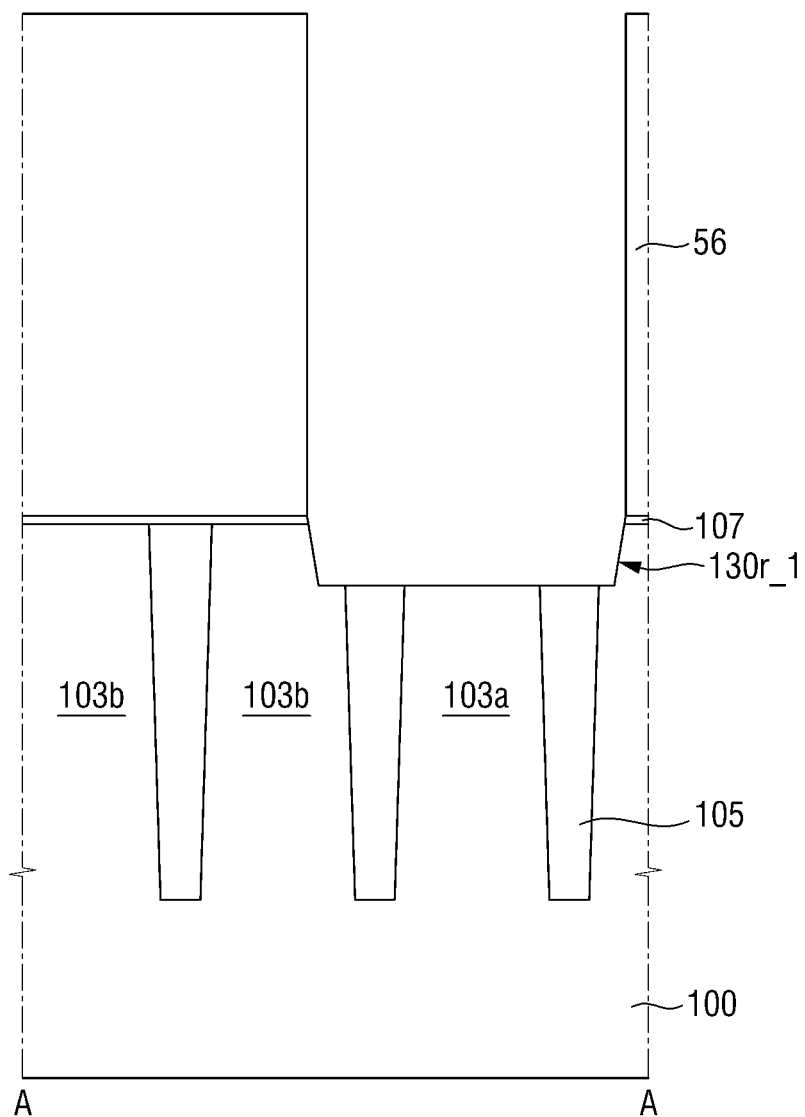
Figure 22B:
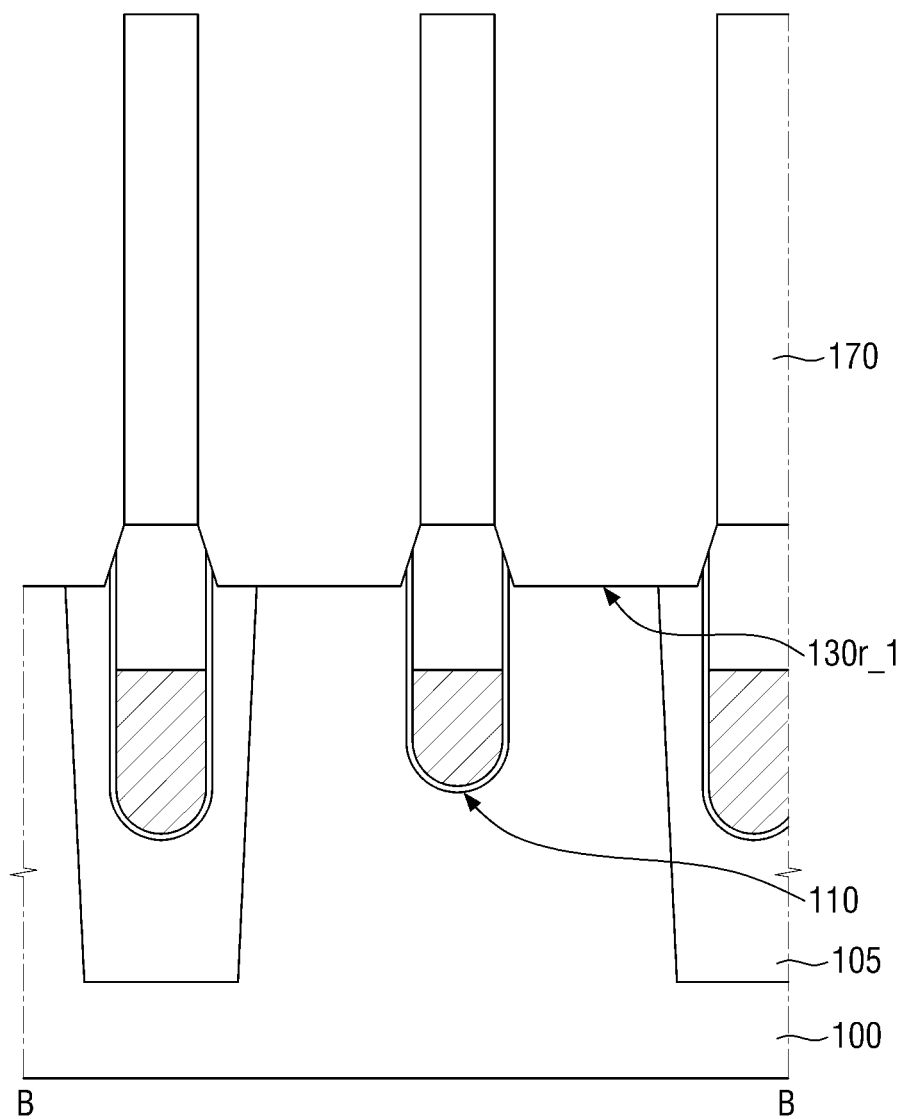
Figure 22C:
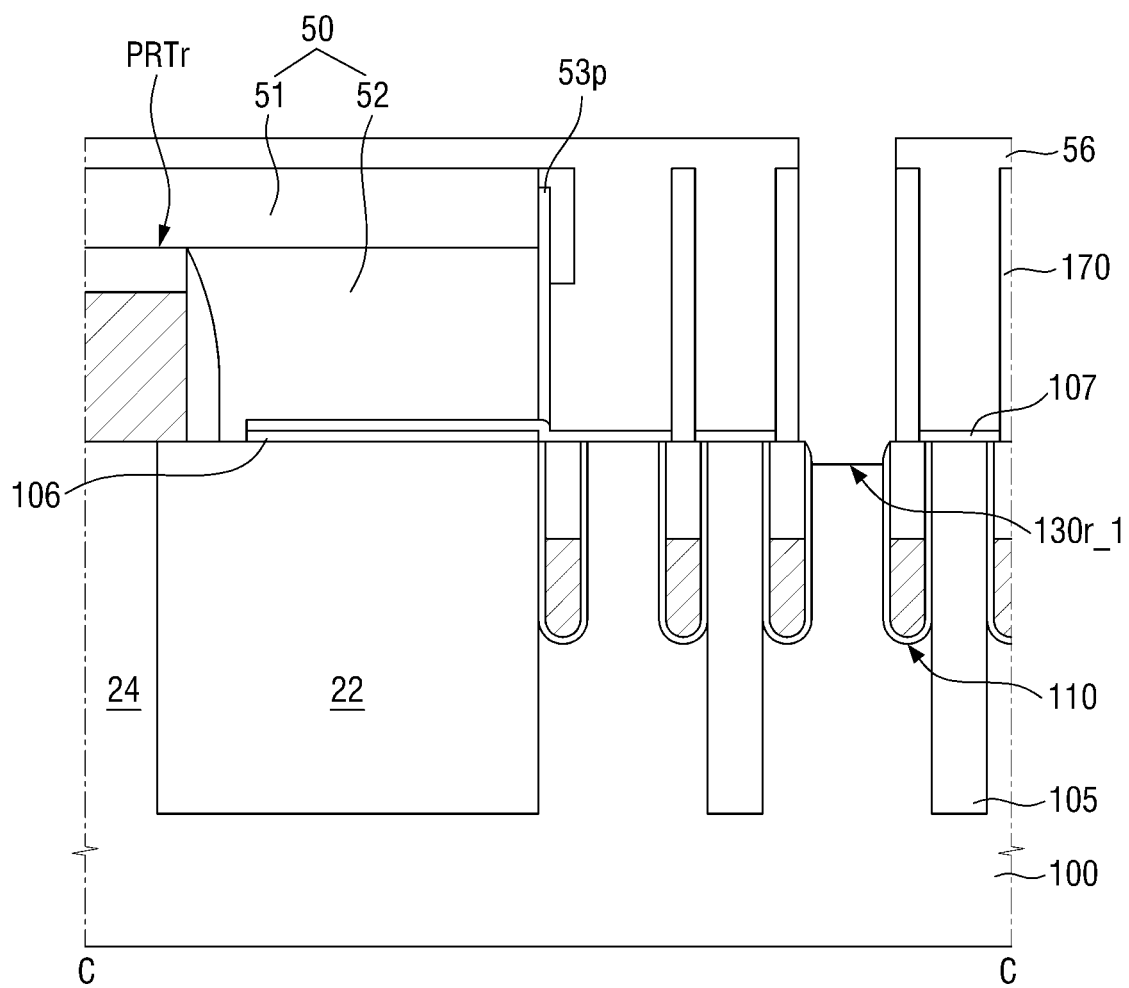
Figure 22D:
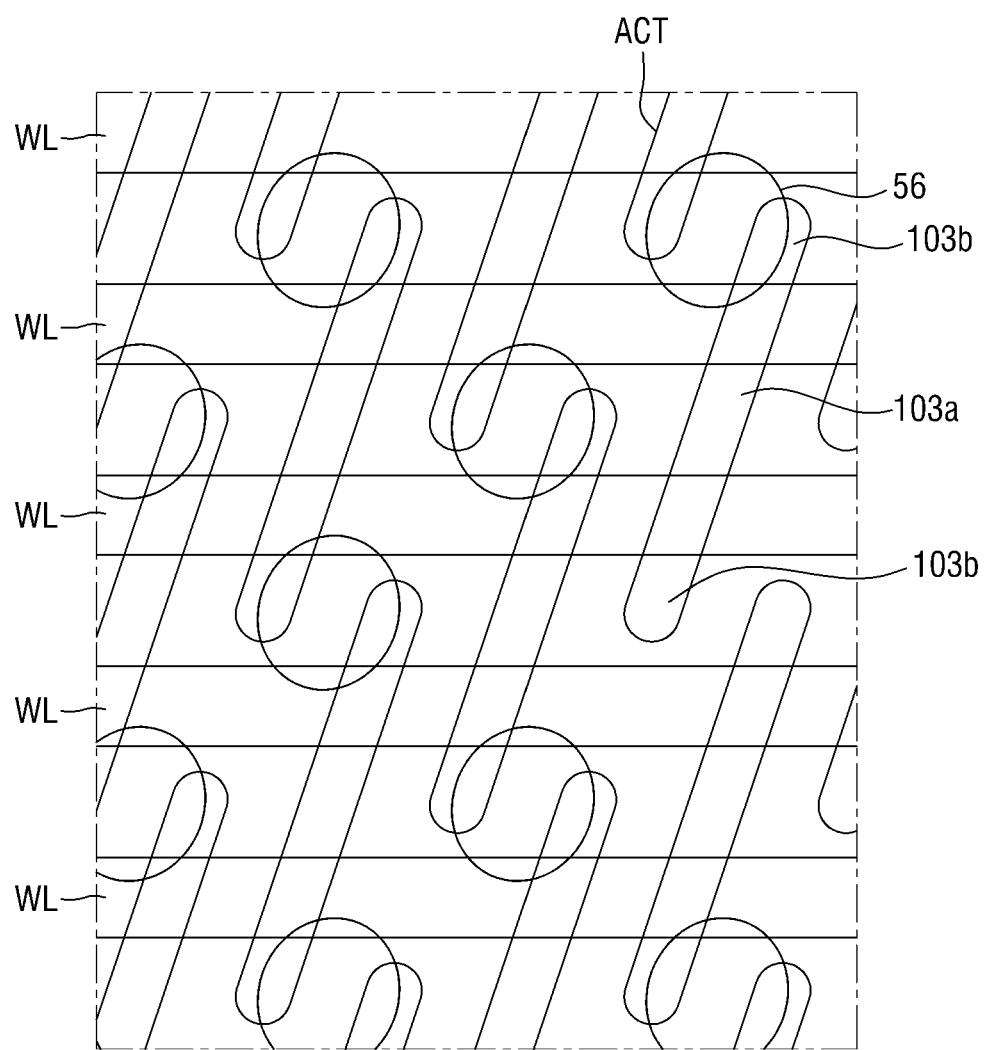

In FIG. 22D, each of the second mask patterns 56 may at least partially cover ends of adjacent active regions ACT at the same time. For example, each of the second mask patterns 56 may at least partially cover adjacent storage connection regions 103b at the same time. The second mask patterns 56 may be, but are not limited to, carbon mask patterns.

A part of the substrate 100 and a part of the device isolation layer 105 are removed using the second mask patterns 56, thereby forming first bit line contact recesses 130r_1. A bottom surface of each of the first bit line contact recesses 130r_1 may be defined by the device isolation layer 105 and the substrate 100.

The second mask patterns 56 may cover one or more gate structures 110 adjacent to the cell boundary region 22. Accordingly, since the substrate 100 between the gate structures 110 adjacent to the cell boundary region 22 is not removed, the first bit line contact recesses 130r_1 may not be formed therein. Unlike the case described above, as illustrated in FIG. 27D, the first bit line contact recesses 130r_1 may also be formed on bit line connection regions 103a using a mask pattern having openings.

Figure 23A:
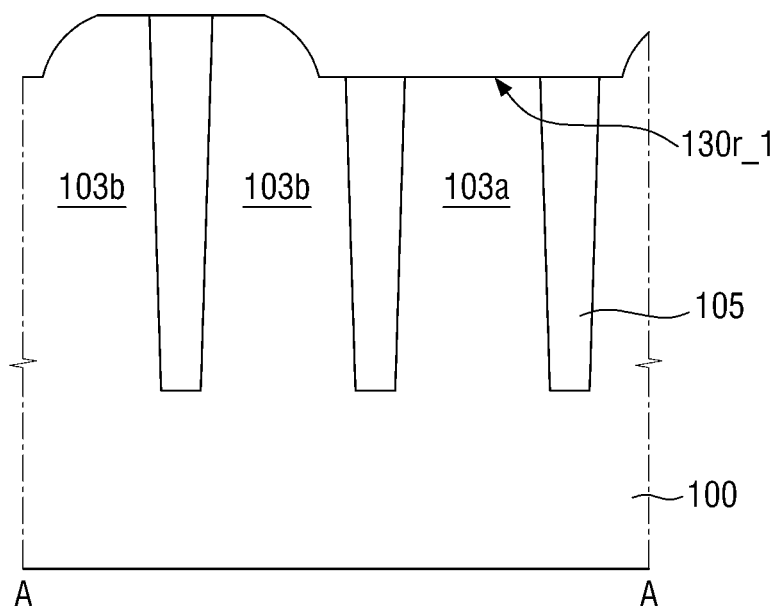
Figure 23B:
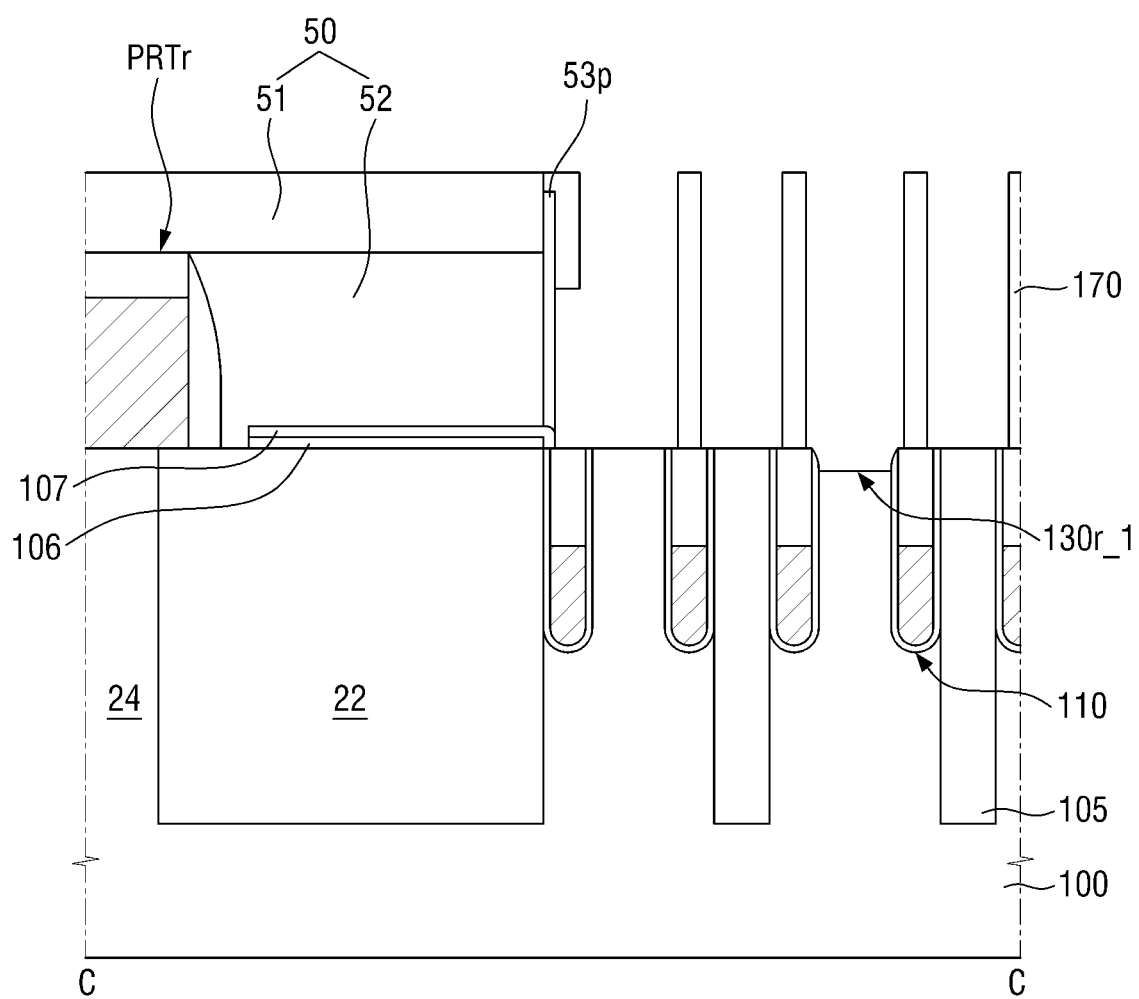

Referring to FIGS. 23A and 23B, the second mask patterns 56 may be removed.

Then, the cell buffer insulating layer 107 on the cell region 20 may be removed. However, the cell buffer insulating layer 107 on the cell boundary region 22 covered by the peri-insulating layer 50 may remain. While the cell buffer insulating layer 107 on the cell region 20 is removed, upper parts of the first bit line contact recesses 130r_1 are rounded. However, embodiments are not limited to this case.

Figure 24A:
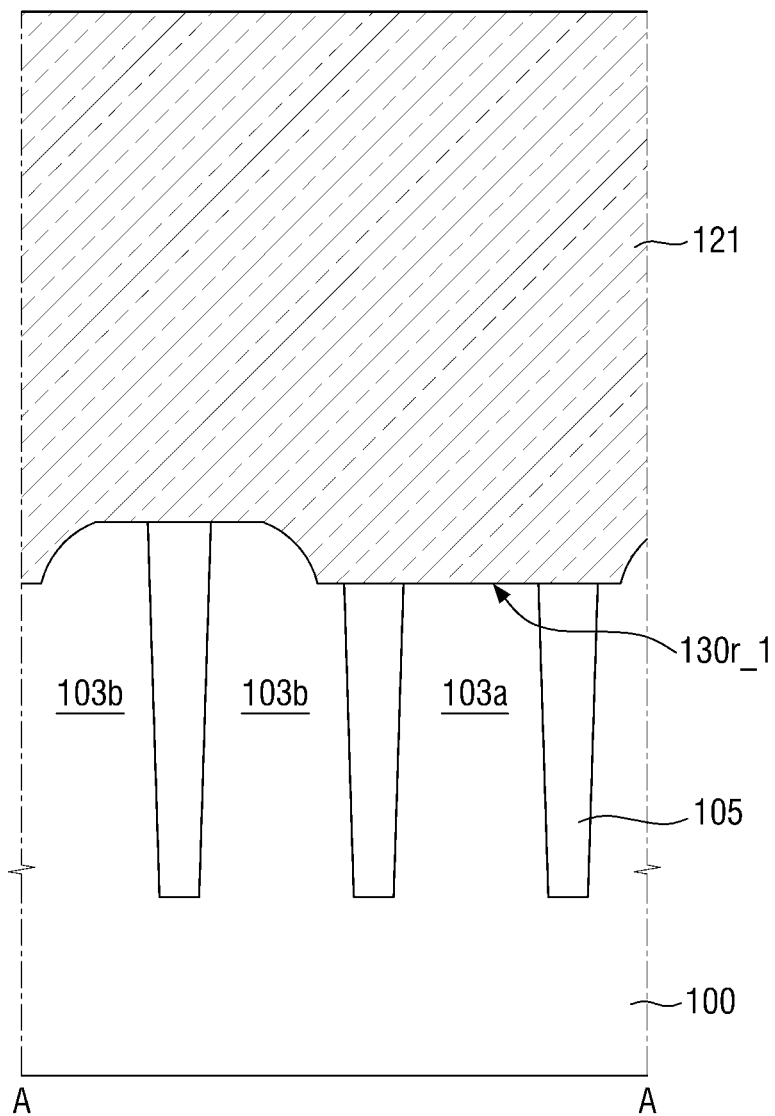
Figure 24B:
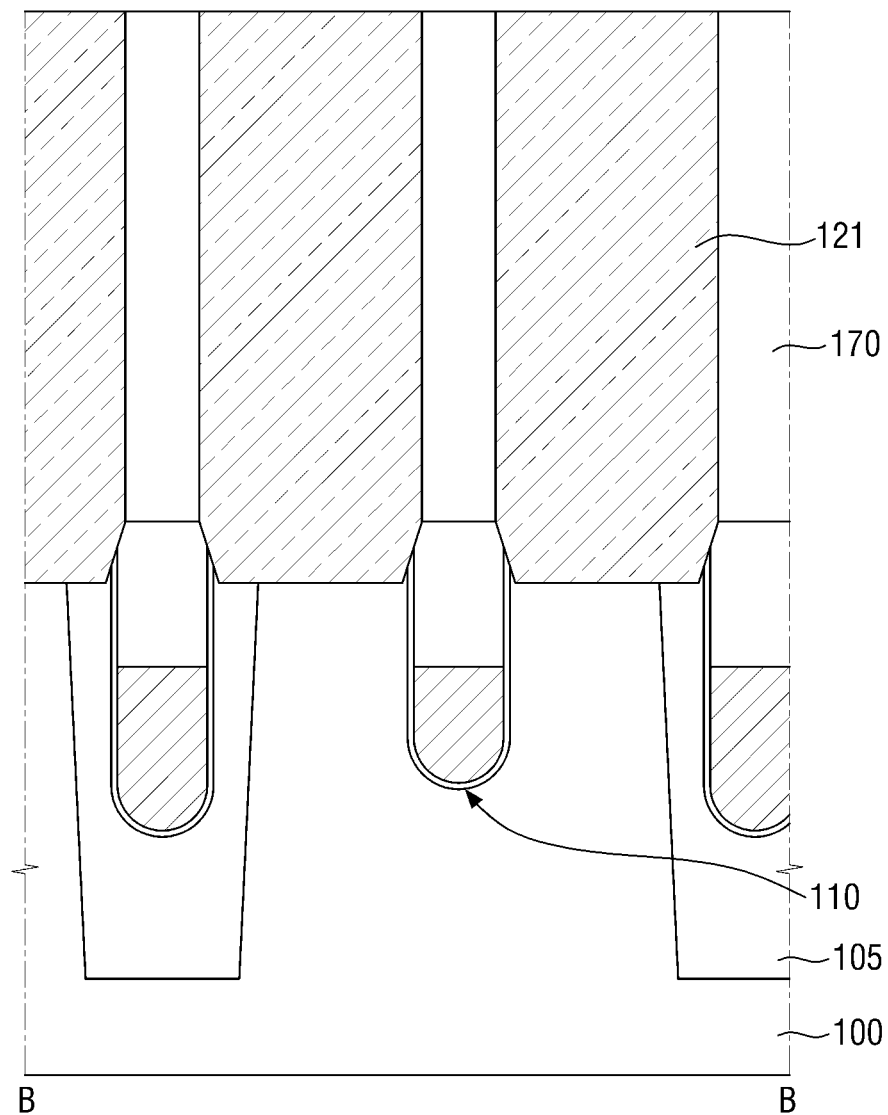
Figure 24C:
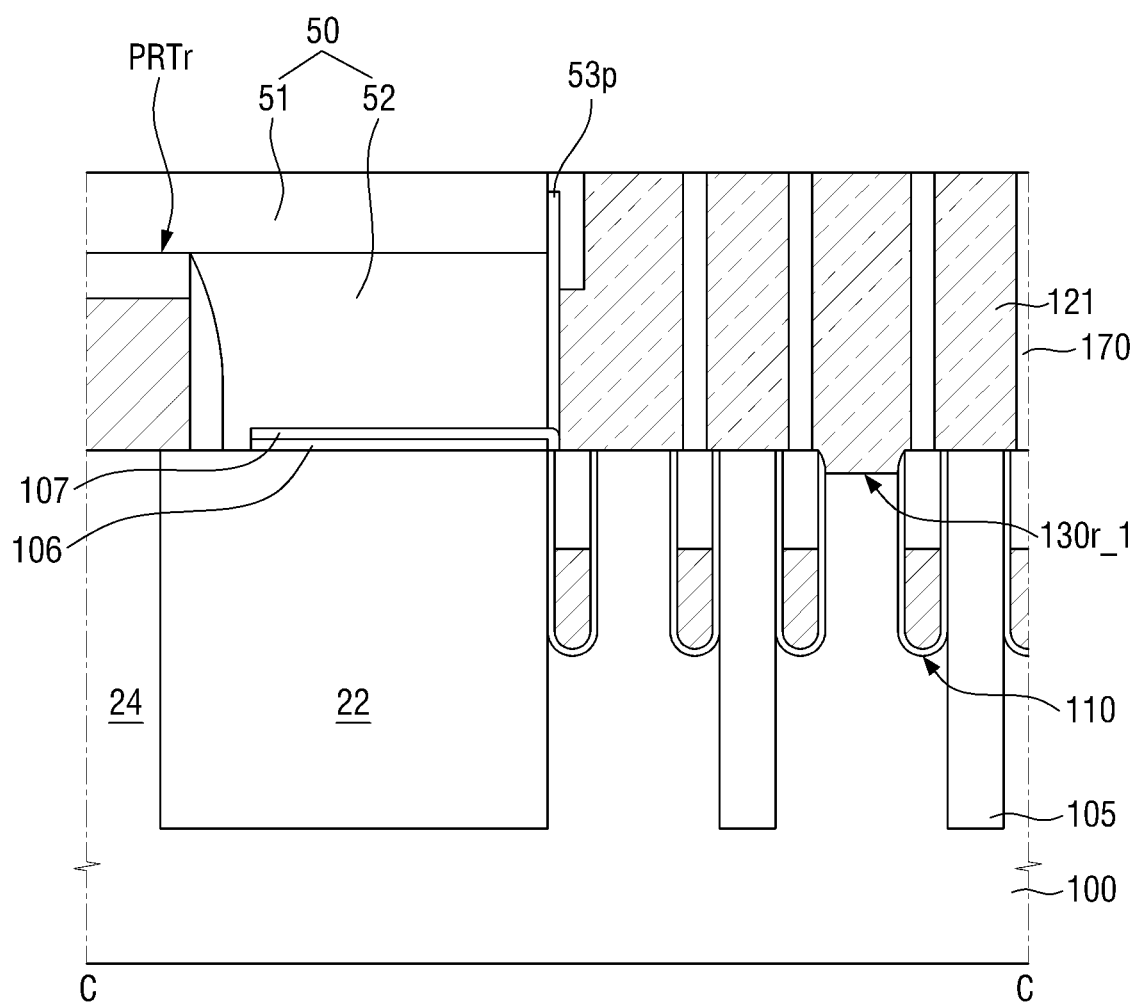

Referring to FIGS. 24A through 24C, a buried contact layer 121 may be formed on the substrate 100. The buried contact layer 121 may fill each space between adjacent fence patterns 170. The buried contact layer 121 may fill the first bit line contact recesses 130r_1.

The buried contact layer 121 is formed to cover the fence patterns 170. Upper surfaces of the fence patterns 170 may be exposed through a planarization process. The buried contact layer 121 may include, for example, polysilicon.

Figure 25A:
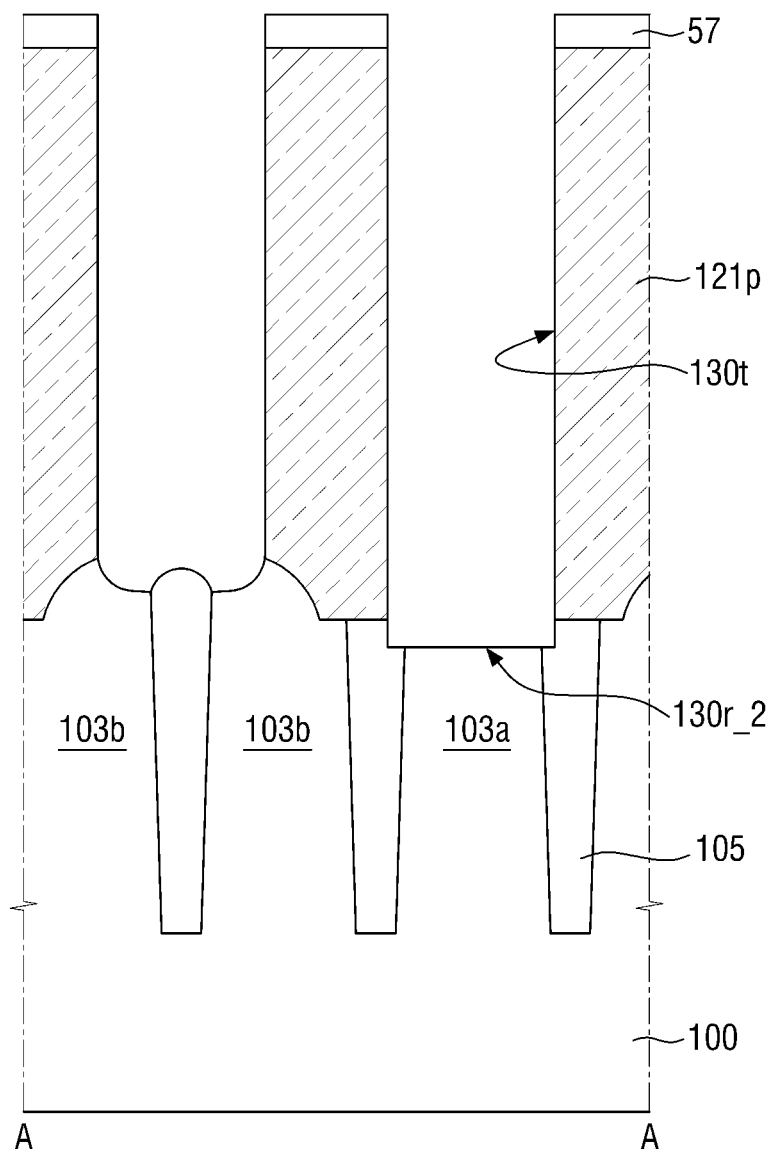
Figure 25B:
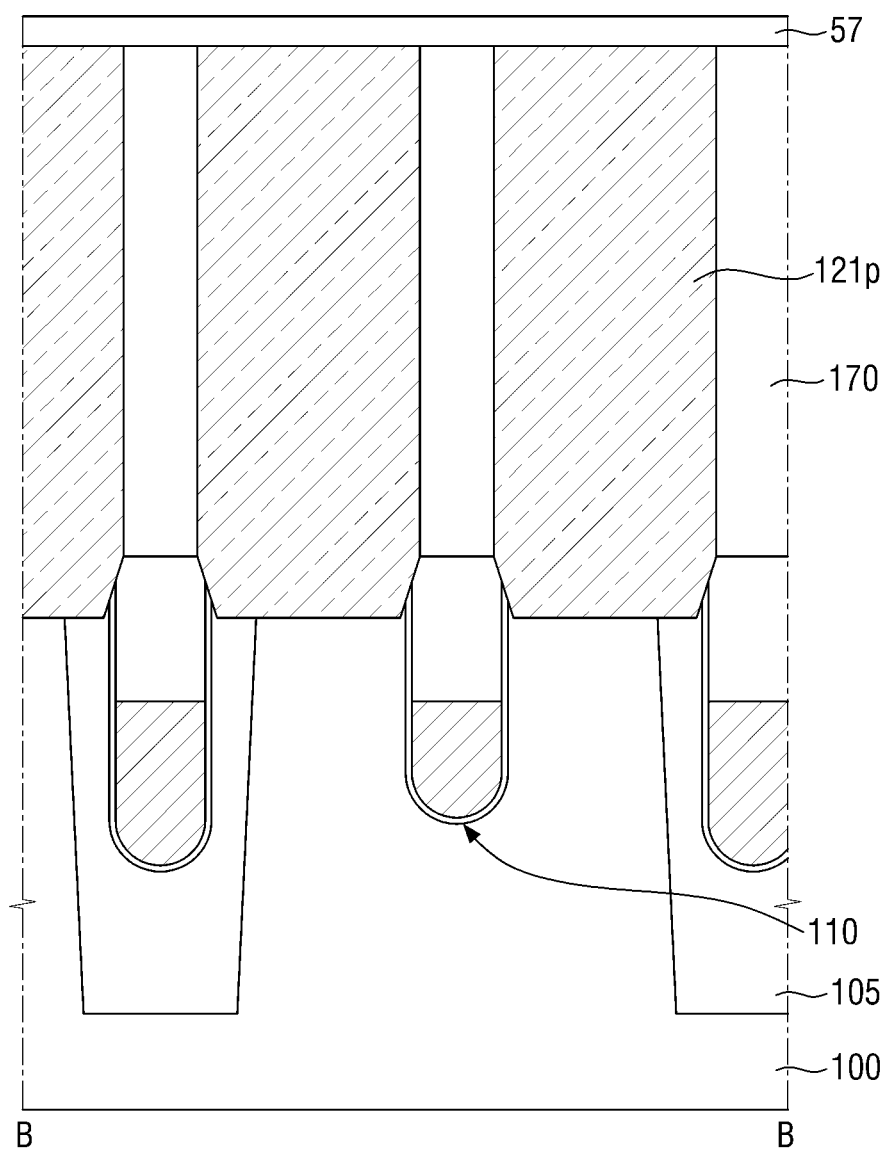
Figure 25C:
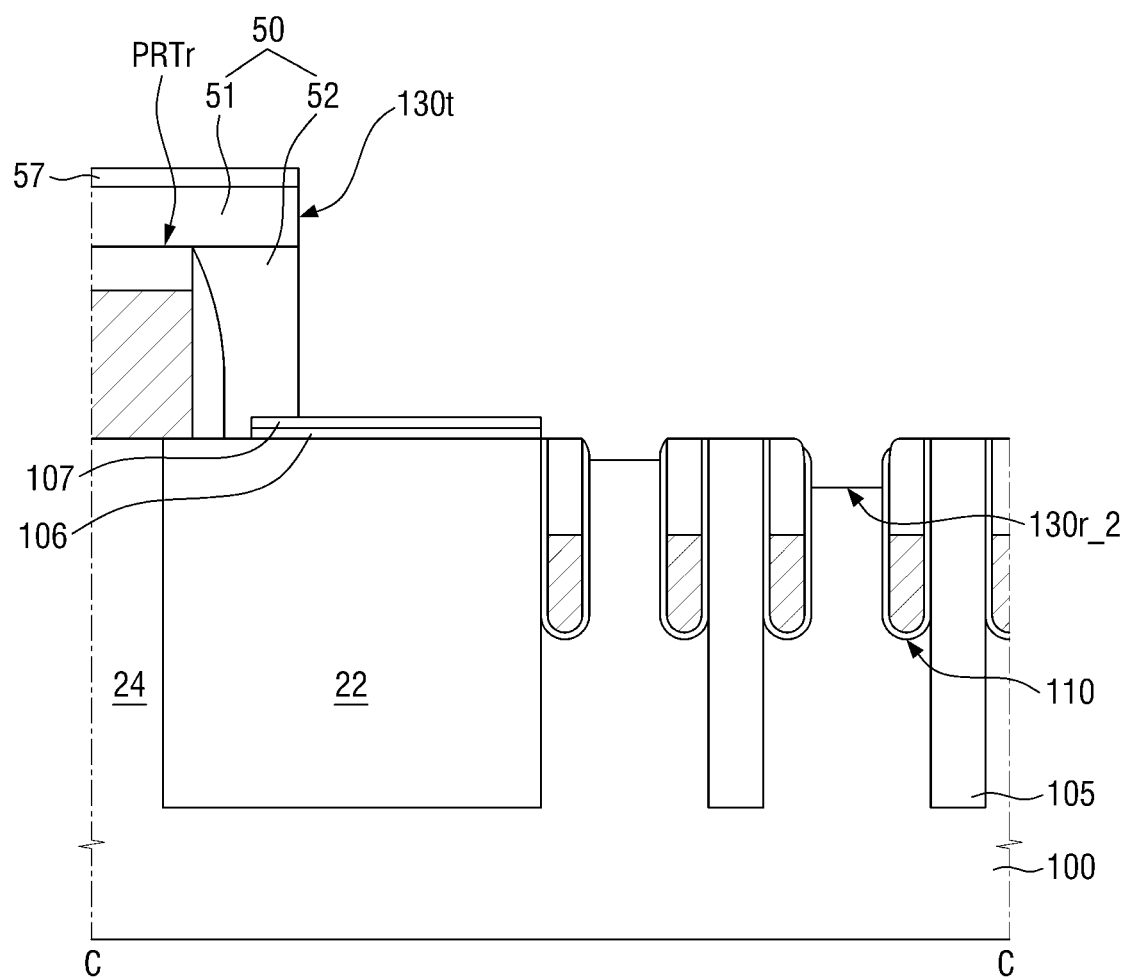

Referring to FIGS. 25A through 25C, third mask patterns 57 may be formed on the substrate 100. The buried contact layer 121 and the fence patterns 170 may be partially removed using the third mask patterns 57 to form line structure trenches 130t extending in the second direction D2. The line structure trenches 130t may intersect the gate structures 110 formed in the substrate 100. The line structure trenches 130t may extend up to a part of the cell boundary region 22. The line structure trenches 130t may pass through the first bit line contact recesses 130r_1. While the line structure trenches 130t are formed, second bit line contact recesses 130r_2 may be formed in the bottom surfaces of the first bit line contact recesses 130r_1. The second bit line contact recess 130r_2 may be formed at positions overlapping the first bit line contact recesses 130r_1. Since the buried contact layer 121 is patterned by the line structure trenches 130t, buried contact patterns 121p may be formed on the substrate 100.

In FIG. 25C, the cell buffer insulating layer 107 and the peripheral buffer insulating layer 106 on the cell boundary region 22 are not removed while the line structure trenches 130t are formed. However, embodiments are not limited to this case. Unlike in the drawing, the cell buffer insulating layer 107 and the peripheral buffer insulating layer 106 on the cell boundary region 22 may be removed while the line structure trenches 130t are formed. In this case, the cell buffer insulating layer 107 and the peripheral buffer insulating layer 106 may be shaped as illustrated in FIG. 6B.

Figure 26A:
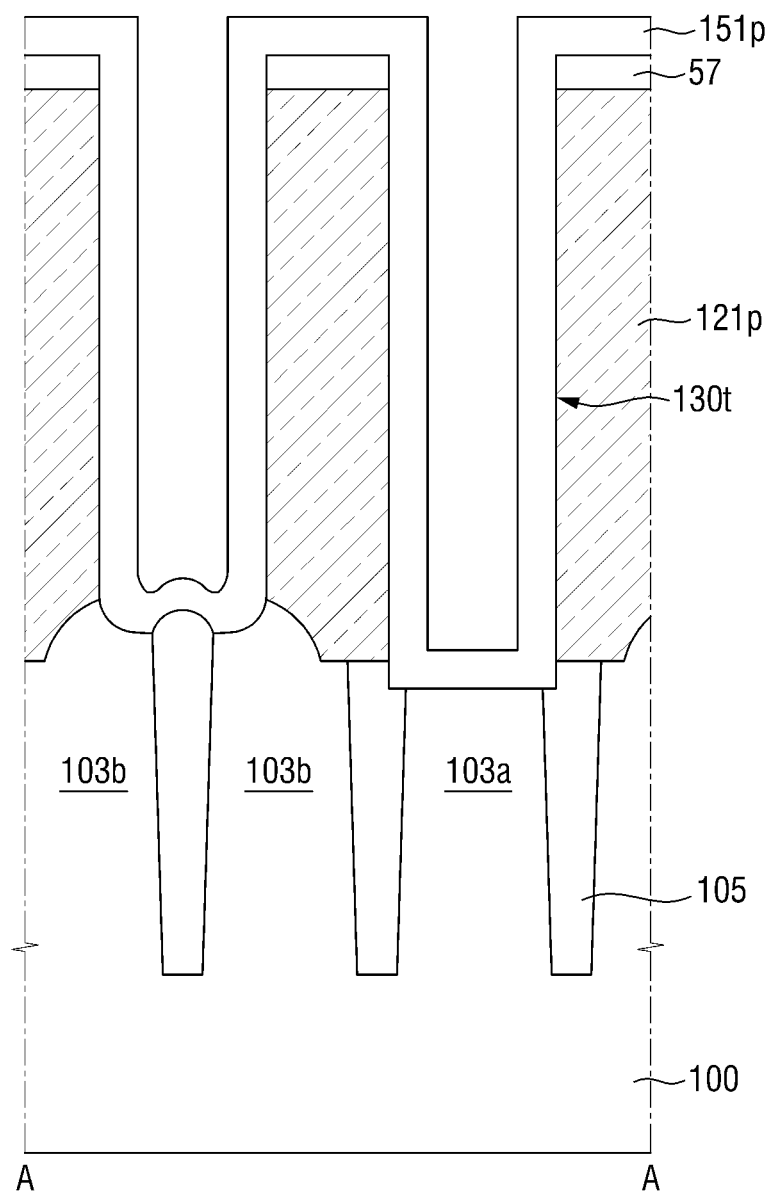
Figure 26B:
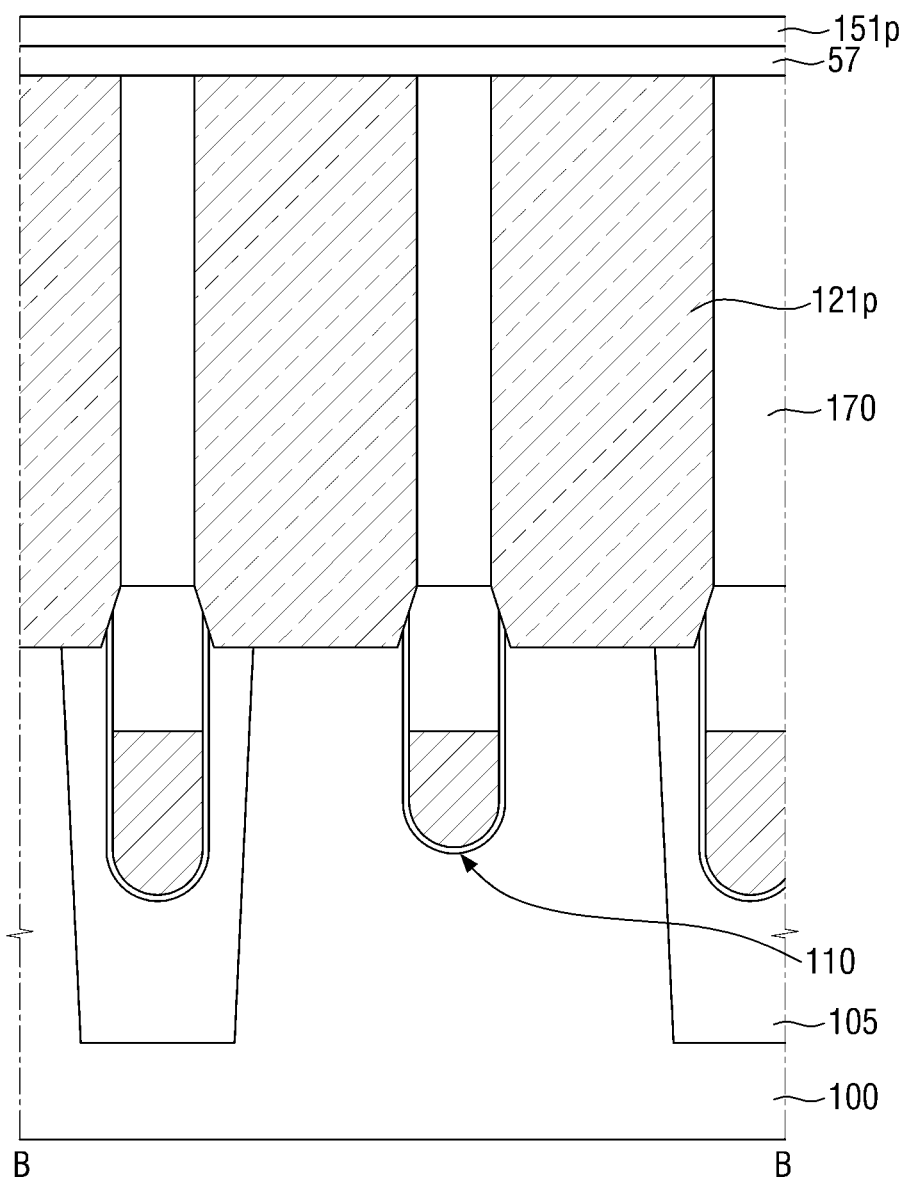
Figure 26C:
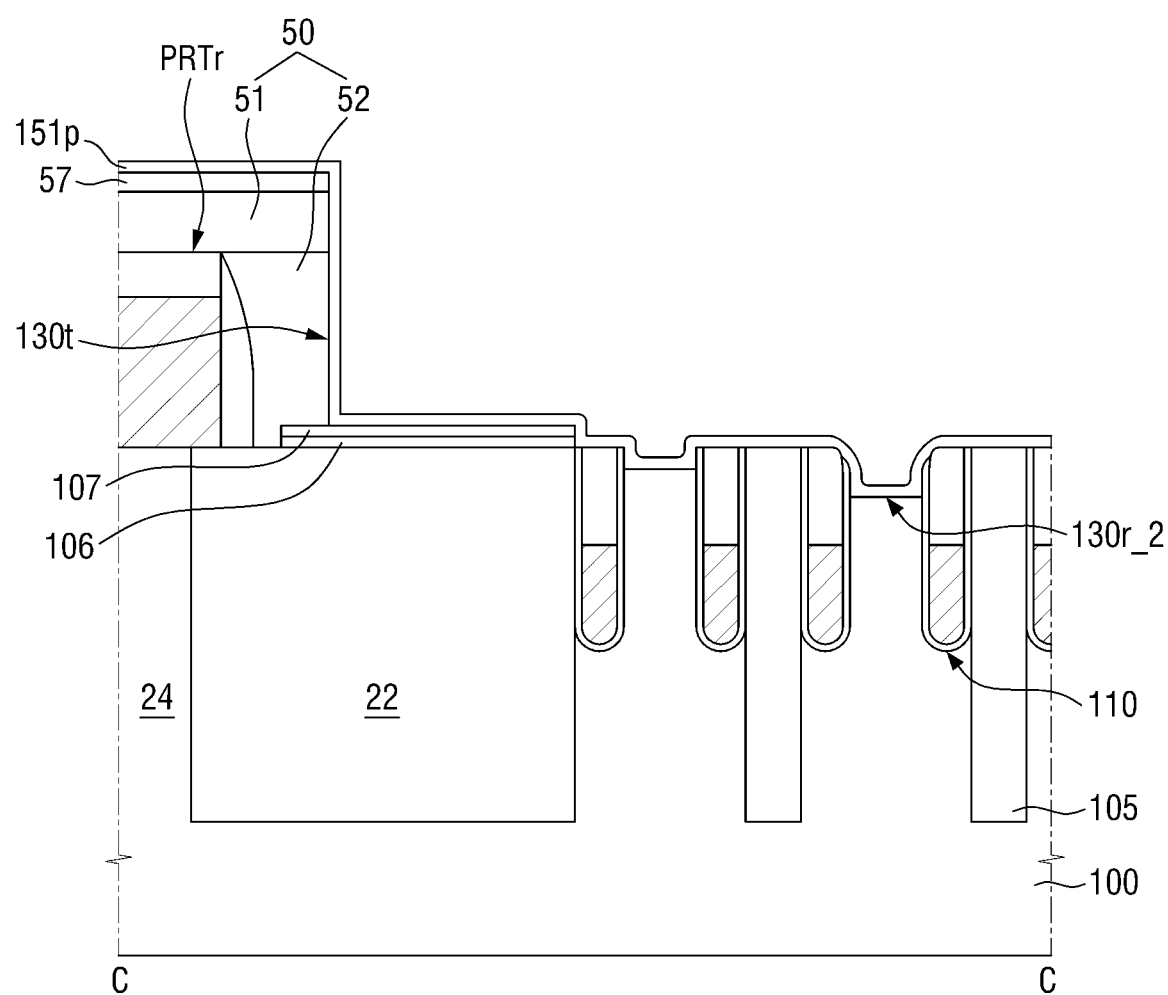

Referring to FIGS. 26A through 26C, a pre-spacer layer 151p may be formed along sidewalls and a bottom surface of each line structure trench 130t. The pre-spacer layer 151p may extend along upper surfaces of the third mask patterns 57.

Referring to FIGS. 27A through 27D, a fourth mask pattern 58 may be formed on the substrate 100. The fourth mask pattern 58 may cover not only the cell boundary region 22 and the peripheral region 24 but also the cell region 20.

Figure 27A:
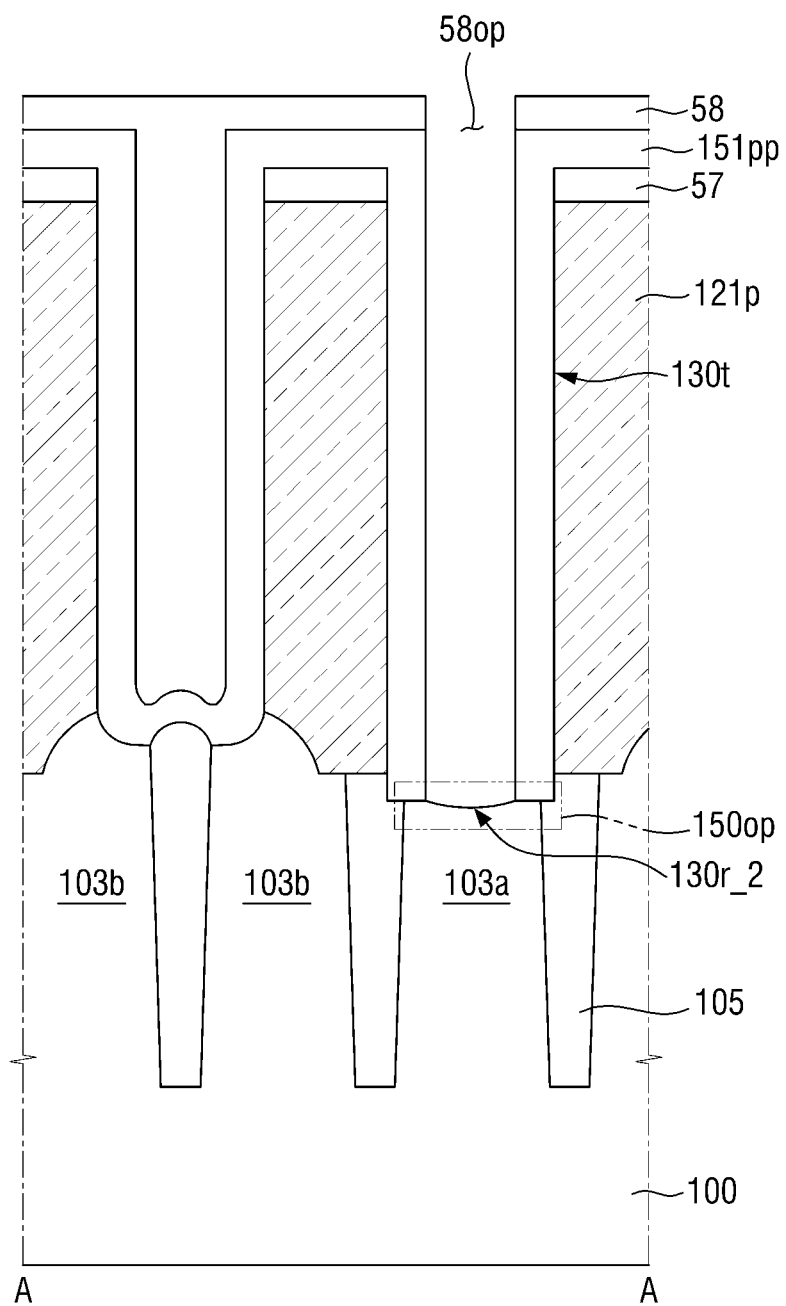
Figure 27B:
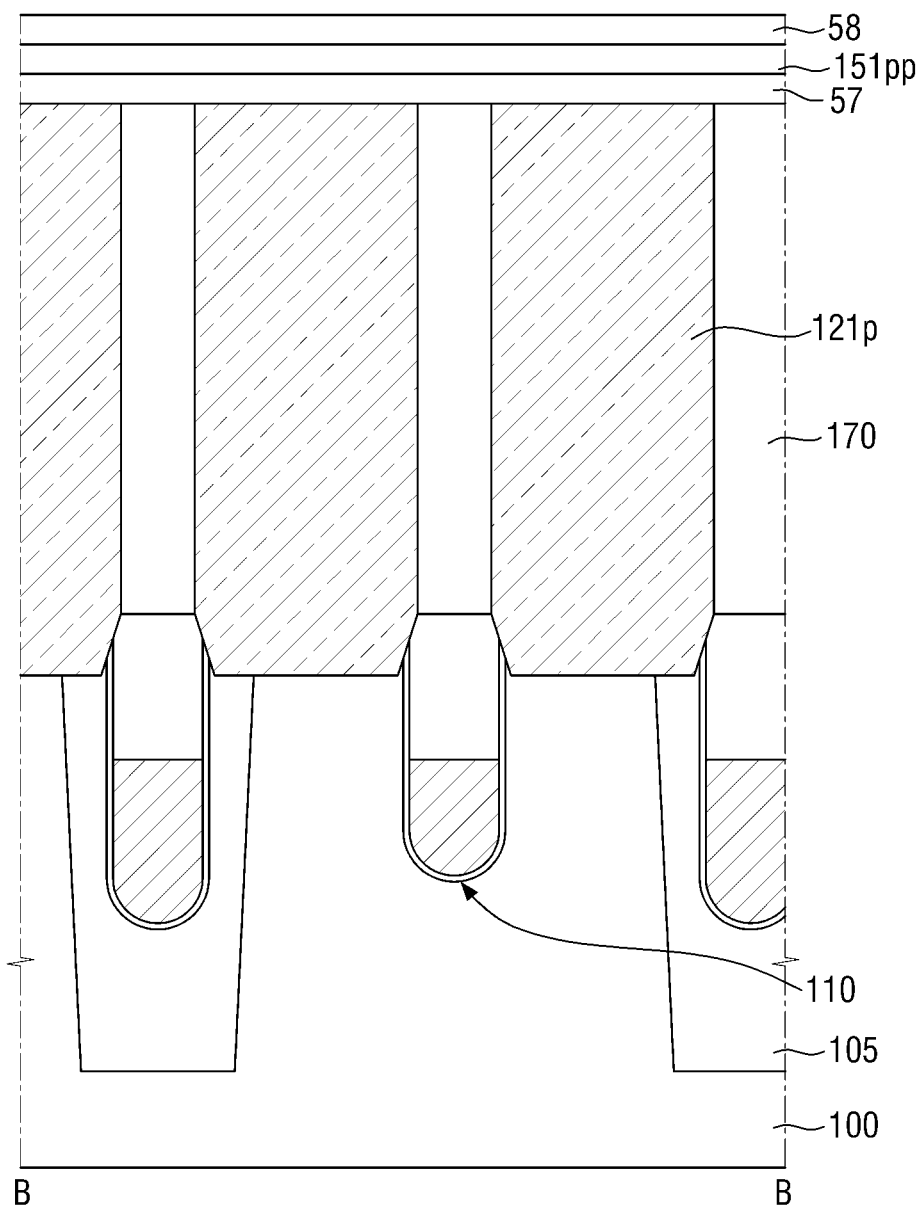
Figure 27C:
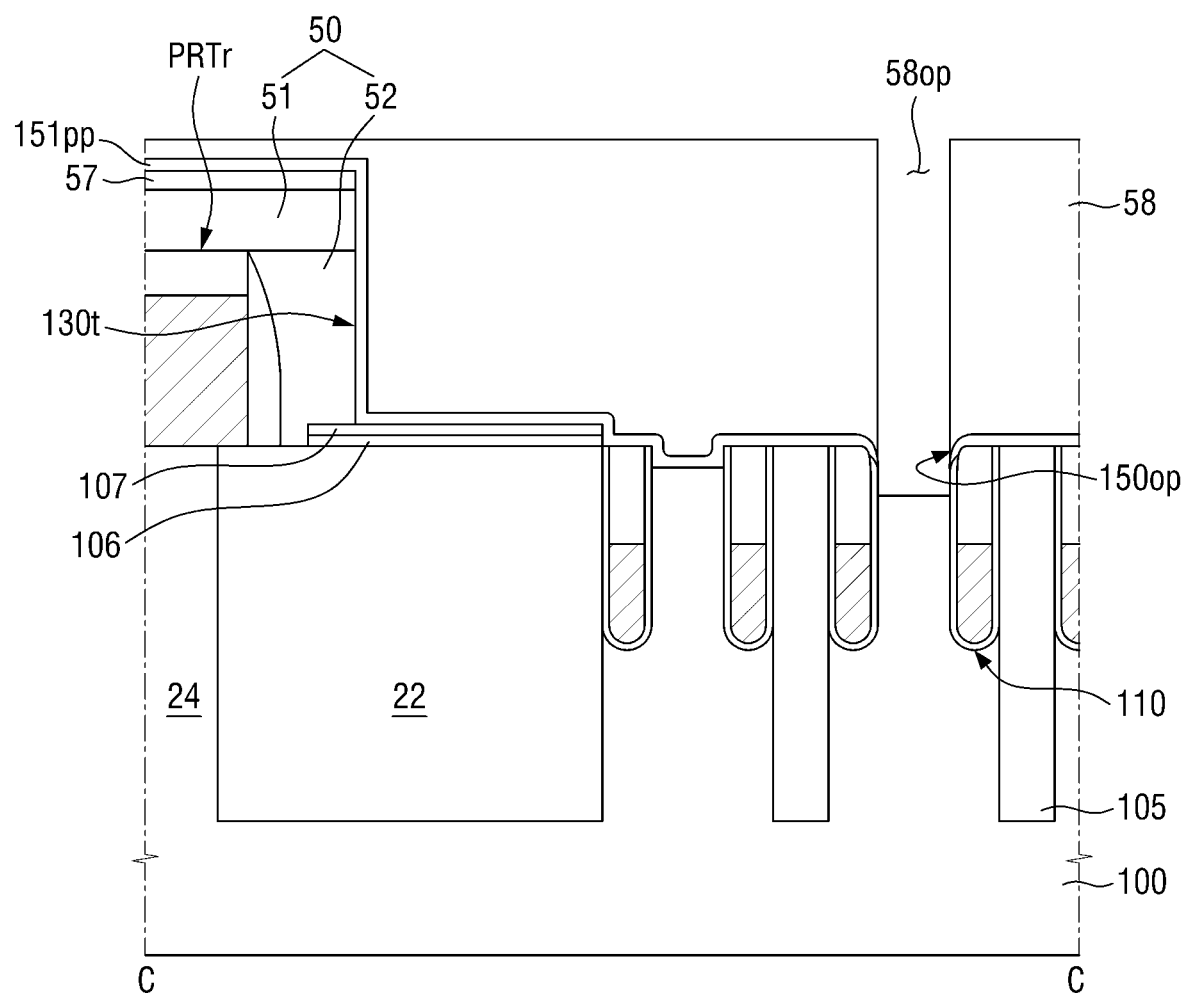
Figure 27D:
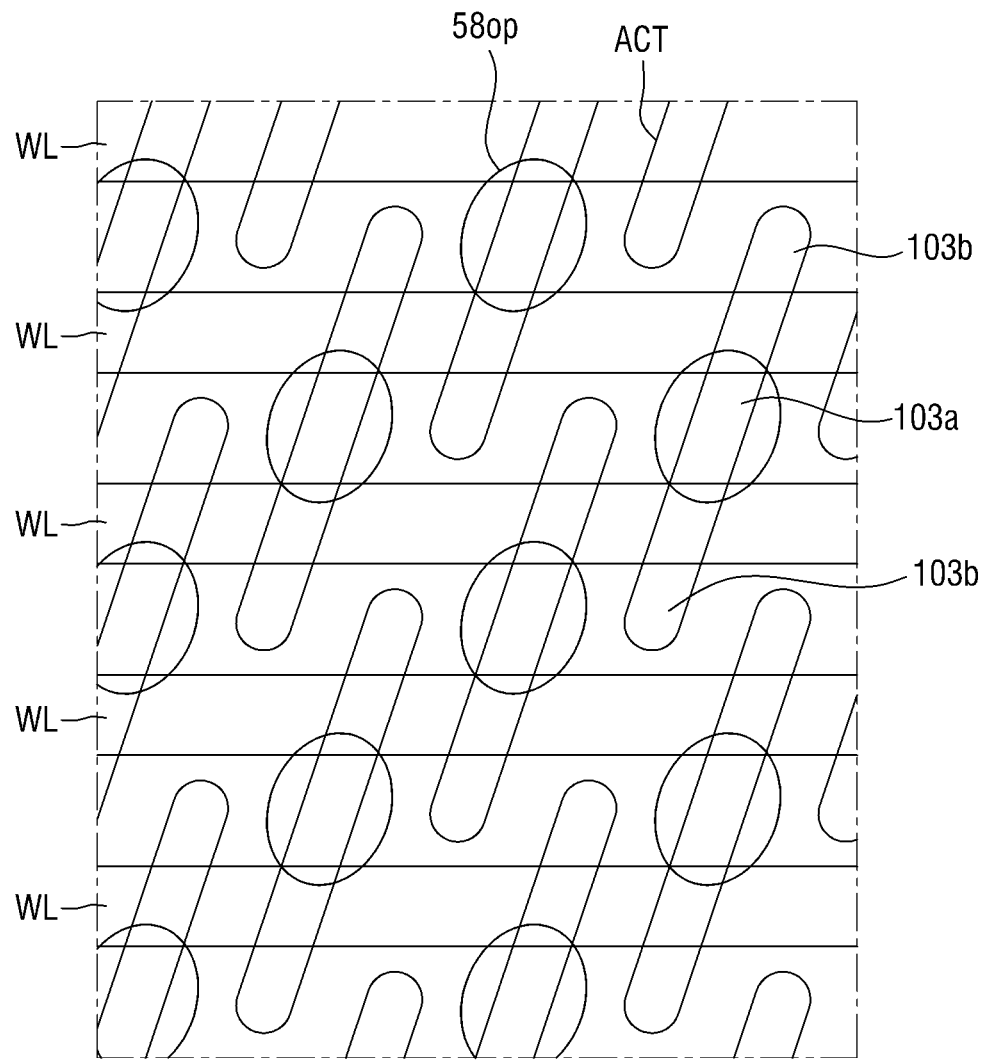

In FIG. 27D, the fourth mask pattern 58 may include mask openings 58op formed at positions corresponding to the bit line connection regions 103a. The fourth mask pattern 58 may be, but is not limited to, a carbon mask pattern.

The pre-spacer layer 151p may be removed using the fourth mask pattern 58 to form a pre-lower spacer 151pp. The pre-spacer layer 151p located at positions corresponding to the mask openings 58op may be removed. The pre-lower spacer 151pp may include bit line contact openings 150op exposing the bit line connection regions 103a of the active regions ACT. The bit line contact openings 150op may be formed at positions overlapping the second bit line contact recesses 130r_2.

Figure 28A:
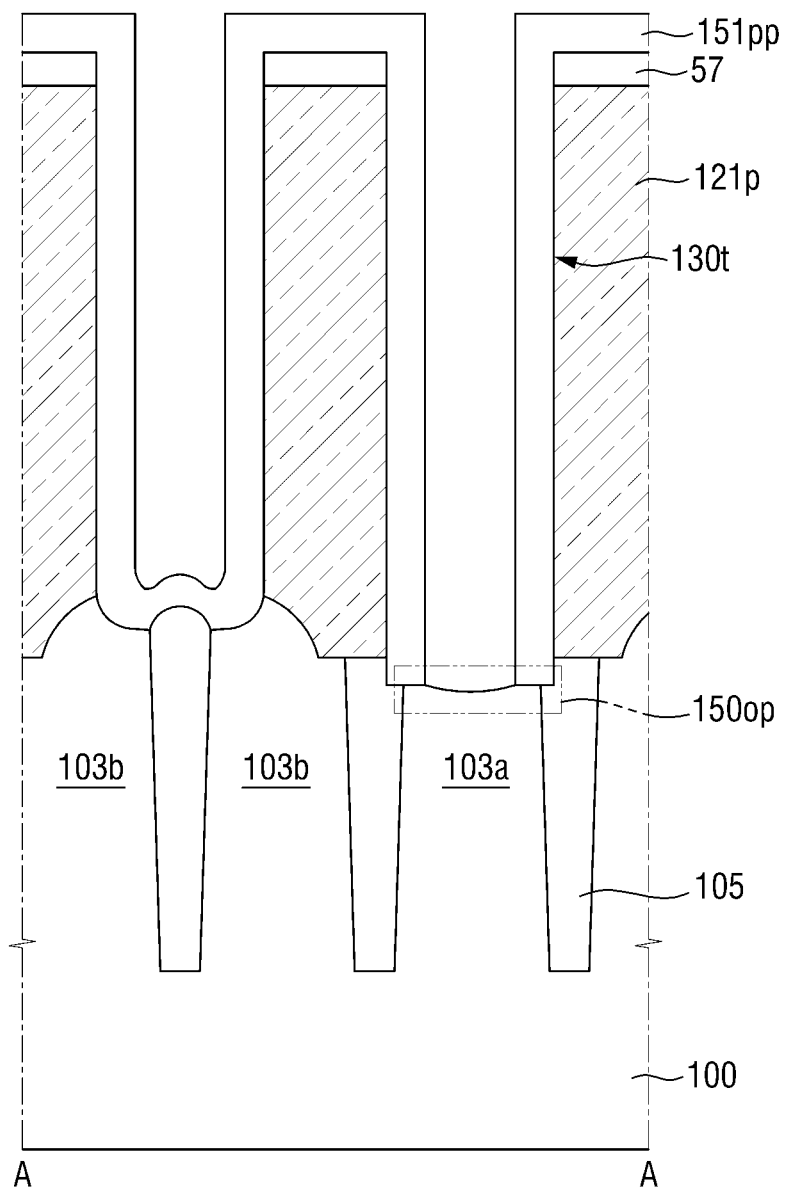
Figure 28B:
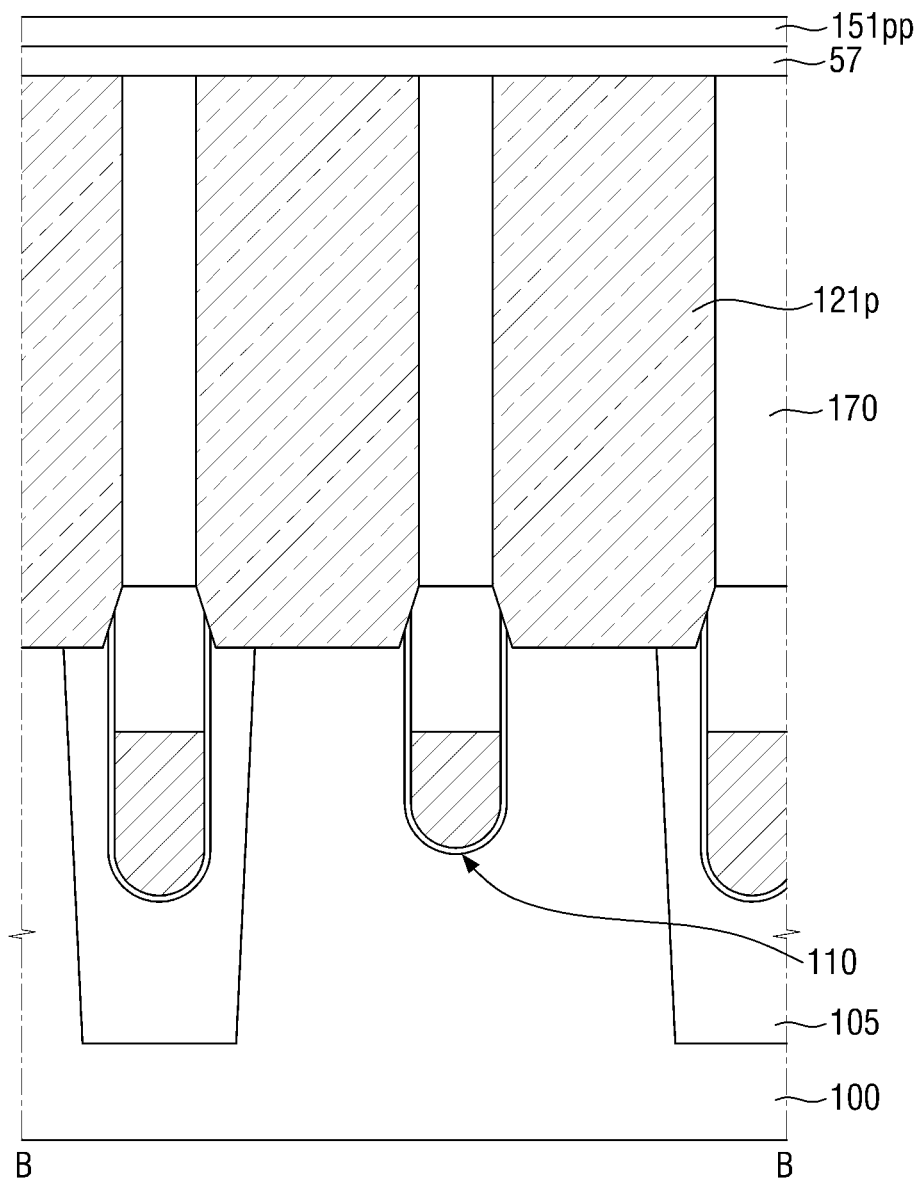
Figure 28C:
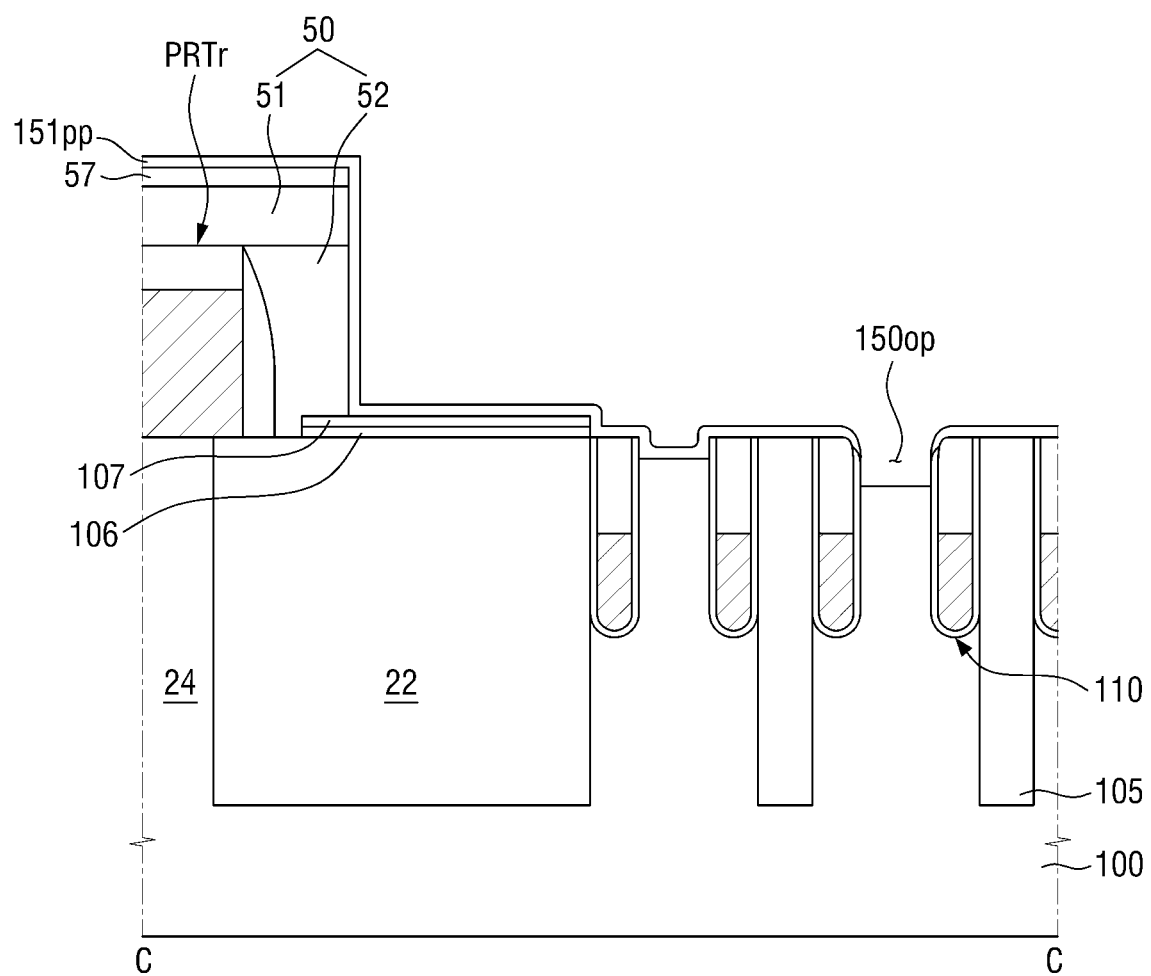

Referring to FIGS. 28A through 28C, the fourth mask pattern 58 is removed.

Figure 29A:
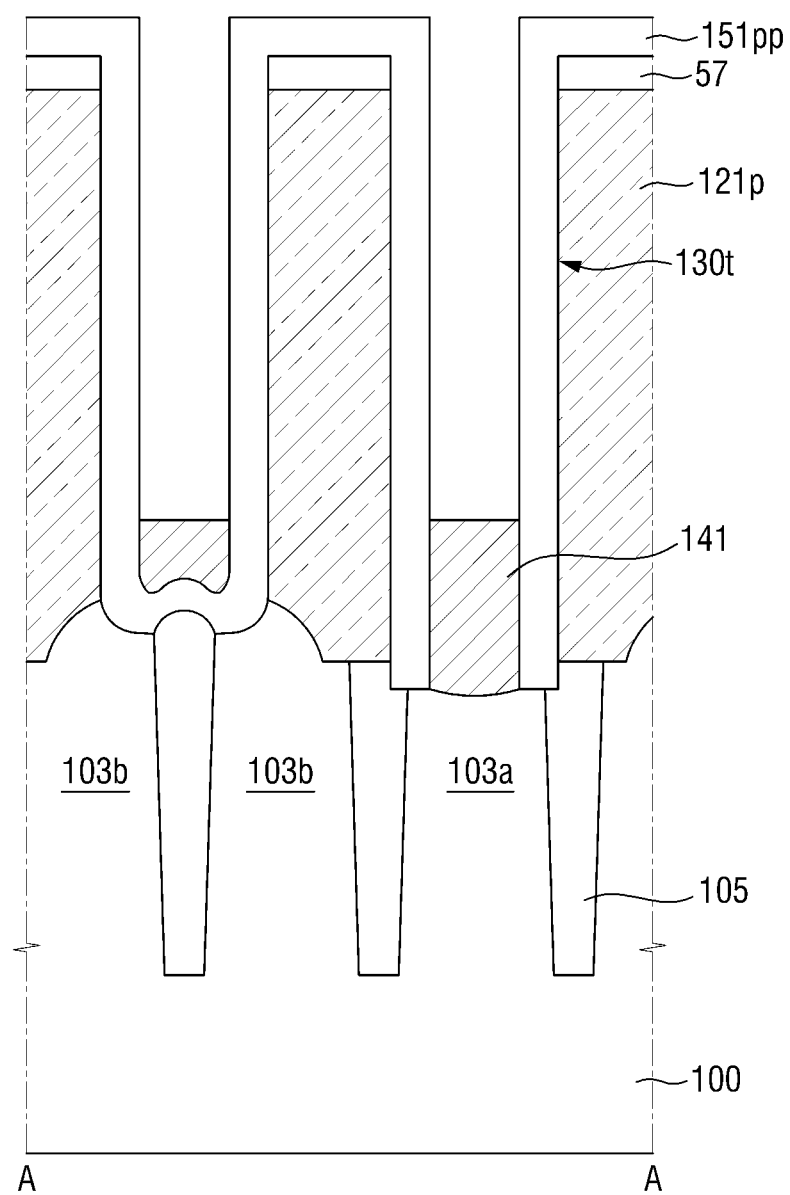
Figure 29B:
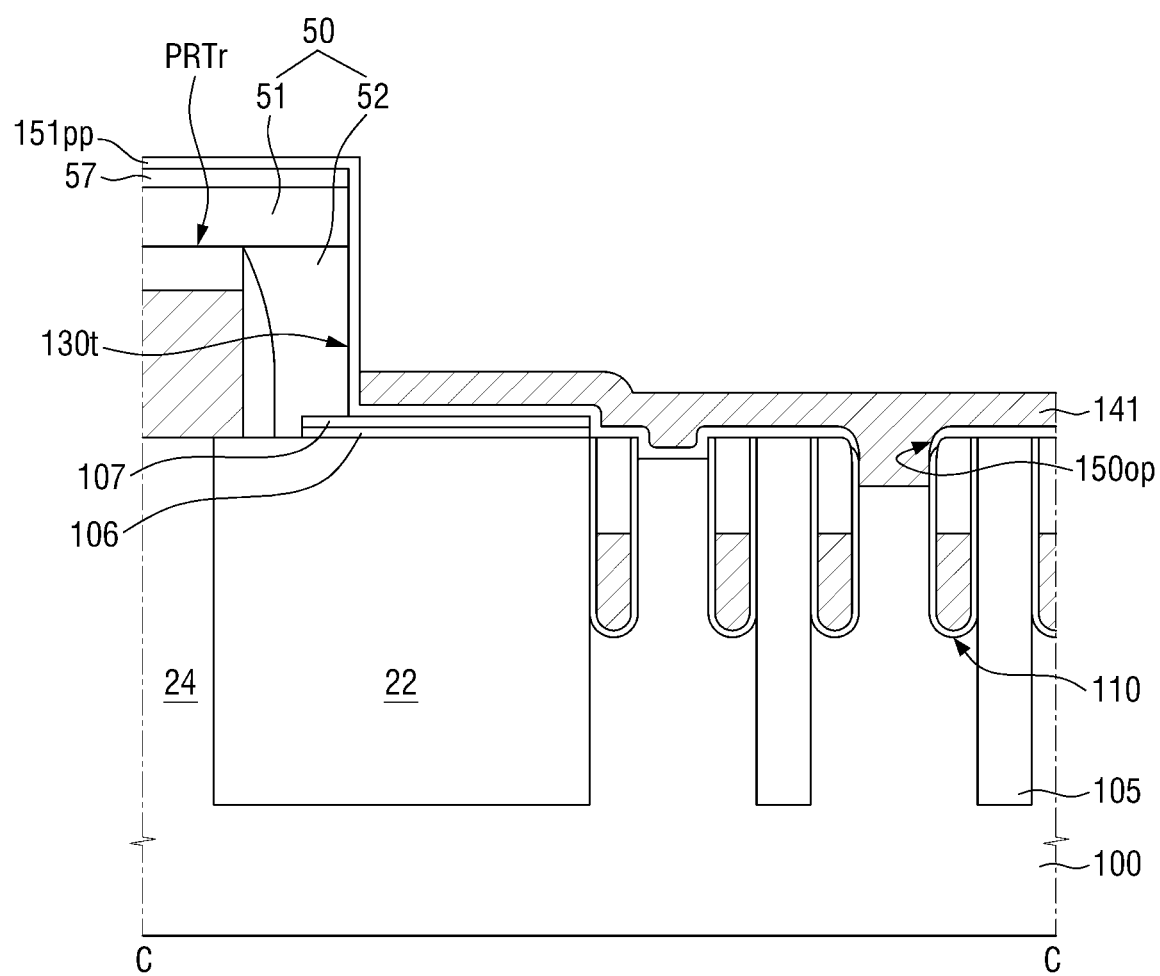

Referring to FIGS. 29A and 29B, a first conductive layer 141 may be formed between parts of the pre-lower spacer 151pp. The first conductive layer 141 may fill a part of each line structure trench 130t. The first conductive layer 141 may be connected to each active region ACT, for example, each bit line connection region 103a through a bit line contact opening 150op.

Figure 30A:
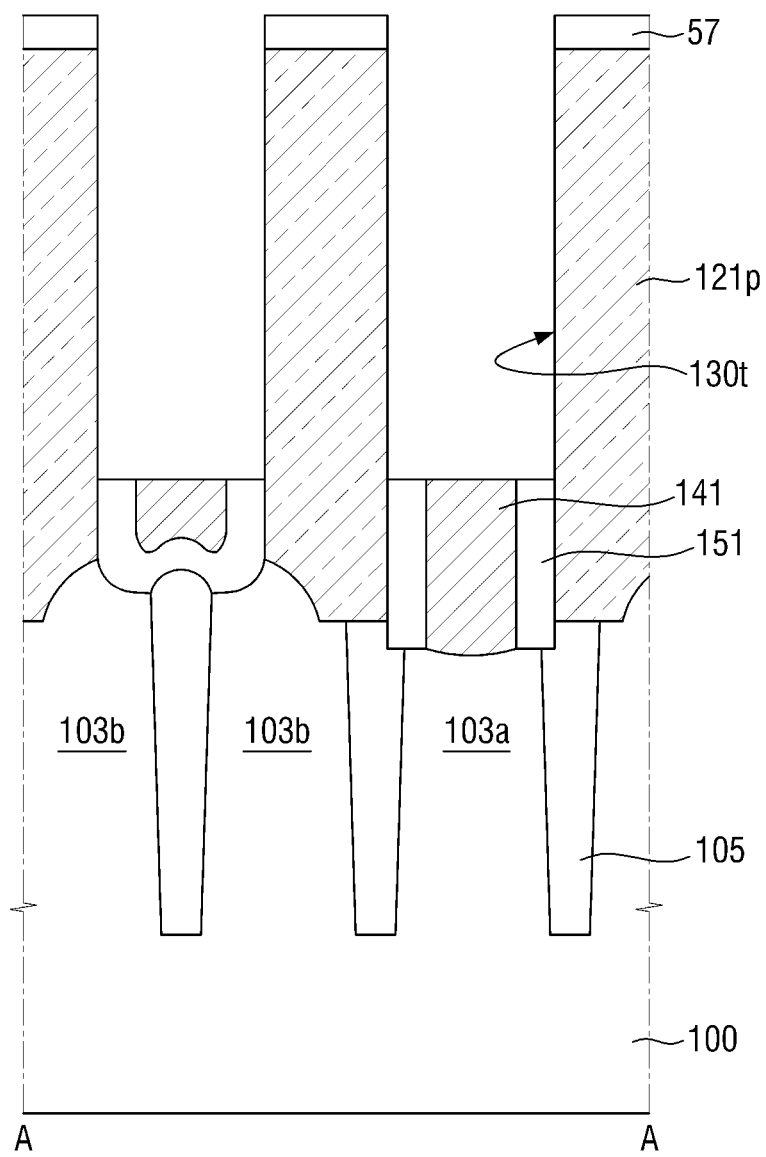
Figure 30B:
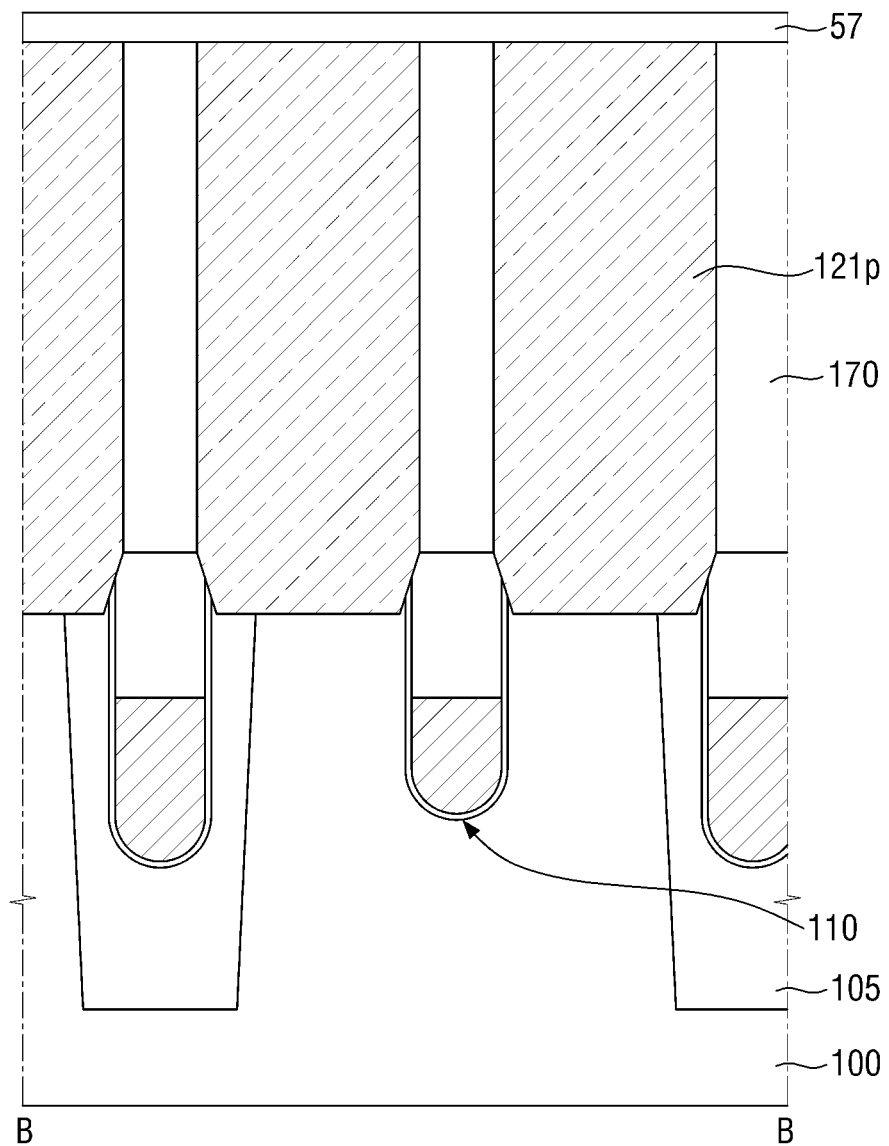
Figure 30C:
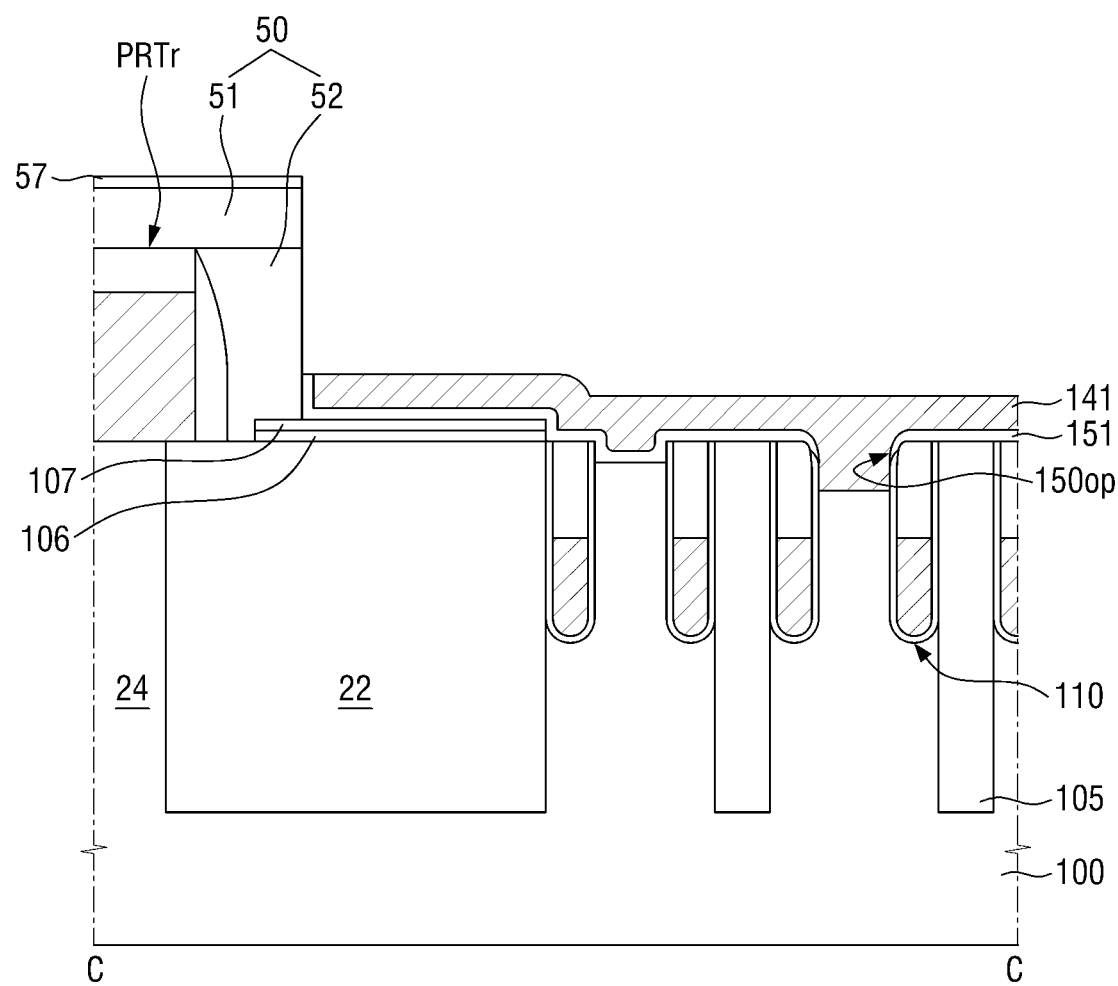

Referring to FIGS. 30A through 30C, a part of the pre-lower spacer 151pp may be removed to form a lower line spacer 151. A part of the pre-lower spacer 151pp formed on opposite sidewalls of each line structure trench 130t and the pre-lower spacer 151pp disposed on the upper surfaces of the third mask patterns 57 may be removed.

Figure 31A:
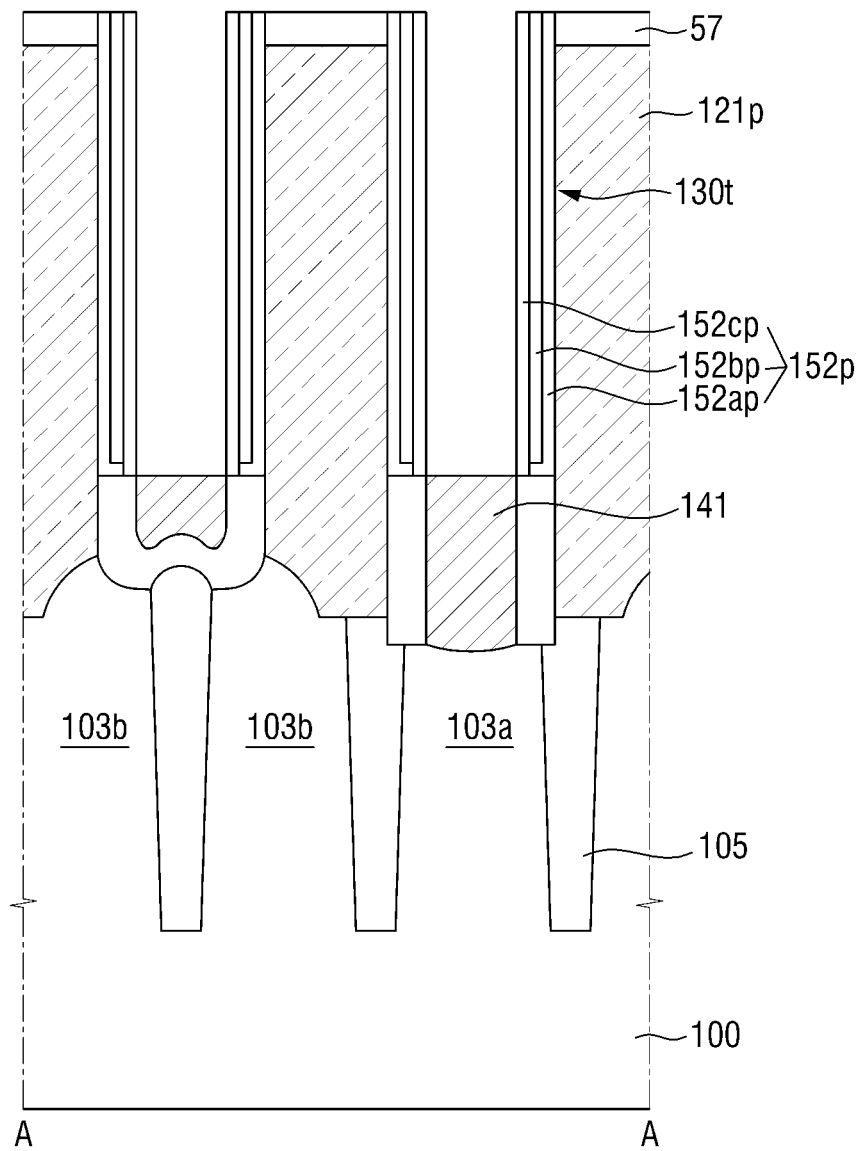
Figure 31B:
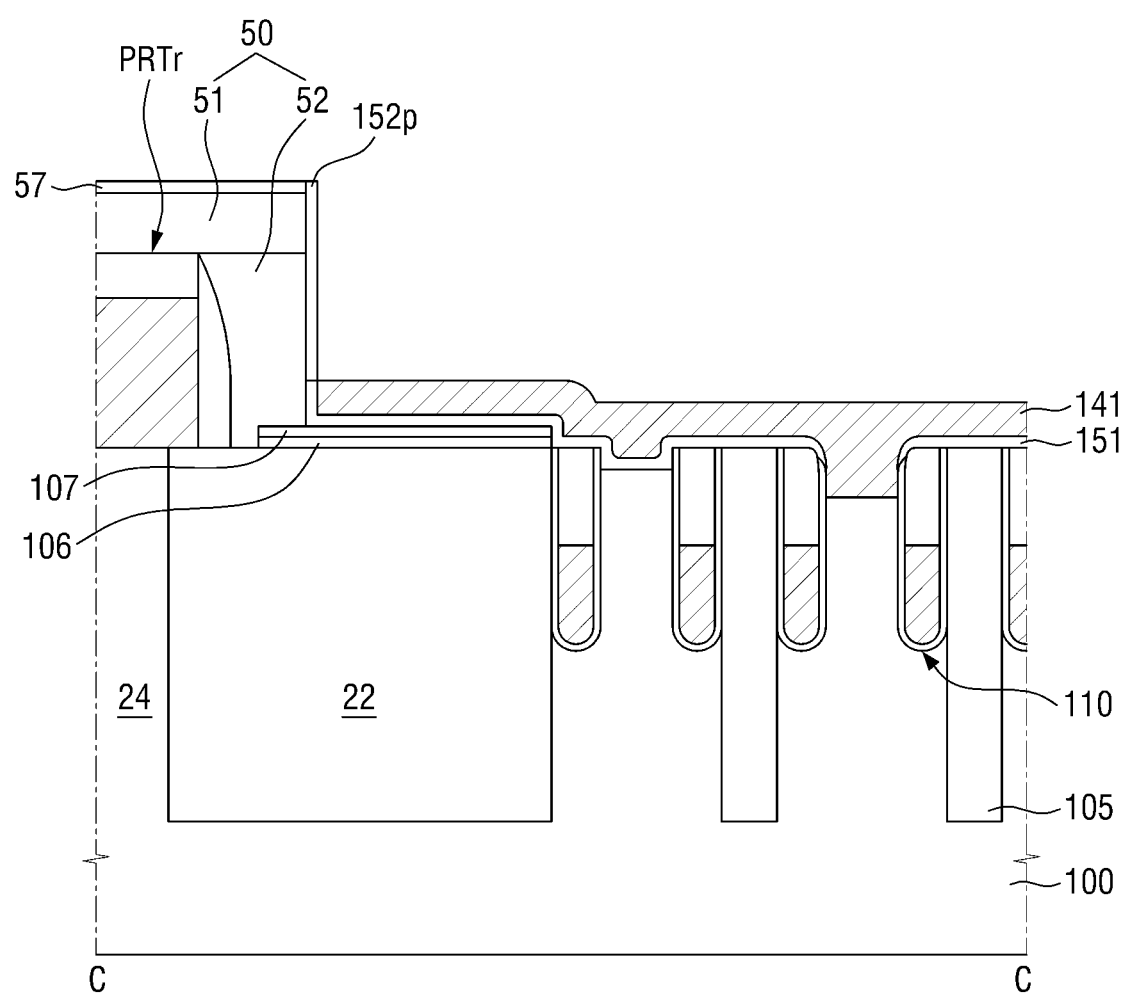

Referring to FIGS. 31A and 31B, a pre-upper spacer 152p may be formed on the lower line spacer 151 to extend along a part of each sidewall of each line structure trench 130t. The pre-upper spacer 152p may include first through third pre-upper spacers 152ap through 152cp. After the first and second pre-upper spacers 152ap and 152bp are formed to expose an upper surface of the first conductive layer 141, the third pre-upper spacer 152cp may be formed along sidewalls of the first and second pre-upper spacers 152ap and 152bp.

Figure 32A:
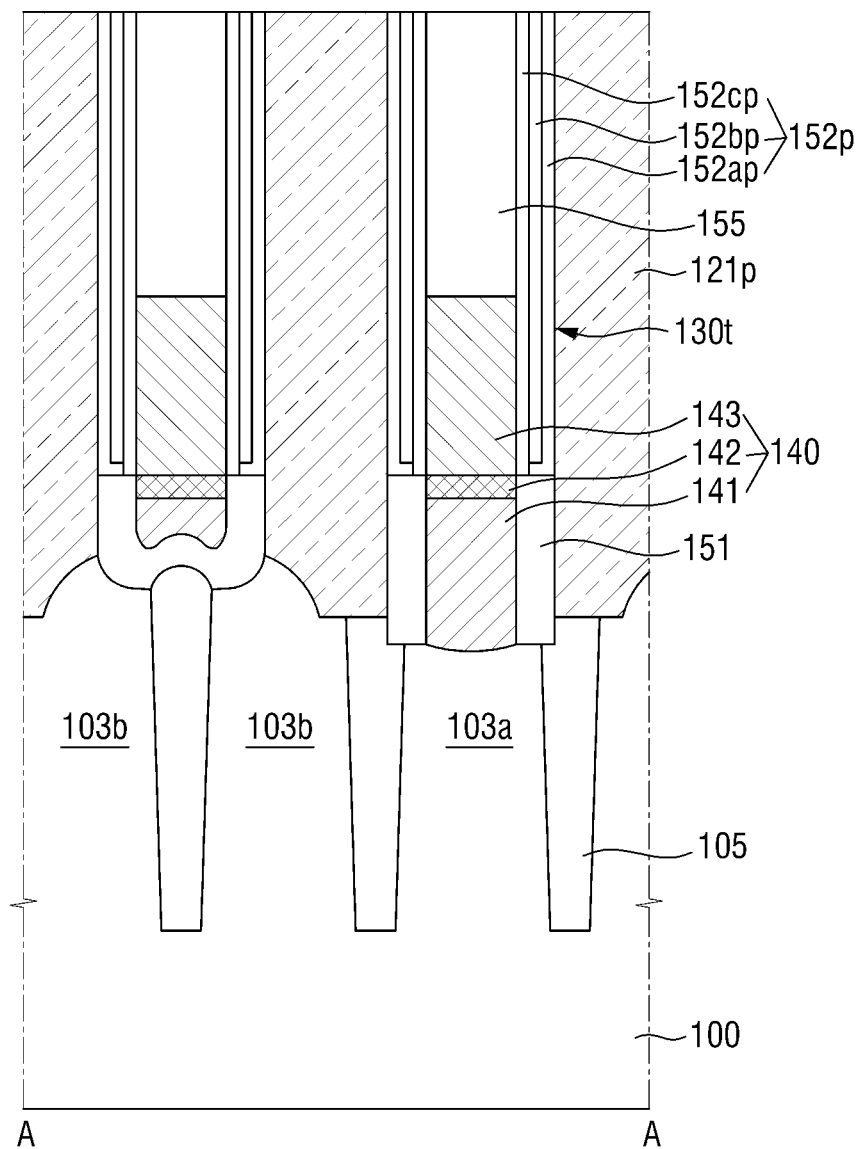
Figure 32B:
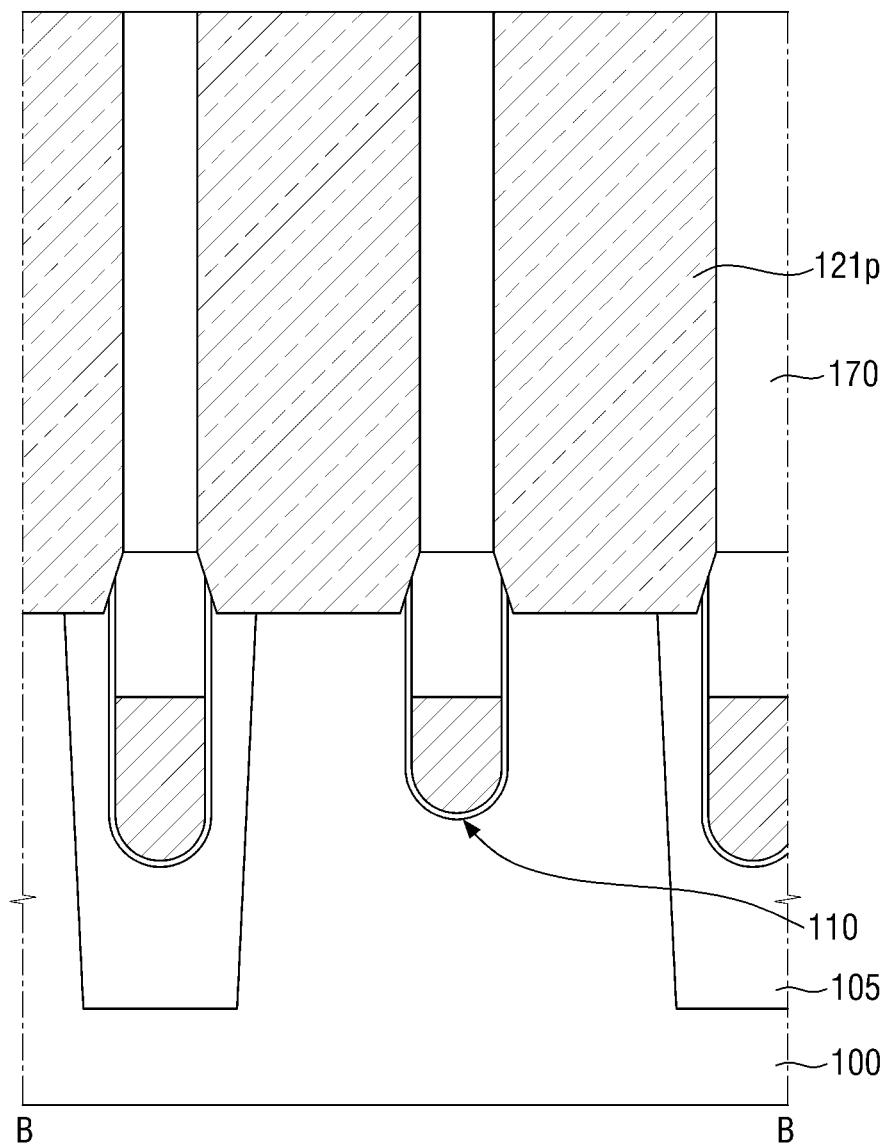
Figure 32C:
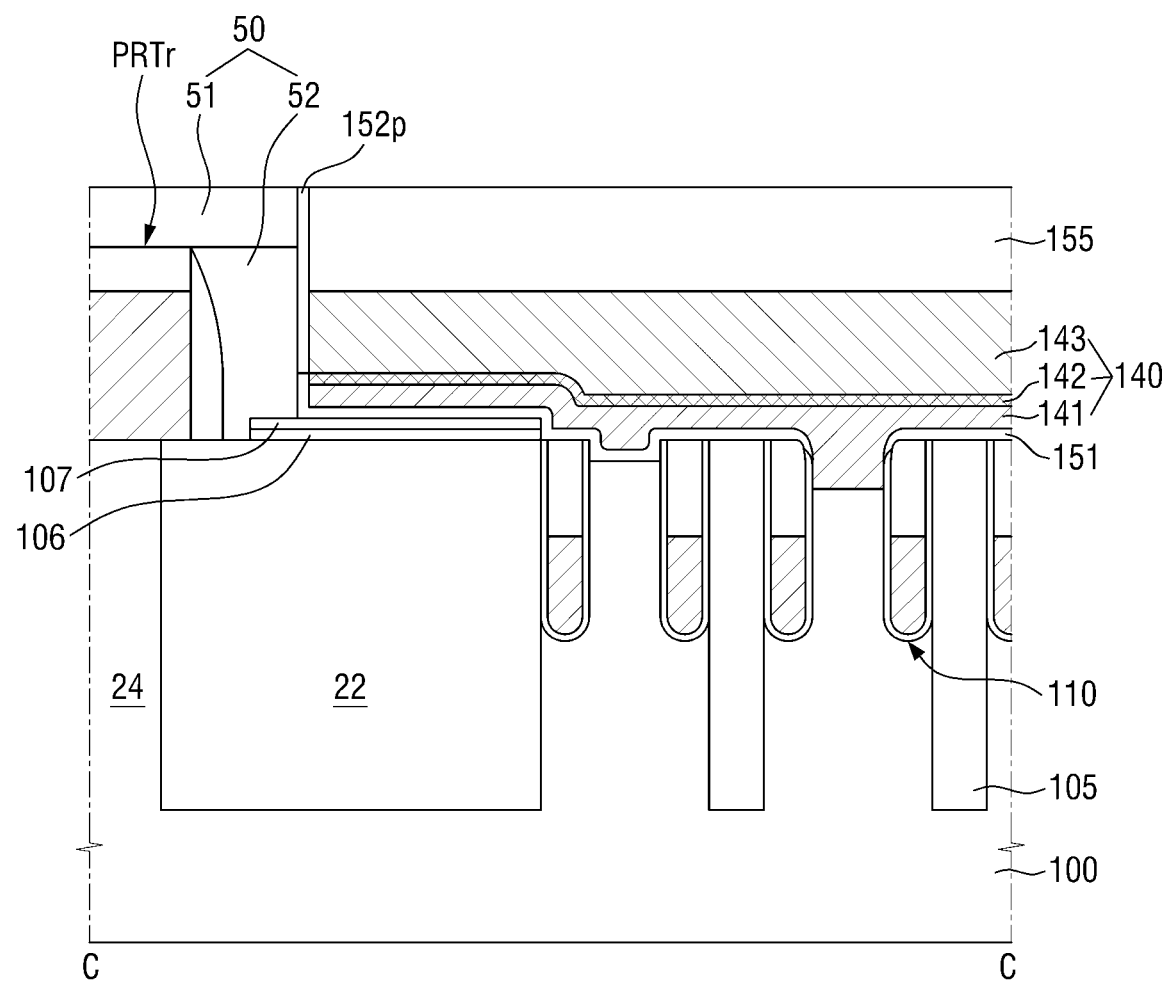

Referring to FIGS. 32A through 32C, a second conductive layer 142 and a third conductive layer 143 may be formed on the first conductive layer 141. A bit line stack 140 may include the first through third conductive layers 141 through 143. The bit line stack 140 may fill a part of each line structure trench 130t. A bit line mask pattern 155 may be formed on the bit line stack 140 to fill the other part of each line structure trench 130t. The third mask patterns 57 may be removed.

Unlike in the drawings, a part of the pre-upper spacer 152p may also be removed as the third mask patterns 57 are removed. In this case, the bit line mask patterns 155 may protrude above an upper surface of the pre-upper spacer 152p and upper surfaces of the buried contact patterns 121p.

Figure 33A:
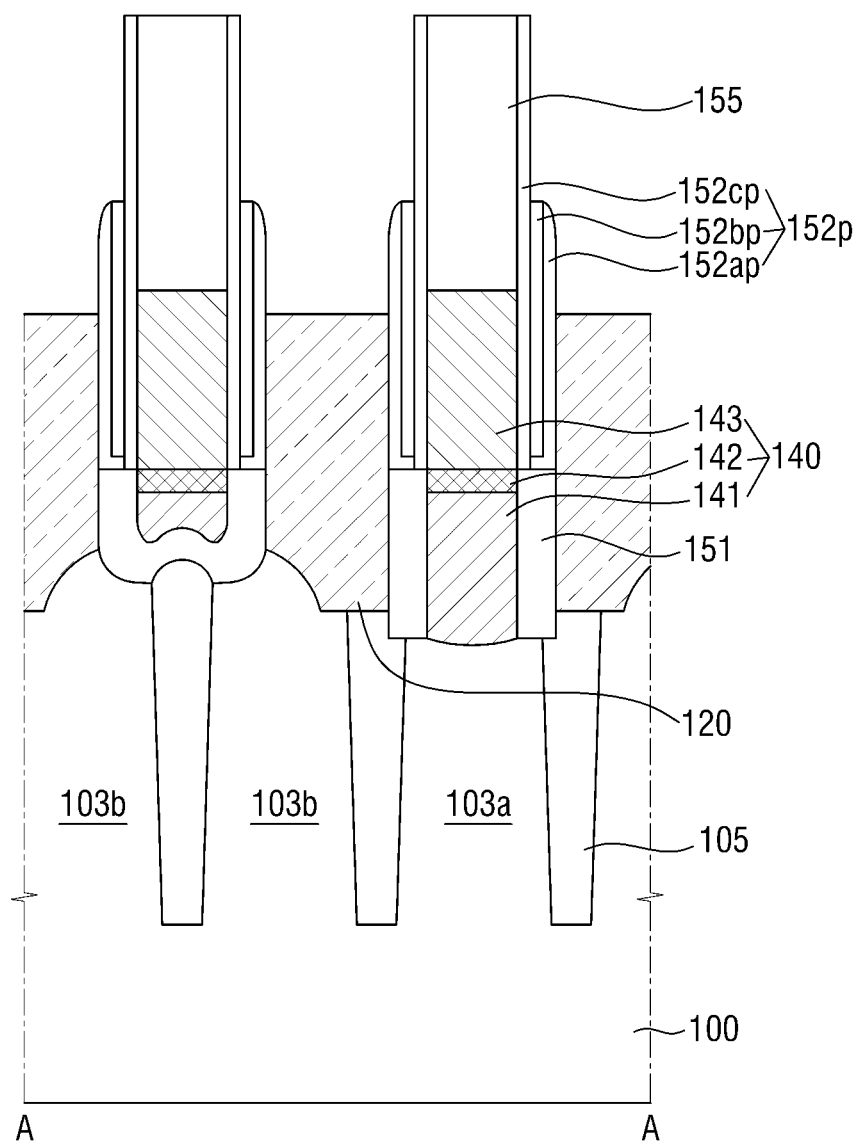
Figure 33B:
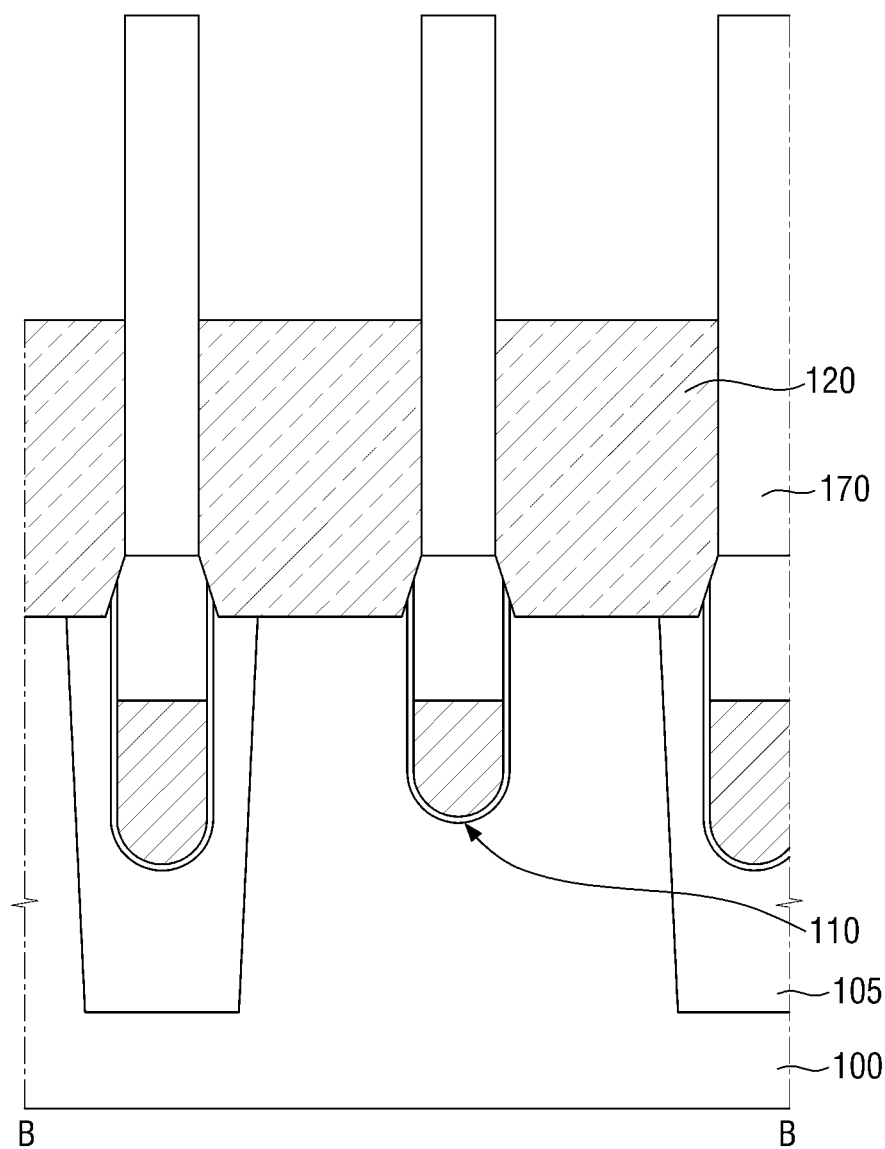

Referring to FIGS. 33A and 33B, the buried contact patterns 121p may be partially removed to form storage contacts 120. The buried contact patterns 121p may be partially removed to partially expose sidewalls of the pre-upper spacer 152p.

The first and second pre-upper spacers 152ap and 152bp having the exposed sidewalls may be partially removed. Then, the buried contact patterns 121p may be partially removed again to form the storage contacts 120.

Figure 34A:
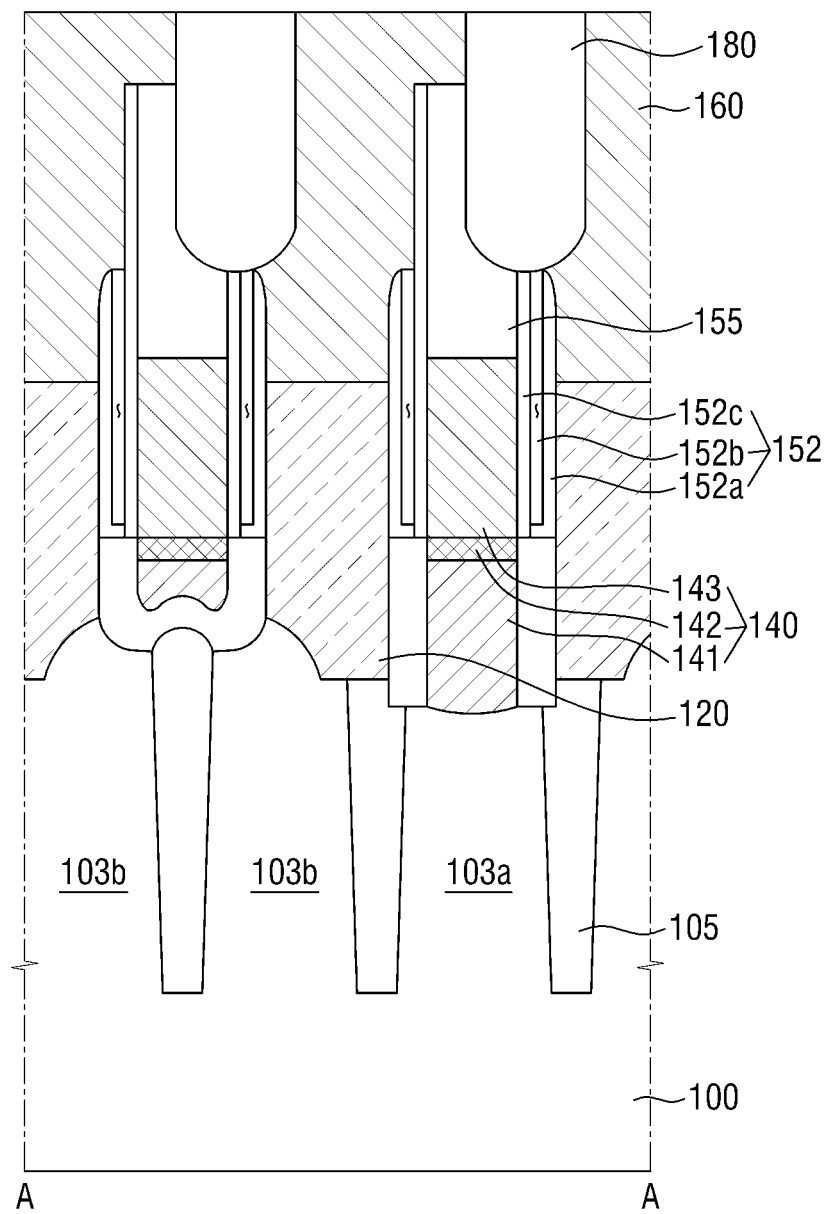
Figure 34B:
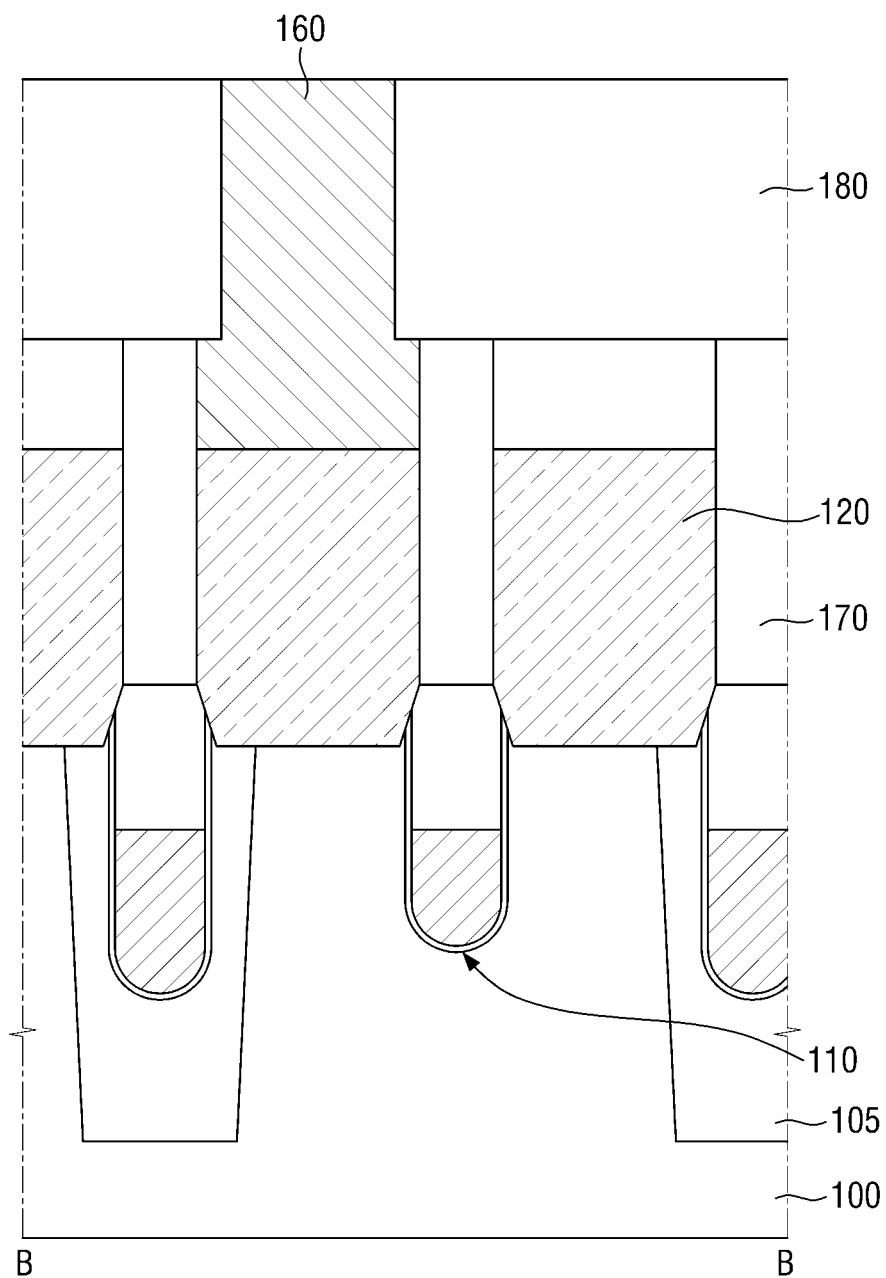
Figure 34C:
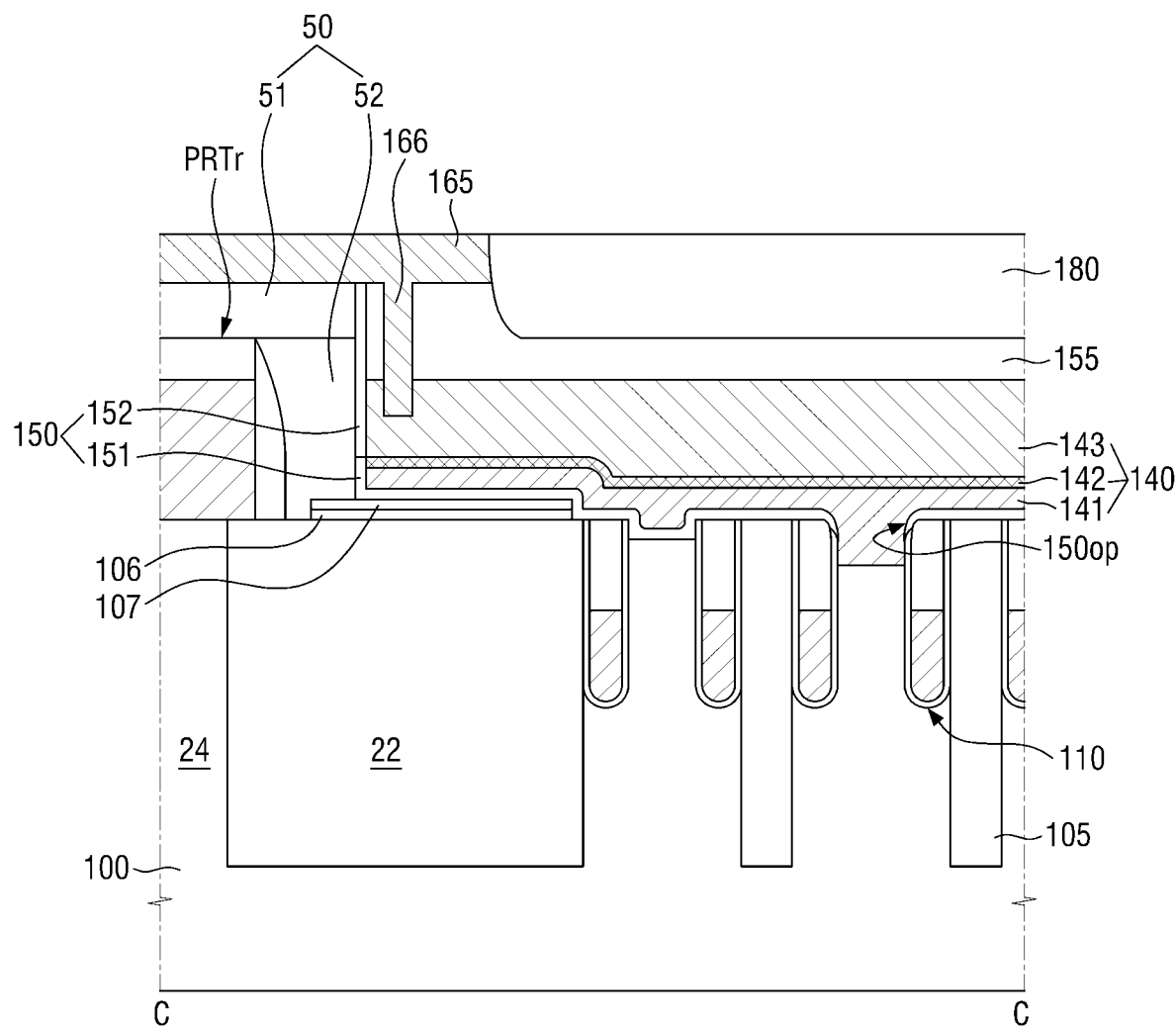

Referring to FIGS. 34A through 34C, a pad conductive layer may be formed to cover the storage contacts 120 and the bit line mask patterns 155, and then a pad separation layer 180 may be formed to divide the pad conductive layer into storage pads 160. To form the pad separation layer 180, the pad conductive layer and each bit line mask pattern 155 are partially removed to expose the second pre-upper spacer 152bp, and then the exposed second pre-upper spacer 152bp is removed to form an air gap. After the formation of the air gap, the pad separation layer 180 may be formed to form the second sub-upper spacer 152b which is an air spacer. Accordingly, an upper line spacer 152 may be formed.

Unlike in FIGS. 22A through 23B, if sidewalls of the storage connection regions 103b are not exposed by the first bit line contact recesses 130r_1, the device isolation layer 105 may be additionally removed by a wet etching process. In this case, the resultant structure may be shaped as illustrated in FIG. 9.

In FIGS. 22A through 22D, only the cell buffer insulating layer 107 may be removed using the second mask patterns 56. After the second mask patterns 56 are removed, a part of the device isolation layer 105 may be removed. In an example embodiment, the buried contact layer 121 may be formed in this state to form the resultant structure that may be shaped as illustrated in FIG. 10.

After all of the cell buffer insulating layer 107 on the cell region 20 is removed, a part of the device isolation layer 105 in the cell region 20 may be removed. In an example embodiment, the buried contact layer 121 may be formed in this state to form the resultant structure that may be shaped as illustrated in FIG. 16.

In concluding the detailed description, those skilled in the art will appreciate that many variations and modifications may be made to various embodiments without substantially departing from the principles of the present inventive concept. Therefore, the disclosed embodiments of the invention are used in a generic and descriptive sense only and not for purposes of limitation.

What is claimed is:

1. A semiconductor device comprising:
    a device isolation layer which is formed in a substrate and defines a first active region and a second active region spaced apart from each other in a first direction;
    a buried contact which is connected to the second active region;
    a first bit line structure which is disposed on the first active region and extends in a second direction different from the first direction; and
    a second bit line structure which is spaced apart from the first bit line structure in the first direction and is disposed on the second active region,
    wherein:
    each of the first and second bit line structures comprises a bit line stack extending in the second direction,
    each of the first and second bit line structures comprises a bit line contact part and a bit line pass part which are alternately arranged in the second direction,
    the bit line contact part of the first bit line structure is disposed on the first active region and electrically connected to the first active region,
    the bit line pass part of the second bit line structure is disposed on the device isolation layer,
    a lower end of the bit line pass part of the second bit line structure is buried in the second active region,
    the bit line pass part of the second bit line structure comprises a boundary surface which meets the second active region and the device isolation layer in a cross-sectional view taken in the first direction, and
    the boundary surface which meets the device isolation layer is concave.

2. The semiconductor device of claim 1,
    wherein each of the first and second bit line structures further comprises a bit line spacer and a bit line mask pattern,
    wherein the bit line mask pattern is disposed on the bit line stack, and
    wherein the bit line stack fills a part of a bit line trench defined by the bit line spacer.

3. The semiconductor device of claim 2,
wherein in the bit line pass part of the second bit line structure, the bit line spacer extends along opposite sidewalls of the bit line stack and a bottom surface of the bit line stack, and
wherein in the bit line pass part of the second bit line structure, the bit line spacer is interposed between the second active region and the bit line stack.

4. The semiconductor device of claim 2,
wherein in the bit line contact part of the first bit line structure, the bit line spacer exposes the first active region.

5. The semiconductor device of claim 2,
wherein the bit line spacer comprises a lower line spacer and an upper line spacer, and
wherein the upper line spacer is disposed on the lower line spacer, and the upper line spacer comprises an air spacer.

6. The semiconductor device of claim 1,
wherein in the bit line contact part of the first bit line structure, the bit line stack comprises a semiconductor material pattern, a silicide pattern disposed on the semiconductor material pattern, and a metallic conductive layer pattern disposed on the silicide pattern.

7. The semiconductor device of claim 6,
wherein in the bit line pass part of the second bit line structure, the bit line stack does not comprise a semiconductor material pattern.

8. The semiconductor device of claim 1,
wherein the second active region comprises an upper part which meets the buried contact and a lower part which does not meet the buried contact, and a part of the upper part of the second active region is recessed.

9. The semiconductor device of claim 1, further comprising:
a buffer pattern which protrudes in the first direction from each of opposite sidewalls of the bit line pass part of the second bit line structure,
wherein a width of the buffer pattern in the first direction is smaller than a width of the buried contact in the first direction.

10. The semiconductor device of claim 1,
wherein the buried contact comprises a boundary surface which meets the second active region in a cross-sectional view taken in the first direction,
the boundary surface extends in the first direction from a first height to a second height, different from the first height, from a bottom surface of the device isolation layer, and
a height of the lowest part of the bit line pass part of the second bit line structure is located between the first height and the second height.

11. The semiconductor device of claim 10,
wherein the boundary surface is round.

12. The semiconductor device of claim 10,
wherein the boundary surface includes a step.

13. The semiconductor device of claim 1, further comprising:
a landing pad which is connected to the buried contact; and
a memory capacitor which is disposed on the landing pad.

14. A semiconductor device comprising:
a device isolation layer which is formed in a substrate and defines a first active region and a second active region spaced apart from each other in a first direction,
wherein each of the first and second active regions includes a pair of storage connection regions and a bit line connection region disposed therebetween;
a pair of word lines which extend in the first direction and are disposed in the substrate and the device isolation layer,
wherein the pair of word lines are spaced apart from each other in a second direction different from the first direction, and
wherein the bit line connection region of the first active region and one of the pair of storage connection regions of the second active region are disposed between the pair of word lines and spaced apart from each other in the first direction;
a buried contact which is connected to the one of the pair of storage connection regions;
a first bit line structure which extends in the second direction and is disposed on the bit line connection region of the first active region;
a second bit line structure which extends in the second direction and is disposed on the bit line connection region of the second active region;
a landing pad which is disposed on the buried contact and connected thereto; and
a memory capacitor which is disposed on the landing pad and connected thereto,
wherein:
each of the first and second bit line structures comprises a bit line contact part and a bit line pass part,
the bit line contact part of each of the first and second bit line structures is electrically connected to the bit line connection region of each of the first and second active regions respectively,
a height of a lowest part of the buried contact from a bottom surface of the device isolation layer is smaller than a height of a lowest part of the bit line pass part of the second bit line structure from the bottom surface of the device isolation layer,
the height of the lowest part of the buried contact from the bottom surface of the device isolation layer is greater than a height of a lowest part of the bit line contact part of the first bit line structure from the bottom surface of the device isolation layer,
a lower end of the bit line pass part of the second bit line structure is buried in the one of the pair of storage connection regions of the second active region, and
the one of the pair of storage connection regions of the second active region comprises an upper part which meets the buried contact and a lower part which does not meet the buried contact, and a part of the upper part of the one of the pair of storage connection regions is recessed.

15. The semiconductor device of claim 14,
wherein each of the first and second bit line structures comprises a bit line spacer, a bit line stack which fills a part of a bit line trench defined by the bit line spacer, and a bit line mask pattern which is disposed on the bit line stack.

16. The semiconductor device of claim 15,
wherein the bit line spacer comprises a lower line spacer and an upper line spacer, and the upper line spacer is disposed on the lower line spacer and comprises an air spacer.

17. The semiconductor device of claim 15,
wherein in the bit line contact part of each of the first and second bit line structures, the bit line stack comprises a semiconductor material pattern, a silicide pattern disposed on the semiconductor material pattern, and a metallic conductive layer pattern disposed on the silicide pattern.

18. The semiconductor device of claim 15, wherein the bit line spacer comprises a lower line spacer and an upper line spacer, the upper line spacer is disposed on the lower line spacer, and the upper line spacer includes a sub spacer extends between the bit line stack and the bit line mask pattern.

19. The semiconductor device of claim 15, wherein at least of the bit line mask pattern protrudes above an upper surface of the bit line spacer.

20. The semiconductor device of claim 16, wherein a stacked structure of the lower line spacer is different from that of the upper line spacer.

\* \* \* \* \*